US010682844B2

(12) United States Patent
Mark

(10) Patent No.: US 10,682,844 B2
(45) Date of Patent: Jun. 16, 2020

(54) EMBEDDING 3D PRINTED FIBER REINFORCEMENT IN MOLDED ARTICLES

(71) Applicant: MARKFORGED, INC., Cambridge, MA (US)

(72) Inventor: Gregory Thomas Mark, Cambridge, MA (US)

(73) Assignee: MARKFORGED, INC., Watertown, MA (US)

( * ) Notice: Subject to any disclaimer, the term of this patent is extended or adjusted under 35 U.S.C. 154(b) by 182 days.

(21) Appl. No.: 15/404,816

(22) Filed: Jan. 12, 2017

(65) Prior Publication Data

US 2017/0120519 A1 May 4, 2017

Related U.S. Application Data

(63) Continuation-in-part of application No. 15/174,645, filed on Jun. 6, 2016, now Pat. No. 9,815,268, which
(Continued)

(51) Int. Cl.
| | |
|---|---|
| *B29C 67/00* | (2017.01) |
| *B29C 31/08* | (2006.01) |

(Continued)

(52) U.S. Cl.
CPC .......... *B33Y 50/02* (2014.12); *B29C 45/1418* (2013.01); *B29C 64/106* (2017.08);
(Continued)

(58) Field of Classification Search
CPC ..... B29C 64/386; B29C 64/106; B29C 64/40; B29C 45/1418; B29C 70/16
See application file for complete search history.

(56) References Cited

U.S. PATENT DOCUMENTS

| | | |
|---|---|---|
| 4,291,841 A | 9/1981 | Dalrymple et al. |
| 4,720,251 A | 1/1988 | Mallay et al. |

(Continued)

FOREIGN PATENT DOCUMENTS

| | | |
|---|---|---|
| CN | 1659320 A | 8/2005 |
| CN | 101133107 A | 2/2008 |

(Continued)

OTHER PUBLICATIONS

"Sandwich-structured Composite", wikipedia.com, Dec. 29, 2009 version, accessed Apr. 18, 2018 at https://en.wikipedia.org/w/index.php?title=Sandwich-structured_composite&oldid=334666649(Year: 2009).

(Continued)

*Primary Examiner* — Xiao S Zhao
*Assistant Examiner* — Emmanuel S Luk
(74) *Attorney, Agent, or Firm* — Lando & Anastasi, LLP

(57) ABSTRACT

A reinforced molding is formed having an internal continuous fiber reinforcement preform embedded therein. Continuous reinforcing fiber is deposited in a reinforcement volume to form a continuous fiber reinforcement preform, and the reinforcement preform is then located within a mold of a molding apparatus. The mold is loaded with flowable and substantially isotropic molding material, e.g., by injection with heated and/or pressurized resin. The molding material is hardened (by curing or cooling or the like) to overmold the continuous fiber reinforcement preform. The resulting reinforced molding surrounds the internal continuous fiber reinforcement preform with a hardened substantially isotropic molding material.

30 Claims, 35 Drawing Sheets

Related U.S. Application Data is a continuation-in-part of application No. 14/944,088, filed on Nov. 17, 2015, now Pat. No. 9,688,028, and a continuation-in-part of application No. 14/944,093, filed on Nov. 17, 2015, and a continuation-in-part of application No. 14/876,073, filed on Oct. 6, 2015, now Pat. No. 10,016,942, said application No. 14/944,088 is a continuation-in-part of application No. 14/491,439, filed on Sep. 19, 2014, now Pat. No. 9,694,544, which is a continuation-in-part of application No. 14/333,881, filed on Jul. 17, 2014, now Pat. No. 9,149,988, and a continuation-in-part of application No. 14/297,437, filed on Jun. 5, 2014, now Pat. No. 9,370,896, and a continuation-in-part of application No. 14/222,318, filed on Mar. 21, 2014, now abandoned.

(60) Provisional application No. 62/277,953, filed on Jan. 12, 2016, provisional application No. 62/172,021, filed on Jun. 5, 2015, provisional application No. 62/080,890, filed on Nov. 17, 2014, provisional application No. 61/907,431, filed on Nov. 22, 2013, provisional application No. 61/902,256, filed on Nov. 10, 2013, provisional application No. 61/883,440, filed on Sep. 27, 2013, provisional application No. 61/881,946, filed on Sep. 24, 2013, provisional application No. 61/880,129, filed on Sep. 19, 2013, provisional application No. 61/878,029, filed on Sep. 15, 2013, provisional application No. 61/847,113, filed on Jul. 17, 2013, provisional application No. 61/831,600, filed on Jun. 5, 2013, provisional application No. 61/815,531, filed on Apr. 24, 2013, provisional application No. 61/804,235, filed on Mar. 22, 2013.

(51) Int. Cl.
| | | |
|---|---|---|
| *B33Y 50/02* | (2015.01) | |
| *B33Y 10/00* | (2015.01) | |
| *B33Y 30/00* | (2015.01) | |
| *B29C 31/04* | (2006.01) | |
| *B33Y 70/00* | (2015.01) | |
| *B29C 45/14* | (2006.01) | |
| *B29C 64/106* | (2017.01) | |
| *G05B 19/4099* | (2006.01) | |
| *B29C 64/386* | (2017.01) | |
| *B29C 70/16* | (2006.01) | |
| *G06F 30/00* | (2020.01) | |
| *B29L 31/30* | (2006.01) | |
| *B29K 105/08* | (2006.01) | |
| *B29L 31/34* | (2006.01) | |
| *B29K 71/00* | (2006.01) | |
| *B29K 25/00* | (2006.01) | |
| *B29K 79/00* | (2006.01) | |
| *B29K 63/00* | (2006.01) | |
| *B29K 77/00* | (2006.01) | |
| *B29K 101/12* | (2006.01) | |
| *B29C 64/40* | (2017.01) | |

(52) U.S. Cl.
CPC ............ *B29C 64/386* (2017.08); *B29C 70/16* (2013.01); *B33Y 10/00* (2014.12); *B33Y 70/00* (2014.12); *G05B 19/4099* (2013.01); *G06F 30/00* (2020.01); *B29C 64/40* (2017.08); *B29K 2025/08* (2013.01); *B29K 2063/00* (2013.01); *B29K 2071/00* (2013.01); *B29K 2077/00* (2013.01); *B29K 2079/085* (2013.01); *B29K 2101/12* (2013.01); *B29K 2105/08* (2013.01); *B29L 2031/3091* (2013.01); *B29L 2031/3425* (2013.01); *G05B 2219/35134* (2013.01); *G05B 2219/49007* (2013.01); *Y02P 90/265* (2015.11)

(56) References Cited

U.S. PATENT DOCUMENTS

| | | | |
|---|---|---|---|
| 5,002,712 | A | 3/1991 | Goldmann et al. |
| 5,037,691 | A | 8/1991 | Medney et al. |
| 5,121,329 | A | 6/1992 | Crump |
| 5,155,324 | A | 10/1992 | Deckard et al. |
| 5,340,433 | A | 8/1994 | Crump |
| 5,447,793 | A | 9/1995 | Montsinger |
| 5,764,521 | A | 6/1998 | Batchelder et al. |
| 5,866,058 | A | 2/1999 | Batchelder et al. |
| 5,885,316 | A | 3/1999 | Sato et al. |
| 5,906,863 | A | 5/1999 | Lombardi et al. |
| 5,936,861 | A * | 8/1999 | Jang ............... B29C 70/384 700/98 |
| 5,955,119 | A | 9/1999 | Andris et al. |
| 6,054,077 | A | 4/2000 | Comb et al. |
| 6,080,343 | A * | 6/2000 | Kaufman ............ B29C 70/388 264/255 |
| 6,085,957 | A | 7/2000 | Zinniel et al. |
| 6,099,783 | A * | 8/2000 | Scranton ............ B29C 35/0888 264/272.11 |
| 6,129,872 | A | 10/2000 | Jang |
| 6,153,034 | A | 11/2000 | Lipsker |
| 6,214,279 | B1 | 4/2001 | Yang et al. |
| 6,363,606 | B1 | 4/2002 | Johnson, Jr. et al. |
| 6,372,178 | B1 | 4/2002 | Tseng |
| 6,421,820 | B1 | 7/2002 | Mansfield et al. |
| 6,547,210 | B1 * | 4/2003 | Marx ............... B22F 3/225 249/175 |
| 6,823,230 | B1 | 11/2004 | Jamalabad et al. |
| 6,859,681 | B1 | 2/2005 | Alexander |
| 6,934,600 | B2 * | 8/2005 | Jang ............... B82Y 30/00 264/109 |
| 6,986,739 | B2 | 1/2006 | Warren et al. |
| 7,020,539 | B1 | 3/2006 | Kovacevic et al. |
| 7,083,697 | B2 * | 8/2006 | Dao ............... B01D 39/163 118/200 |
| 7,127,309 | B2 | 10/2006 | Dunn et al. |
| 7,625,200 | B2 | 12/2009 | Leavitt |
| 3,066,842 | A1 | 11/2011 | Farmer et al. |
| 8,050,786 | B2 | 11/2011 | Holzwarth |
| 8,221,669 | B2 | 7/2012 | Batchelder et al. |
| 8,295,972 | B2 | 10/2012 | Coleman et al. |
| 8,815,141 | B2 | 8/2014 | Swanson et al. |
| 8,827,684 | B1 | 9/2014 | Schumacher et al. |
| 8,916,085 | B2 | 12/2014 | Jackson et al. |
| 8,920,697 | B2 | 12/2014 | Mikulak et al. |
| 9,126,365 | B1 | 9/2015 | Mark et al. |
| 9,126,367 | B1 | 9/2015 | Mark et al. |
| 9,156,205 | B2 | 10/2015 | Mark et al. |
| 9,207,540 | B1 | 12/2015 | Bhargava et al. |
| 9,327,453 | B2 | 5/2016 | Mark et al. |
| 9,370,896 | B2 | 6/2016 | Mark |
| 9,427,399 | B2 | 8/2016 | Adams et al. |
| 9,511,544 | B2 | 12/2016 | Hemingway et al. |
| 9,579,851 | B2 | 2/2017 | Mark et al. |
| 9,694,544 | B2 | 7/2017 | Mark et al. |
| 9,849,631 | B1 | 12/2017 | Goss et al. |
| 10,029,415 | B2 | 7/2018 | Swanson et al. |
| 10,059,057 | B2 * | 8/2018 | Schirtzinger ......... B29C 70/30 |
| 10,061,301 | B2 | 8/2018 | Burton |
| 10,076,876 | B2 | 9/2018 | Mark et al. |
| 10,118,375 | B2 * | 11/2018 | Hickman ............ C08J 5/005 |
| 10,131,088 | B1 * | 11/2018 | Tyler ............... B29C 64/209 |
| 10,160,193 | B2 | 12/2018 | Nielsen-Cole et al. |
| 10,254,499 | B1 | 4/2019 | Cohen et al. |
| 10,293,594 | B2 | 5/2019 | Gardiner |
| 10,414,147 | B2 | 9/2019 | Sweeney et al. |
| 2002/0009935 | A1 | 1/2002 | Hsiao et al. |
| 2002/0062909 | A1 | 5/2002 | Jang et al. |
| 2002/0079607 | A1 | 6/2002 | Hawley et al. |

(56) References Cited

U.S. PATENT DOCUMENTS

| | | |
|---|---|---|
| 2002/0102322 A1 | 8/2002 | Gunther |
| 2002/0113331 A1 | 8/2002 | Zhang et al. |
| 2002/0165304 A1 | 11/2002 | Mulligan et al. |
| 2002/0172817 A1* | 11/2002 | Owens .................. B29B 15/122 428/304.4 |
| 2003/0044593 A1 | 3/2003 | Vaidyanathan et al. |
| 2003/0056870 A1 | 3/2003 | Comb et al. |
| 2003/0090034 A1 | 5/2003 | Mulhaupt et al. |
| 2003/0186042 A1 | 10/2003 | Dunlap et al. |
| 2003/0236588 A1 | 12/2003 | Jang et al. |
| 2004/0067711 A1 | 4/2004 | Bliton et al. |
| 2004/0140078 A1* | 7/2004 | Liu .......................... B22C 9/04 164/34 |
| 2004/0166140 A1 | 8/2004 | Santini et al. |
| 2004/0253365 A1 | 12/2004 | Warren et al. |
| 2005/0061422 A1 | 3/2005 | Martin |
| 2005/0104257 A1 | 5/2005 | Gu et al. |
| 2005/0109451 A1 | 5/2005 | Hauber et al. |
| 2005/0156352 A1* | 7/2005 | Burkle .................. B29C 45/045 264/257 |
| 2005/0230029 A1 | 10/2005 | Vaidyanathan et al. |
| 2005/0279185 A1 | 12/2005 | Cook et al. |
| 2006/0047052 A1 | 3/2006 | Barrera et al. |
| 2007/0003650 A1 | 1/2007 | Schroeder |
| 2007/0151167 A1 | 7/2007 | Cook et al. |
| 2007/0225856 A1 | 9/2007 | Slaughter et al. |
| 2007/0228592 A1 | 10/2007 | Dunn et al. |
| 2007/0252871 A1 | 11/2007 | Silverbrook |
| 2008/0176092 A1 | 7/2008 | Owens |
| 2008/0206394 A1 | 8/2008 | Bouti |
| 2008/0251975 A1 | 10/2008 | Gallagher et al. |
| 2008/0274229 A1 | 11/2008 | Barnett |
| 2009/0022615 A1* | 1/2009 | Entezarian ............ B22F 3/1025 419/38 |
| 2009/0054552 A1 | 2/2009 | Yano et al. |
| 2009/0065965 A1 | 3/2009 | Bowen |
| 2009/0095410 A1 | 4/2009 | Oldani |
| 2009/0174709 A1 | 7/2009 | Kozlak et al. |
| 2009/0199948 A1 | 8/2009 | Kisch |
| 2009/0220632 A1 | 9/2009 | Haque |
| 2009/0234616 A1 | 9/2009 | Perkins |
| 2010/0024987 A1 | 2/2010 | Saine et al. |
| 2010/0028641 A1 | 2/2010 | Zhu et al. |
| 2010/0151072 A1 | 6/2010 | Scheurich |
| 2010/0191360 A1 | 7/2010 | Napadensky et al. |
| 2010/0203351 A1 | 8/2010 | Nayfeh |
| 2010/0243764 A1 | 9/2010 | Okesaku et al. |
| 2011/0001264 A1 | 1/2011 | Minoura et al. |
| 2011/0032301 A1 | 2/2011 | Fienup et al. |
| 2011/0143108 A1 | 6/2011 | Fruth et al. |
| 2011/0178621 A1 | 7/2011 | Heide |
| 2011/0222081 A1 | 9/2011 | Yi et al. |
| 2011/0230111 A1 | 9/2011 | Weir et al. |
| 2011/0289791 A1 | 12/2011 | Menchik et al. |
| 2012/0060468 A1 | 3/2012 | Dushku et al. |
| 2012/0070523 A1 | 3/2012 | Swanson et al. |
| 2012/0092724 A1 | 4/2012 | Pettis |
| 2012/0140041 A1 | 6/2012 | Burgunder et al. |
| 2012/0156445 A1* | 6/2012 | Schmidt ................ B29C 43/222 428/195.1 |
| 2012/0231225 A1 | 9/2012 | Mikulak et al. |
| 2012/0247655 A1 | 10/2012 | Erb et al. |
| 2013/0004610 A1 | 1/2013 | Hartmann et al. |
| 2013/0075952 A1* | 3/2013 | Seman, Sr. .......... B29C 33/0016 264/255 |
| 2013/0164498 A1 | 6/2013 | Langone et al. |
| 2013/0205920 A1 | 8/2013 | Tow |
| 2013/0209600 A1 | 8/2013 | Tow |
| 2013/0221192 A1* | 8/2013 | Rocco ...................... B22C 9/10 249/177 |
| 2013/0233471 A1 | 9/2013 | Kappesser et al. |
| 2013/0241102 A1 | 9/2013 | Rodgers et al. |
| 2013/0320467 A1 | 12/2013 | Buchanan et al. |
| 2013/0327917 A1 | 12/2013 | Steiner et al. |
| 2013/0337256 A1 | 12/2013 | Farmer et al. |
| 2013/0337265 A1 | 12/2013 | Farmer |
| 2014/0034214 A1 | 2/2014 | Boyer et al. |
| 2014/0036035 A1 | 2/2014 | Buser et al. |
| 2014/0039663 A1 | 2/2014 | Boyer et al. |
| 2014/0044822 A1 | 2/2014 | Mulliken |
| 2014/0048969 A1 | 2/2014 | Swanson et al. |
| 2014/0048970 A1 | 2/2014 | Batchelder et al. |
| 2014/0061974 A1 | 3/2014 | Tyler |
| 2014/0065847 A1 | 3/2014 | Salmon et al. |
| 2014/0090528 A1 | 4/2014 | Graf |
| 2014/0120197 A1 | 5/2014 | Swanson et al. |
| 2014/0121813 A1 | 5/2014 | Schmehl |
| 2014/0154347 A1 | 6/2014 | Dilworth et al. |
| 2014/0159284 A1 | 6/2014 | Leavitt |
| 2014/0175706 A1 | 6/2014 | Kritchman |
| 2014/0210137 A1 | 7/2014 | Patterson et al. |
| 2014/0232035 A1 | 8/2014 | Bheda |
| 2014/0265037 A1 | 9/2014 | Stirling et al. |
| 2014/0268604 A1 | 9/2014 | Wicker et al. |
| 2014/0277661 A1 | 9/2014 | Amadio et al. |
| 2014/0287139 A1 | 9/2014 | Farmer et al. |
| 2014/0291886 A1 | 10/2014 | Mark et al. |
| 2014/0322383 A1 | 10/2014 | Rutter |
| 2014/0328963 A1 | 11/2014 | Mark et al. |
| 2014/0328964 A1 | 11/2014 | Mark et al. |
| 2014/0361460 A1 | 12/2014 | Mark |
| 2015/0014885 A1 | 1/2015 | Hofmann et al. |
| 2015/0037446 A1 | 2/2015 | Douglass et al. |
| 2015/0165666 A1 | 6/2015 | Butcher et al. |
| 2015/0165690 A1 | 6/2015 | Tow |
| 2015/0165691 A1 | 6/2015 | Mark et al. |
| 2015/0197063 A1 | 7/2015 | Shinar et al. |
| 2015/0201499 A1 | 7/2015 | Shinar et al. |
| 2015/0239178 A1 | 8/2015 | Armstrong |
| 2015/0242737 A1 | 8/2015 | Glazberg et al. |
| 2015/0266243 A1 | 9/2015 | Mark et al. |
| 2015/0266244 A1 | 9/2015 | Page |
| 2015/0287247 A1 | 10/2015 | Willis et al. |
| 2015/0290875 A1 | 10/2015 | Mark et al. |
| 2015/0298393 A1 | 10/2015 | Suarez |
| 2015/0321427 A1 | 11/2015 | Gunnarsson et al. |
| 2015/0342720 A1 | 12/2015 | Koc et al. |
| 2016/0067927 A1 | 3/2016 | Voris et al. |
| 2016/0068678 A1 | 3/2016 | Luo et al. |
| 2016/0075089 A1 | 3/2016 | Duro Royo et al. |
| 2016/0120040 A1 | 4/2016 | Elmieh et al. |
| 2016/0129634 A1 | 5/2016 | Keicher et al. |
| 2016/0179064 A1 | 6/2016 | Arthur et al. |
| 2016/0192741 A1 | 7/2016 | Mark |
| 2016/0221259 A1 | 8/2016 | Kobida et al. |
| 2016/0257033 A1 | 9/2016 | Jayanti et al. |
| 2016/0263832 A1 | 9/2016 | Bui et al. |
| 2016/0290880 A1 | 10/2016 | Lewis et al. |
| 2016/0303794 A1* | 10/2016 | Atwood ............ B29C 45/14336 |
| 2016/0325491 A1 | 11/2016 | Sweeney et al. |
| 2016/0346997 A1 | 12/2016 | Lewis et al. |
| 2016/0361873 A1 | 12/2016 | Maier |
| 2017/0021564 A1 | 1/2017 | Ooba et al. |
| 2017/0057164 A1 | 3/2017 | Hemphill et al. |
| 2017/0080642 A1 | 3/2017 | Tyler |
| 2017/0106594 A1 | 4/2017 | Gardiner |
| 2017/0129170 A1 | 5/2017 | Kim et al. |
| 2017/0129171 A1 | 5/2017 | Gardner et al. |
| 2017/0136703 A1 | 5/2017 | Hayes et al. |
| 2017/0136707 A1 | 5/2017 | Batchelder et al. |
| 2017/0137955 A1* | 5/2017 | Hofmann ................ C25D 5/56 |
| 2017/0151713 A1 | 6/2017 | Steele |
| 2017/0173889 A1 | 6/2017 | Thomas-Lepore et al. |
| 2017/0255183 A1 | 9/2017 | Clement et al. |
| 2017/0259502 A1 | 9/2017 | Chapiro et al. |
| 2017/0361497 A1 | 12/2017 | Crescenti et al. |
| 2019/0022922 A1 | 1/2019 | Swanson et al. |

FOREIGN PATENT DOCUMENTS

| | | |
|---|---|---|
| CN | 101193953 A | 6/2008 |
| CN | 101300299 A | 11/2008 |
| CN | 101484397 A | 7/2009 |

(56) References Cited

FOREIGN PATENT DOCUMENTS

| | | |
|---|---|---|
| CN | 101689229 A | 3/2010 |
| CN | 101801647 A | 8/2010 |
| CN | 102548737 A | 7/2012 |
| CN | 104149339 A | 11/2014 |
| DE | 4102257 A1 | 7/1992 |
| EP | 2762520 A1 | 8/2014 |
| JP | S58-122116 A | 7/1983 |
| JP | 1-266231 A | 10/1989 |
| JP | H7-117141 A | 5/1995 |
| JP | 2003-534159 A | 11/2003 |
| JP | 2004-331706 A | 11/2004 |
| JP | 2010535117 A | 11/2010 |
| JP | 2012-97449 A | 5/2012 |
| KR | 20100004475 A | 1/2010 |
| KR | 100995983 B1 | 11/2010 |
| KR | 101172859 B1 | 8/2012 |
| WO | 0189714 A1 | 11/2001 |
| WO | 2004050323 A1 | 6/2004 |
| WO | 2009009137 | 1/2009 |
| WO | 2009009137 A1 | 1/2009 |
| WO | 2013017284 A2 | 2/2013 |
| WO | 2014028826 A1 | 2/2014 |
| WO | 2014193505 A1 | 12/2014 |
| WO | 2015042422 A1 | 3/2015 |
| WO | 2015077262 A1 | 5/2015 |
| WO | 2015120429 A1 | 8/2015 |

OTHER PUBLICATIONS

"Thermal Conductivity of Metals", The Engineering Toolbox, http://www.engineeringtoolbox.com/thermal-conductivity-metalsd_858.html, Sep. 15, 2017, 6 pages.
Bales, Steven, "Know Your Mold Coatings", Plastics Technology, http://www.ptonlinecom/articles/know-your-mold-coatings, Dec. 1, 2004, 8 pages.
Compton, B. G. et al., "3D-Printing of Lightweight Cellular Composites," Advanced Materials 2014, vol. 26, pp. 5930-5935.
Liu et al., "Wear of Materials", 2003, p. 1345.
Notification of Transmittal of the International Search Report and the Written Opinion of the International Searching Authority from Corresponding PCT/US2017/013151 dated Mar. 31, 2017.
Ahn et al., Anisoptropic material properties of fused deposition modeling ABS, Rapid Prorotyping vol. 8, No. 4, 2002, pp. 248-257.
August et al., Recent Developments in Automated Fiber Placement of Thermoplastic Composites, SAMPE Technical conference Proceedings, Wichita, KS, Oct. 23, 2013.
Brett Compton, "3D printing of composites with controlled architecture," Engineering Conferences International, ECI Digital Archives, Composites at Lake Louise (CALL 2015), Fall Nov. 9, 2015, pp. 30.
Brett G. Compton and Jennifer A. Lewis, "3D-Printing of Lighweight Cellular Compsites," Advanced Materials 2014, 26, pp. 5930-5935.
Dell'Anno et al., Automated Manufacture of 3D Reinforced Aerospace Composite Structures, International Journal of Structural Integrity, 2012, vol. 3, Iss 1, pp. 22-40.
Devleig et al., High-Speed Fiber Placement on Large Complex Structures, No. 2007-01-3843. SAE International 2007.
Geek magazine—hacker daily blog "To Skolkovo created the Russia's first composite 3D-printer", Feb. 24, 2015, Retreived from the Internet: <http://geek-mag.com/posts/246332/>.
Hasenjaeger, Programming and Simulating Automated Fiber Placement (AFP) CNC Machines, SAMPE Journal, vol. 49, No. 6, Nov./Dec. 2013.
Hossain et al, Improving Tensile Mechanical Properties of FDM-Manufactured Specimens via Modifying Build Parameters, Proceedings of Solid Freeform Fabrication Symposium, Austin, Texas, Aug. 16, 2013.
Lamontia et al, "Contoured Tape Laying and Fiber Placement Heads for Automated Fiber Placement of Large Composite Aerospace Structures," 34th ISTC, Baltimore, MD, Nov. 4-7, 2002.
Mondo et al., Overview of Thermoplastic Composite ATL and AFP Technologies, ITHEC 2012, Oct. 30, 2012, Messe Bremen, Germany.
Rower, Robot Driven Automatic Tapehead for Complex Composite Lay-ups, No. 10AMAF-0066, SAE International 2010, Aerospace Manufacturing and Automated Fastening Conference & Exhibition, Sep. 28, 2010.
Slocum, Alexander: "Kinematic Couplings: A Review of Design Principles and Applications", International Journal of Machine Tools and Manufacture 50.4 (2010): 310-327.
This 3D printer could allow ISS components to be created in space—YouTube. Published on May 20, 2016. Retreived from the Internet: <URL:<https://www.youtube.com/watch?v=YwrTfOjEFtw>.
Zieman et al., Anisotropic Mechanical Properties of ABS Parts Fabricated by Fused Deposition Modelling, INTECH Open Access Publisher, 2012.
ATI technical data sheet, ATI metals, Allegheny Technologies Incorporated, https://www.atimetals.com/Products/Documents/ <http://www.atimetals.com/Products/Documents/ datasheets/stainless-specialty-steel/martensitic/ati_410_420_425_mod_440a_440c_tds_en2_v2.pdf (Year: 2014).
DeVlieg et al., High-Speed Fiber placement on large complex structures, 2007, SAE International, all pages (Year: 2007).
Donghong, Ding et al: "A tool-path generation strategy for wire and arc additive manufacturing," The International Journal of Advanced Manufacturing Technology, vol. 73, No. 1-4, Apr. 11, 2014 (Apr. 11, 2014), pp. 173-183, XP055472255, London, ISSN: 0268-3768, DOI: 10.1007/s00170-014-5808-5.
Gray IV, R.W., Baird, D.G. and Bøhn, J.H., 1998. Thermoplastic composites reinforced with long fiber thermotropic liquid crystalline polymers for fused deposition modeling. Polymer composites, 19(4), pp. 383-394. (Year: 1998).
"List of thermal conductives" https://en.wikipedia.org/wiki/List_of_thermal_conductivities, accessed Mar. 27, 2019 (Year: 2019).
Australian Examination Report No. 1 corresponding to Australian Application No. 2017207367 dated Jun. 4, 2019.
Extended European Search Report from corresponding European Application No. 17738910.3 dated Aug. 13, 2019.
Gray, R.W. IV et al., 1997, Effects ofProcessing Conditions on Prototypes Reinforced with TLCPs for Fused Deposition Modeling, In 1997 International Solid Freeform Fabrication Symposium (Year: 1998).
https://community.ultimaker.com/topic/3248-some-questions-on-perimeters-100-infill-extrusion-width/ (Year: 2013).
Lantern Robotics (https://www.fabbaloo.com/blog/2014/4/18/how-to-make-any-3d-printed-part-much-stronger and see https:// imgur.com/a/EHxkE & https://www.reddit.com/r/3Dprinting/comments/22jwlm/injecting_hot_melt_adhesive_for_100_solid_faster/ (Year: 2014).
Shofner, M.L. et al., 2003, Nanofiber-reinforced polymers prepared by fused deposition modeling, Journal of applied polymer science, 89(11), pp. 3081-3090 (Year 2003).
Shofner, M.L. et al., 2003, Single wall nanotube and vapor grown carbon fiber reinforced polymers processed by extrusion freeform fabrication. Composites Part A: Applied Science and Manufacturing, 34(12), pp. 1207-1217 (Year: 2003).
"Printed strain gauges for aircraft load detection using Aerosol Jet printing", Fraunhofer, 39 pages (Year: 2011).
Australian Examination Report No. 2 corresponding to Australian Application No. 2017207367 dated Aug. 29, 2019.

* cited by examiner

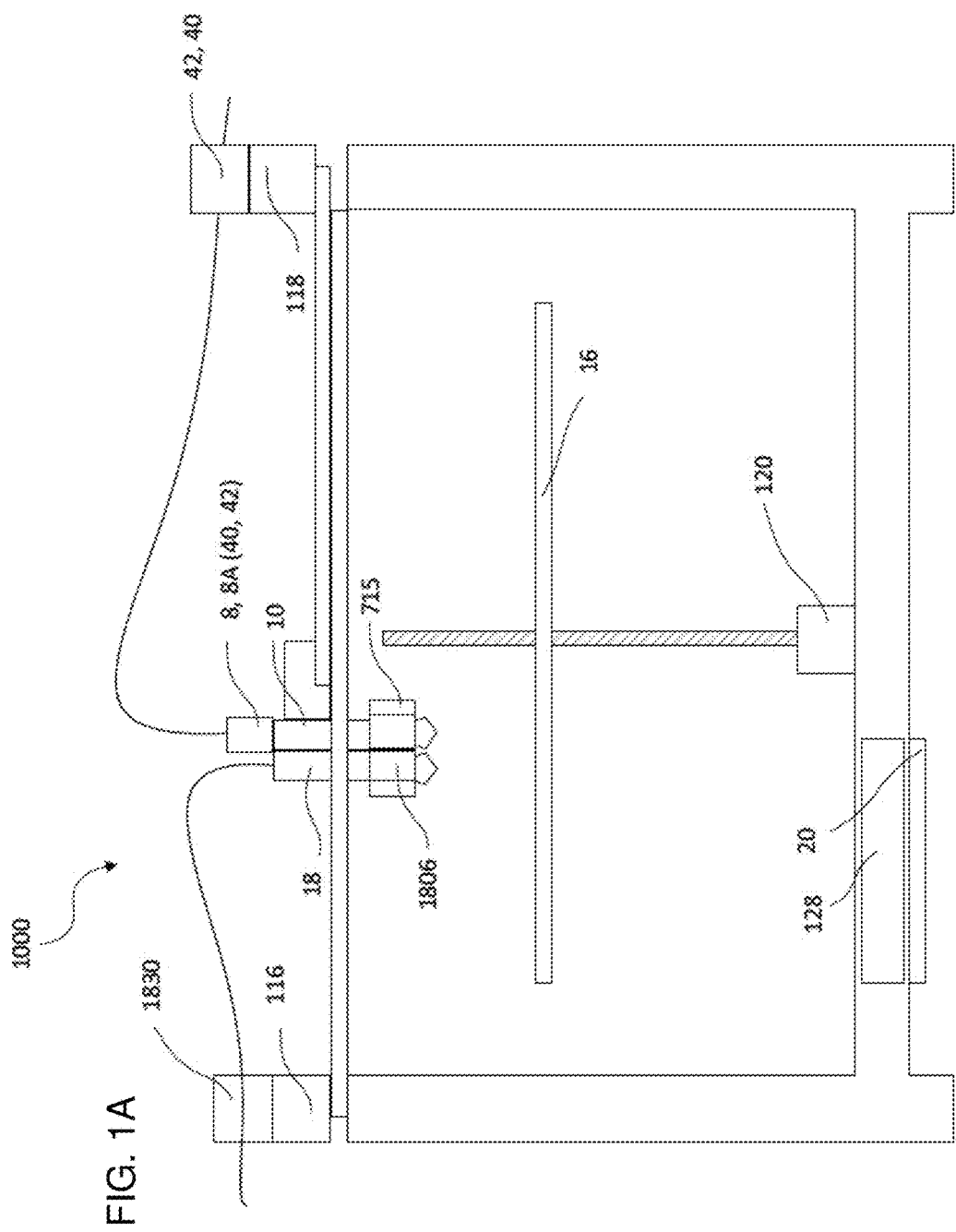

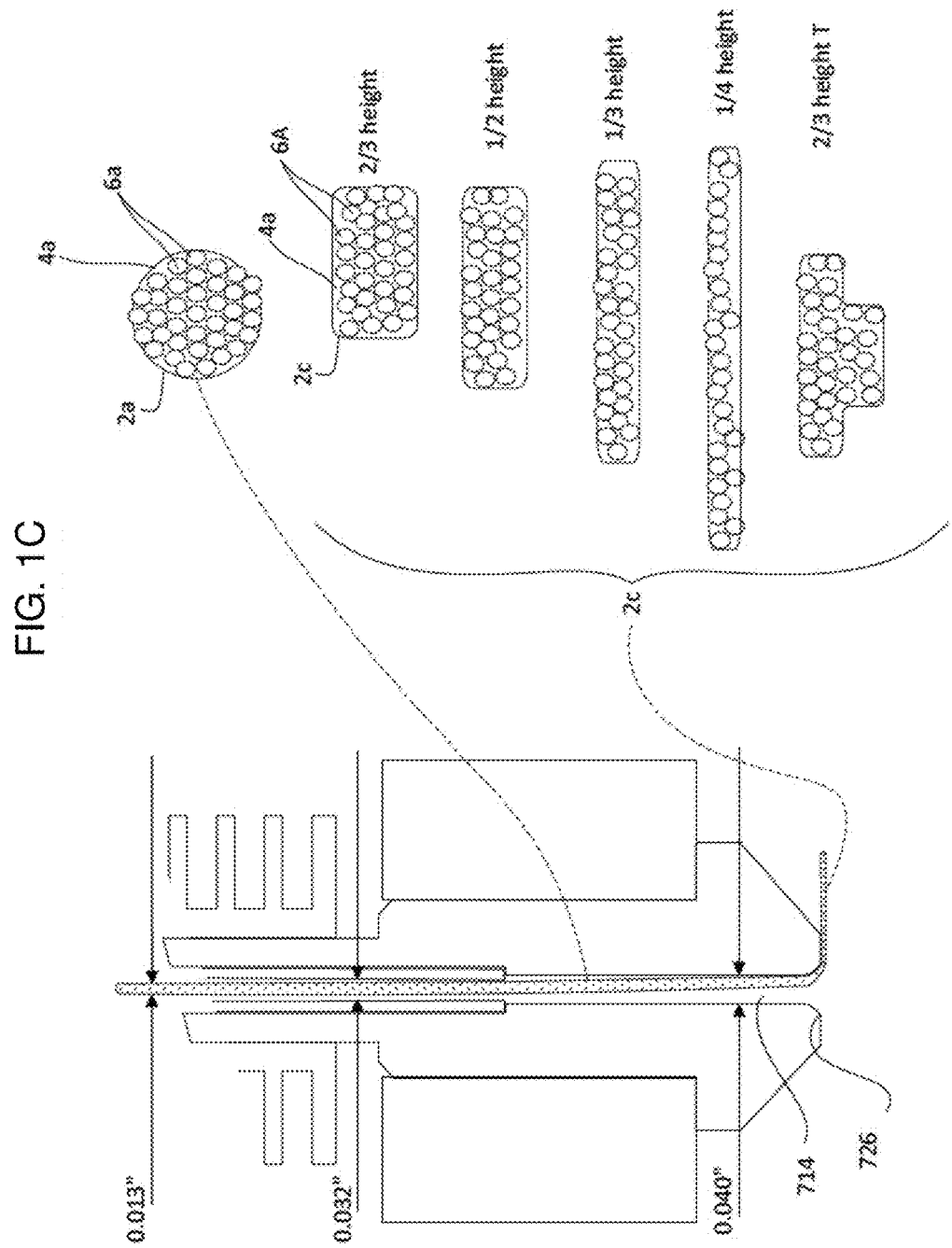

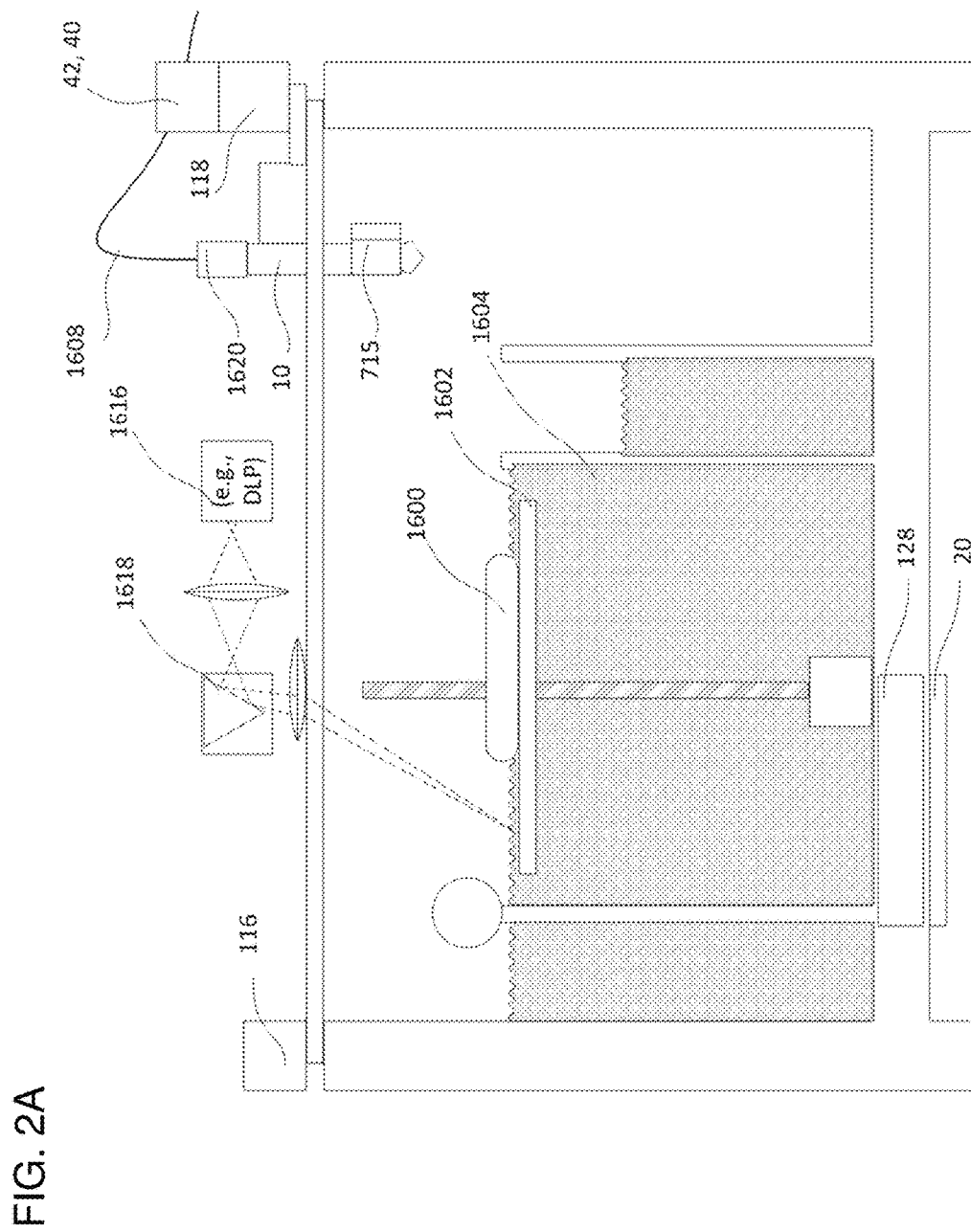

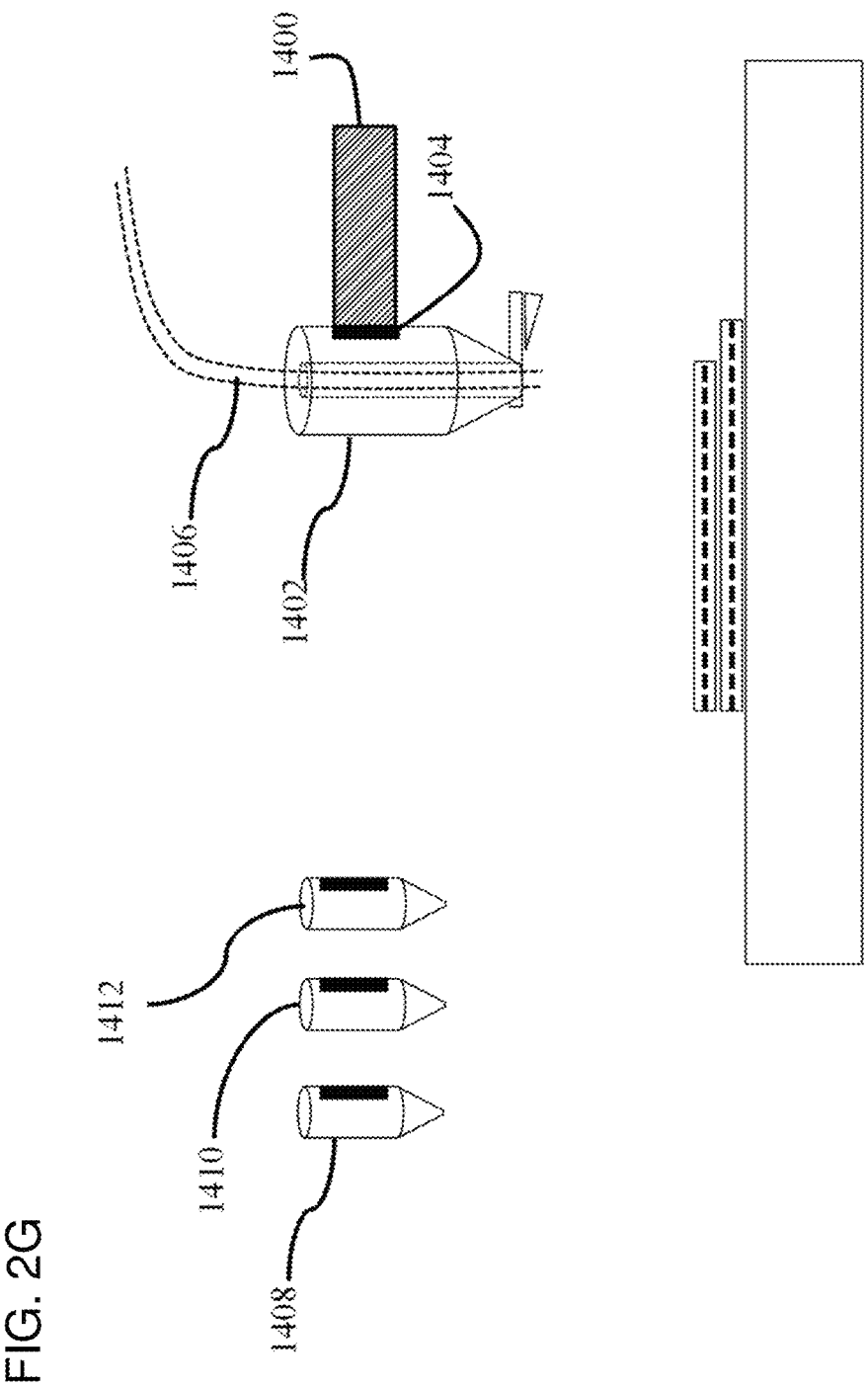

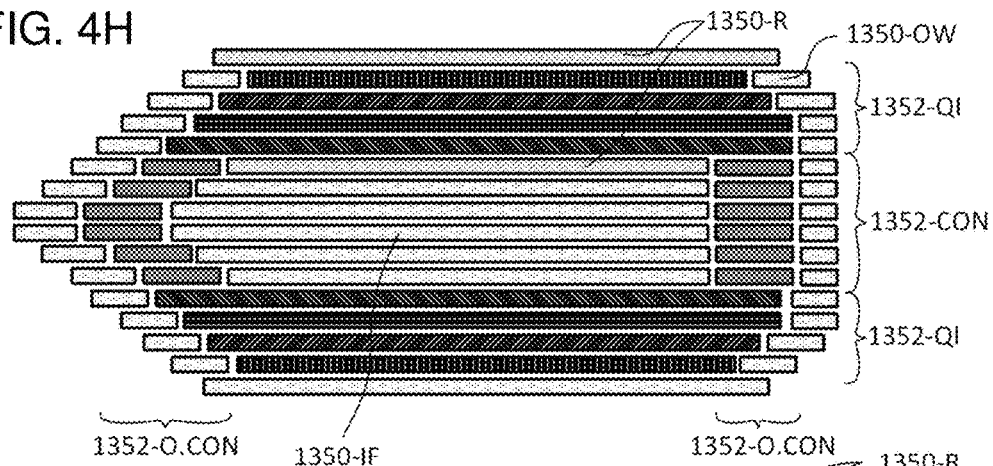
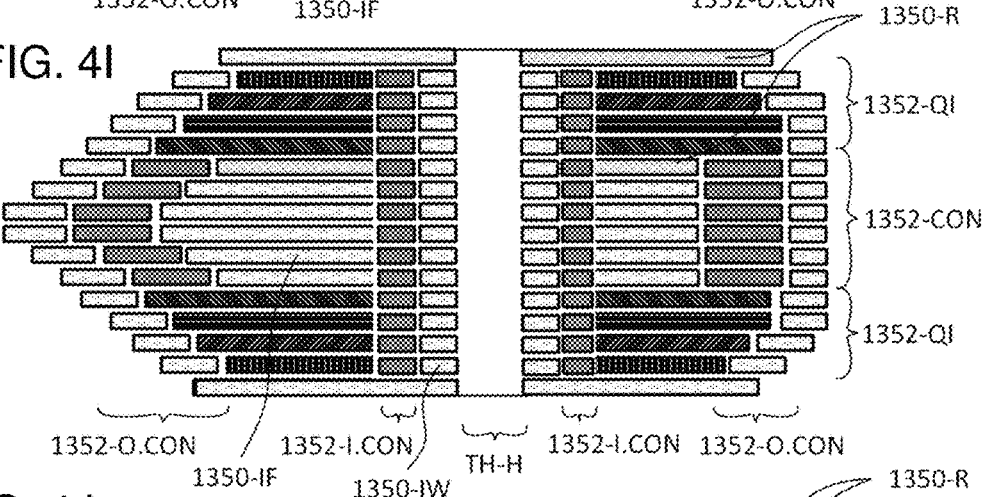
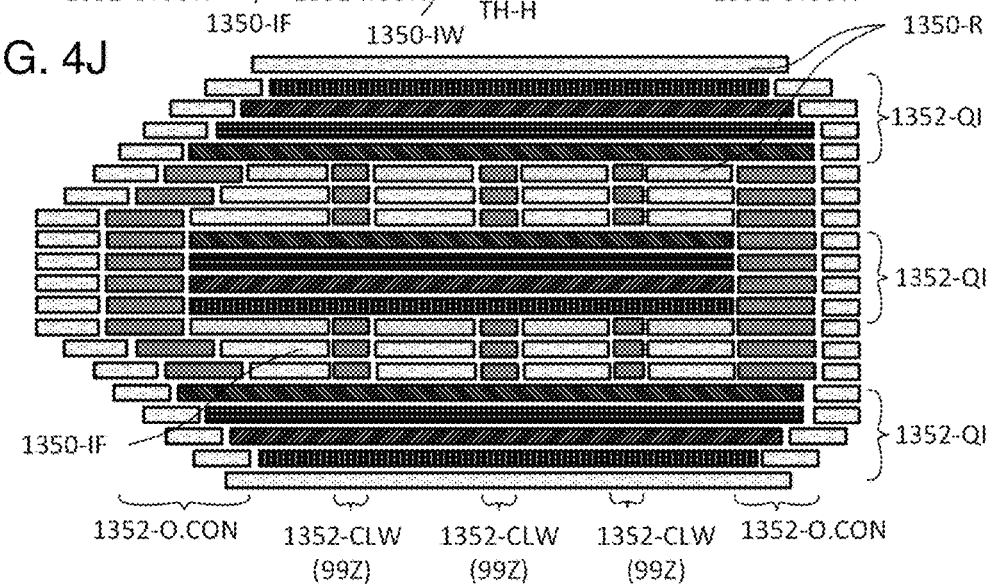

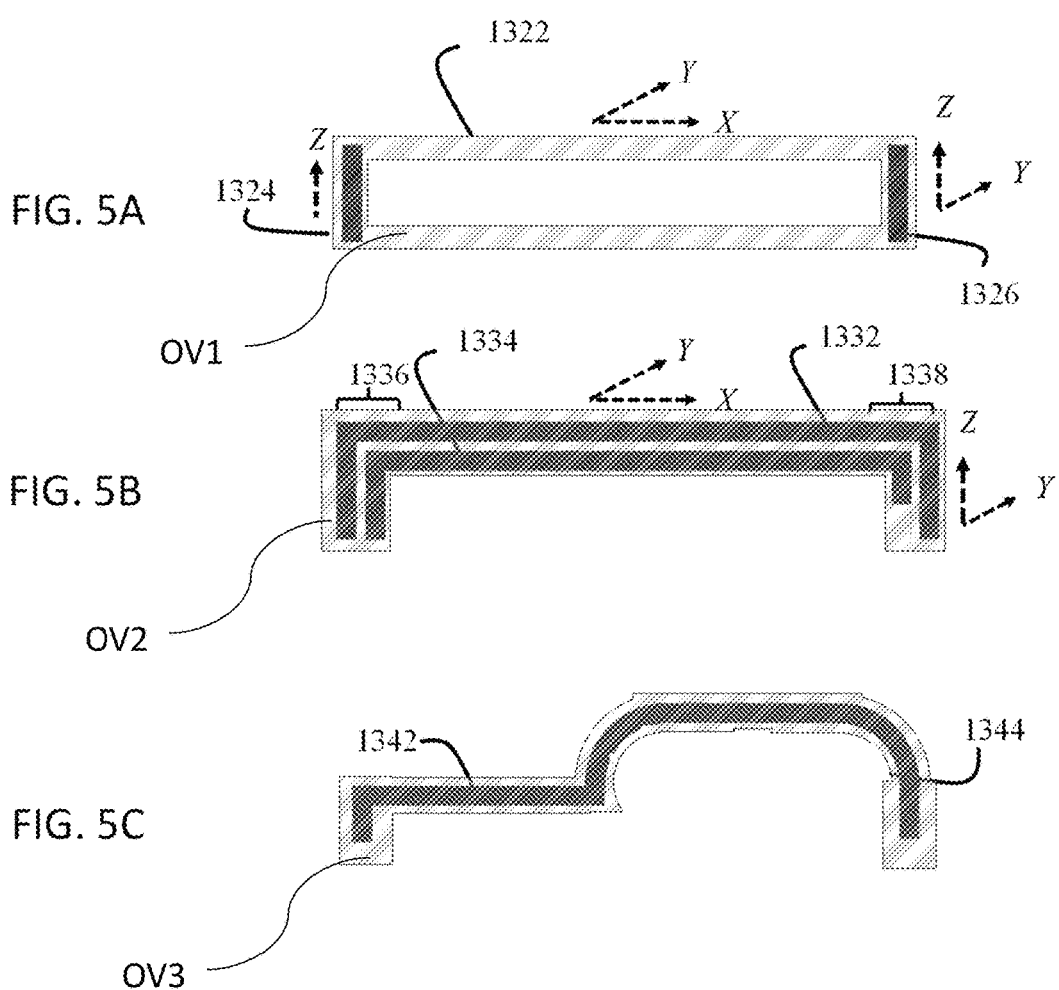

OV4

OV5

OV5

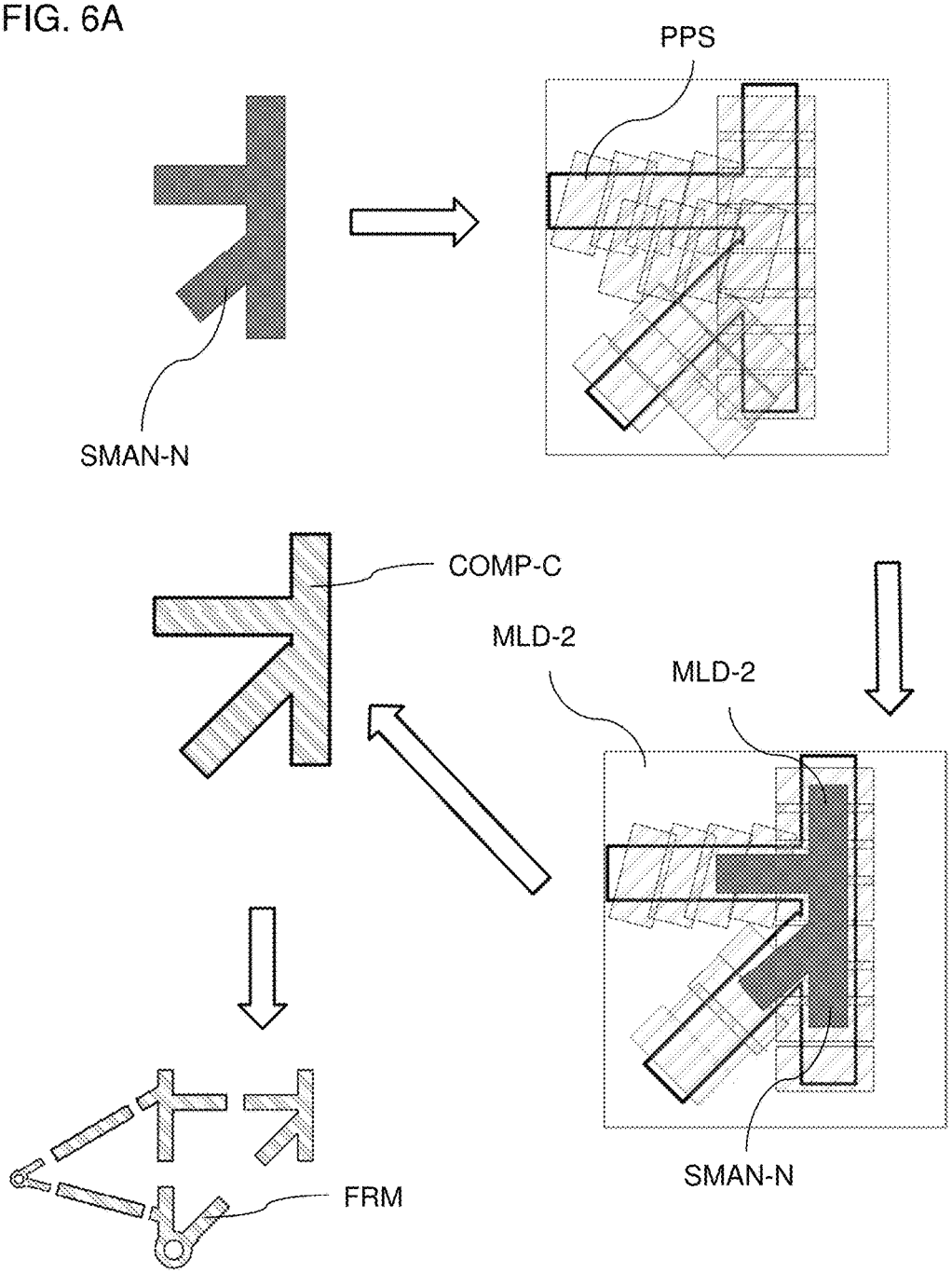

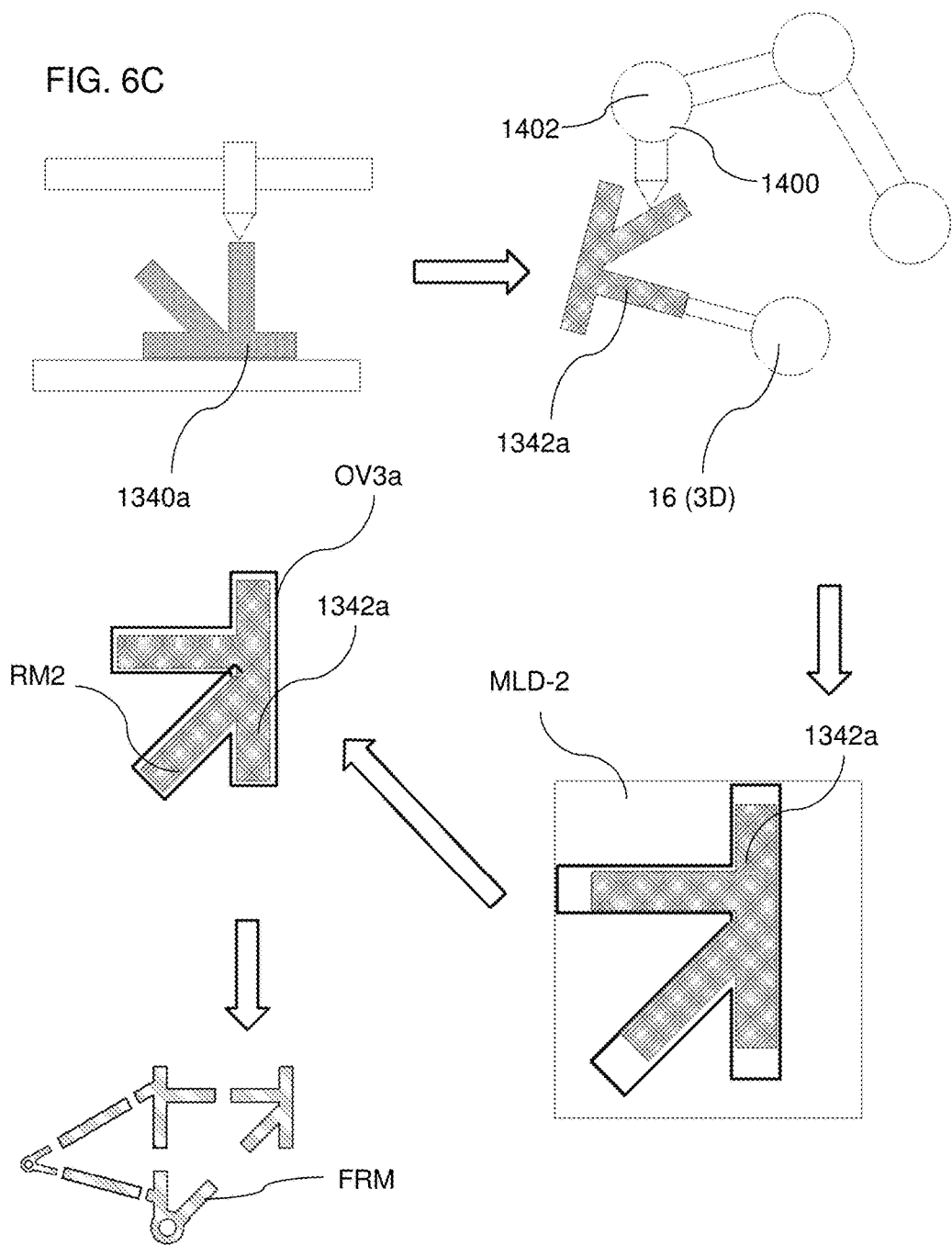

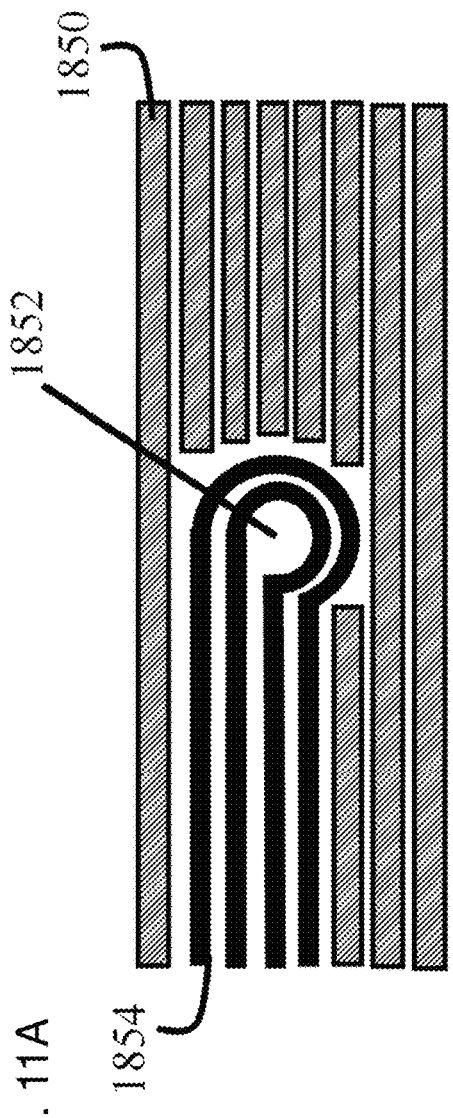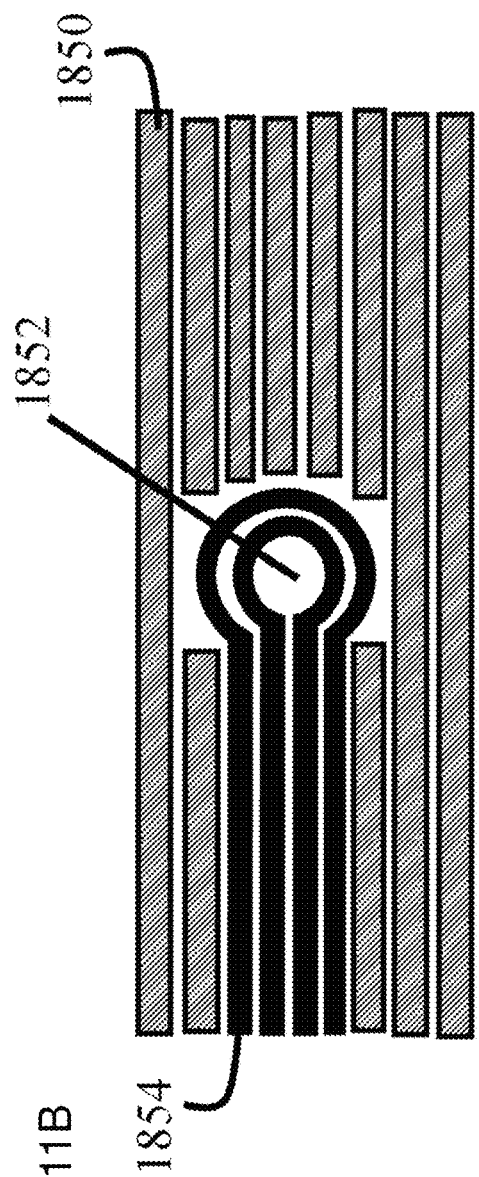
FIG. 11A
FIG. 11B

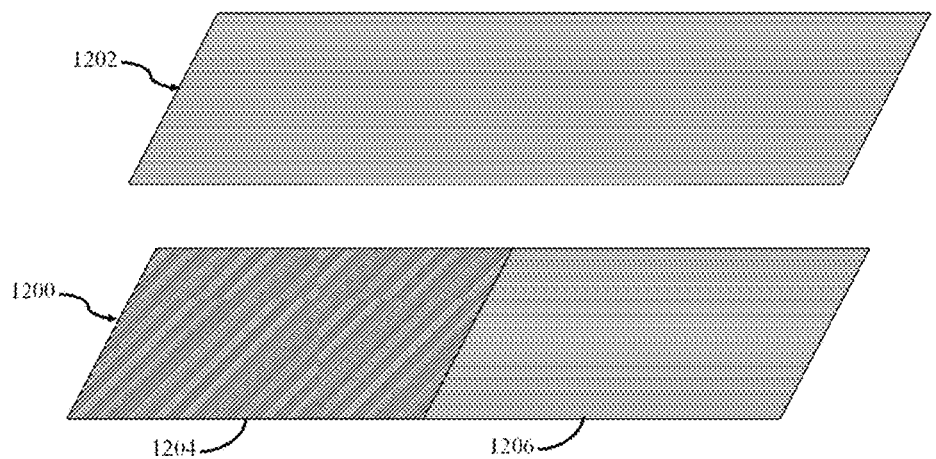
FIG. 11C
FIG. 12
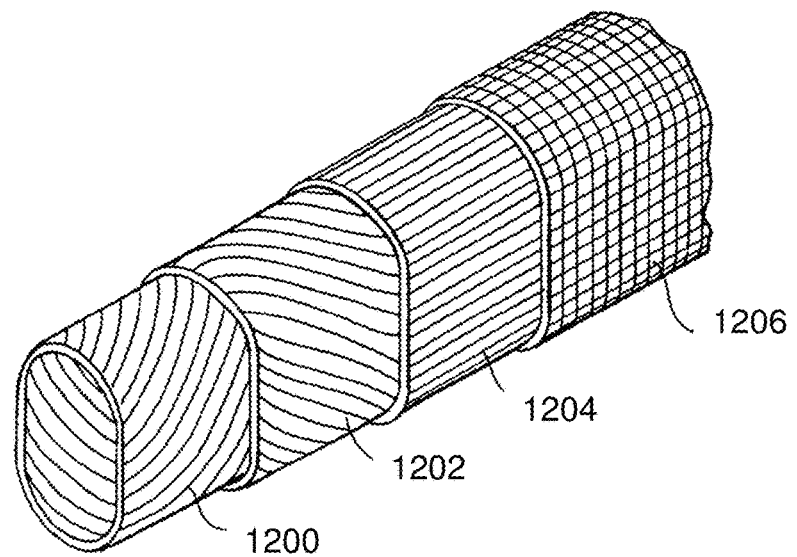

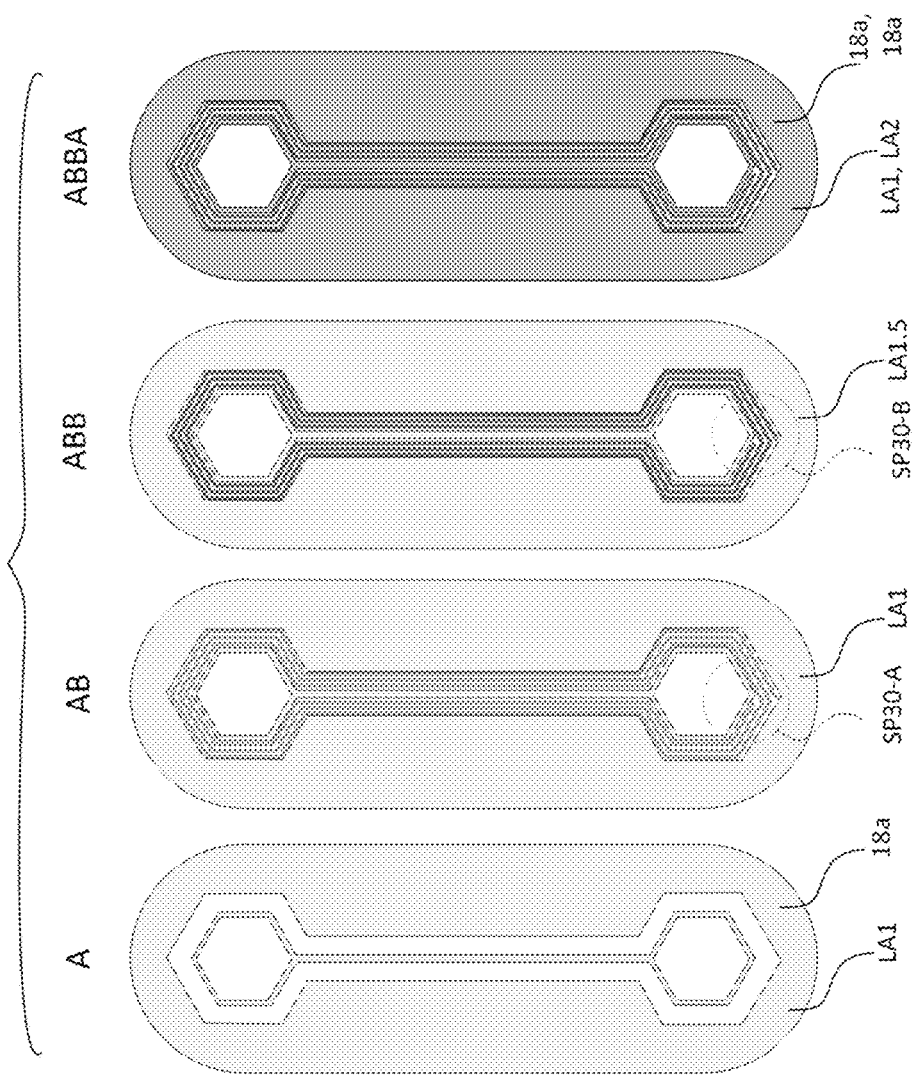

EMBEDDING 3D PRINTED FIBER REINFORCEMENT IN MOLDED ARTICLES

CROSS-REFERENCE TO RELATED APPLICATIONS

This application claims the benefit under 35 U.S.C. § 119(e) of U.S. provisional application Ser. No. 62/277,953, filed Jan. 12, 2016, and is a continuation in part of U.S. patent application Ser. No. 15/174,645, filed Jun. 6, 2016, the disclosures of which are both herein incorporated by reference in their entireties. U.S. patent application Ser. No. 15/174,645 claims the benefit under 35 U.S.C. § 119(e) of U.S. provisional application Ser. No. 62/172,021, filed Jun. 5, 2015, the disclosure of which is herein incorporated by reference in its entirety; and is a continuation in part of each of U.S. patent application Ser. No. 14/944,088, filed Nov. 17, 2015, Ser. No. 14/944,093, filed Nov. 17, 2015, and Ser. No. 14/876,073, filed Oct. 6, 2015, the disclosures of which are herein incorporated by reference in their entirety. U.S. patent application Ser. No. 14/944,088 claims the benefit under 35 U.S.C. § 119(e) of U.S. provisional application Ser. Nos. 62/172,021, filed Jun. 5, 2015, and 62/080,890 filed Nov. 17, 2014, the disclosures of which are herein incorporated by reference in their entirety; and is a continuation in part of U.S. patent application Ser. No. 14/491,439 filed Sep. 19, 2014, the disclosure of which is herein incorporated by reference in its entirety. U.S. patent application Ser. No. 14/491,439 claims the benefit under 35 U.S.C. § 119(e) of U.S. provisional application Ser. Nos. 61/880,129, filed Sep. 19, 2013; 61/881,946, filed Sep. 24, 2013; 61/883,440, filed Sep. 27, 2013; 61/902,256, filed Nov. 10, 2013, 61/907,431, filed Nov. 22, 2013; 61/804,235, filed Mar. 22, 2013; 61/815,531, filed Apr. 24, 2014; 61/831,600, filed Jun. 5, 2013; 61/847,113, filed Jul. 17, 2013, and 61/878,029, filed Sep. 15, 2013, the disclosures of which are herein incorporated by reference in their entirety; and is a continuation-in-part of each of U.S. patent application Ser. No. 14/222,318 [now Abandoned], filed Mar. 21, 2014; Ser. No. 14/297,437 [now U.S. Pat. No. 9,370,896], filed Jun. 5, 2014; and Ser. No. 14/333,881 [now U.S. Pat. No. 9,149,988], filed Jul. 17, 2014; the disclosures of which are herein incorporated by reference in their entirety.

FIELD

Aspects relate to three dimensional printing.

BACKGROUND

"Three dimensional printing" as an art includes various methods such as Stereolithography (SLA) and Fused Filament Fabrication (FFF). SLA produces high-resolution parts, typically not durable or UV-stable, and is used for proof-of-concept work; while FFF extrudes through a nozzle successive filament beads of ABS or a similar polymer.

In the art of "Composite Lay-up", preimpregnated ("prepreg") composite sheets of fabric impregnated with a resin binder are layered into a mold, heated, and cured. In "Composite Filament Winding" sticky "tows" including multiple thousands of individual carbon strands are wound around a custom mandrel to form a rotationally symmetric part.

There is no commercial or experimental technique for orienting fiber during additive manufacturing to anisotropically improve properties of the finished part.

SUMMARY

According to one aspect of embodiments relating to the present invention, a method of fabricating a reinforced molding includes additively depositing continuous reinforcing fiber in a reinforcement volume to form a continuous fiber reinforcement preform. As an additively manufactured body, the preform may be far more complex than simply a sheet, panel, or curved panel, the preform may be a "complex solid", i.e., produced by combining and/or removing parts of three dimensional shapes including at least some of cuboids, cylinders, prisms, pyramids, spheres, and cones. The continuous fiber reinforcement preform is located within a mold of a molding apparatus, and the mold is loaded with molten molding material. The molding material is hardened to overmold the continuous fiber reinforcement preform, thereby forming a reinforced molding surrounding an internal continuous fiber reinforcement preform with a hardened molding material, wherein the reinforcement volume is smaller than a volume of the entire reinforced molding.

Optionally, the reinforcement volume includes a combined volume of reinforcement fiber and a matrix that may be heated to a liquid state (e.g., a crystalline material having a melting temperature, an amorphous material having a glass transition temperature, or a semi-crystalline material having both) within which the reinforcement fiber is additively deposited, and the reinforcement volume is less than 20 percent of the entire reinforced molding volume.

Alternatively, or in addition, the molding is performed at a molding material pressure which removes air voids within the fiber reinforcement matrix material. Further, the continuous fiber reinforcement preform may be bent or deformed from its formation shape to a deformed shape within the mold. Further optionally, two or more continuous fiber reinforcement preforms may be bonded to one another before location within the mold.

In some embodiments, the mold is an injection mold, and pack pressure of the injection molded material during molding consolidates the fiber reinforcement preform into a final shape and removes voids within the fiber reinforcement preform. If the mold is an injection mold, and heat from injected molding material may remelt a matrix material of the fiber reinforcement preform. In some examples, the fiber deposition is an additively deposited thermoplastic continuous fiber reinforced prepreg tape having a width at least three times its height. Optionally, vacuum may be applied during at least one of formation of the continuous fiber reinforcement preform and the molding to remove voids.

In one optional approach, a support material is formed in a first shape as a support preform, and the continuous reinforcing fiber is additively deposited in the reinforcement volume in a second shape following a contour of the removable support preform to form a continuous fiber reinforcement preform. Optionally, at least one part of the support preform extends to be contiguous with a surface of the reinforced molding. In another example, the support preform is formed in a non-looped shape for permitting additively depositing the continuous fiber reinforcement preform by winding about the support preform. The support preform may itself be injection molded, and may be injection molded as a honeycombed structure, with a contiguous outer surface suitable as a winding substrate. The support preform and continuous fiber reinforcement preform may be formed in alternating successive additive and injection molded stages.

Optionally, the support preform is formed in a substantially rotationally symmetric shape or mandrel for permitting additively depositing the continuous fiber reinforcement preform by winding about the support preform. In one embodiment, the support preform is relatively moved in at least one rotational degree of freedom with respect to a deposition head that additively deposits the continuous reinforcing fiber in the second shape following the contour of the preform to form the continuous fiber reinforcement preform.

A continuous fiber reinforcement preform may embeds at least one sandwich panel structure. The sandwich panel structure is optionally a foldable structure, having a linear gap formed therein opposite a fold line to form a hinge.

Further optionally, the support preform is formed including a soluble material, and further comprising dissolving the preform. The support preform may be dissolved before locating the continuous reinforcement fiber preform within the mold, and/or the support preform may be one of displaced, melted, or dissolved by the mold loading. Alternatively, or in addition, the support preform may be dissolved after the mold material is hardened. The support preform may be dissolved at least in part before location in the mold, and at least in part after the reinforced molding is hardened. The support preform may be bent or deformed from its formation shape to a deformed shape for depositing the fiber reinforcement to form the continuous fiber reinforcement preform. In one embodiment, a wide prepreg sheet is arranged against the support preform before additively depositing continuous fiber tape prepreg.

Optionally, the continuous reinforcement preform is located in the reinforcement volume following a contour to form the continuous fiber reinforcement preform as a first reinforced panel. In this case, a further step or act may be locating a honeycombed panel of molding material alongside the first reinforced panel, wherein the molding material is hardened to overmold the honeycombed panel against the first reinforced panel, thereby forming a fiber reinforced molding including a molding material honeycomb and a continuous fiber reinforcement. Optionally, a second reinforced panel is additively continuous fiber deposited upon the honeycombed panel. The second reinforced panel may be formed having a joining surface mirroring a surface of the first reinforced panel. A honeycomb structure may be formed as a support preform upon which the second fiber reinforced preform is deposited.

In each case, the molding material may be substantially isotropic in tensile strength (e.g., a resin, metal, or ceramic, including some reinforced with additives), and the continuous reinforcing fiber is substantially anisotropic in tensile strength (e.g., carbon, glass, aramid, basalt, UHMWPE, or other continuous and/or long fibers).

BRIEF DESCRIPTION OF THE DRAWINGS

FIG. 1A is a schematic view of a continuous core reinforced filament deposition and fill material filament extrusion printer.

FIG. 1C is a close-up cross-section of a fiber printhead assembly and a set of different possible compression/consolidation shapes.

FIGS. 2A through 2C are schematic representations of a three dimensional printing system using a continuous core reinforced filament together with stereolithography or selective laser sintering in which FIGS. 2A and 2B are schematic views of a continuous core reinforced filament-SLA/SLS printer and FIG. 2C is a schematic view of a tacking process.

FIG. 2G is a schematic representation of a three dimensional printing system including a print arm (e.g., a robot arm having 4 or more degrees of freedom) and selectable printer heads.

FIGS. 4H-4J show exemplary weighted distributions of 3D printed composite lay-up according to the present embodiments, e.g., to form sandwich panel shell and fiber cellular interior structures, using both quasi-isotropic sets of shells or layers and concentrically reinforced shells or layers, to increase effective moment of inertia about the entire surface of the part as well as increase crushing and torsional resistance.

FIGS. 5A-5D show the structures of FIGS. 4A-4D in which the internal structures are additively deposited as soluble preforms instead of structural resin.

FIGS. 6A and 6B show successive steps in a process of multi-component composite lay-up to build an exemplary bicycle frame.

FIGS. 6C and 6D show successive steps in a process of additive soluble preform and additive continuous fiber reinforcement preform to build an exemplary bicycle frame.

FIGS. 11A-11B show schematic representations of a printed part including a reinforced holes formed therein.

FIG. 11C shows exemplary composite layup via 3D printing of composite fibers as disclosed herein in contrasting directions.

FIG. 12 shows a multi-layer laminate as FIG. 11C deposited successively in a tubular form.

FIG. 15 shows a composite swath 2c of a reinforcement formation in a layer $LA_n$ continuously deposited end-to-end with an adjacent reinforcement formation continuing into the next layer $LA_{n+1}$, i.e., without cutting the composite swath 2c as the part 14 is indexed to the next layer.

DETAILED DESCRIPTION

Figure 1B:
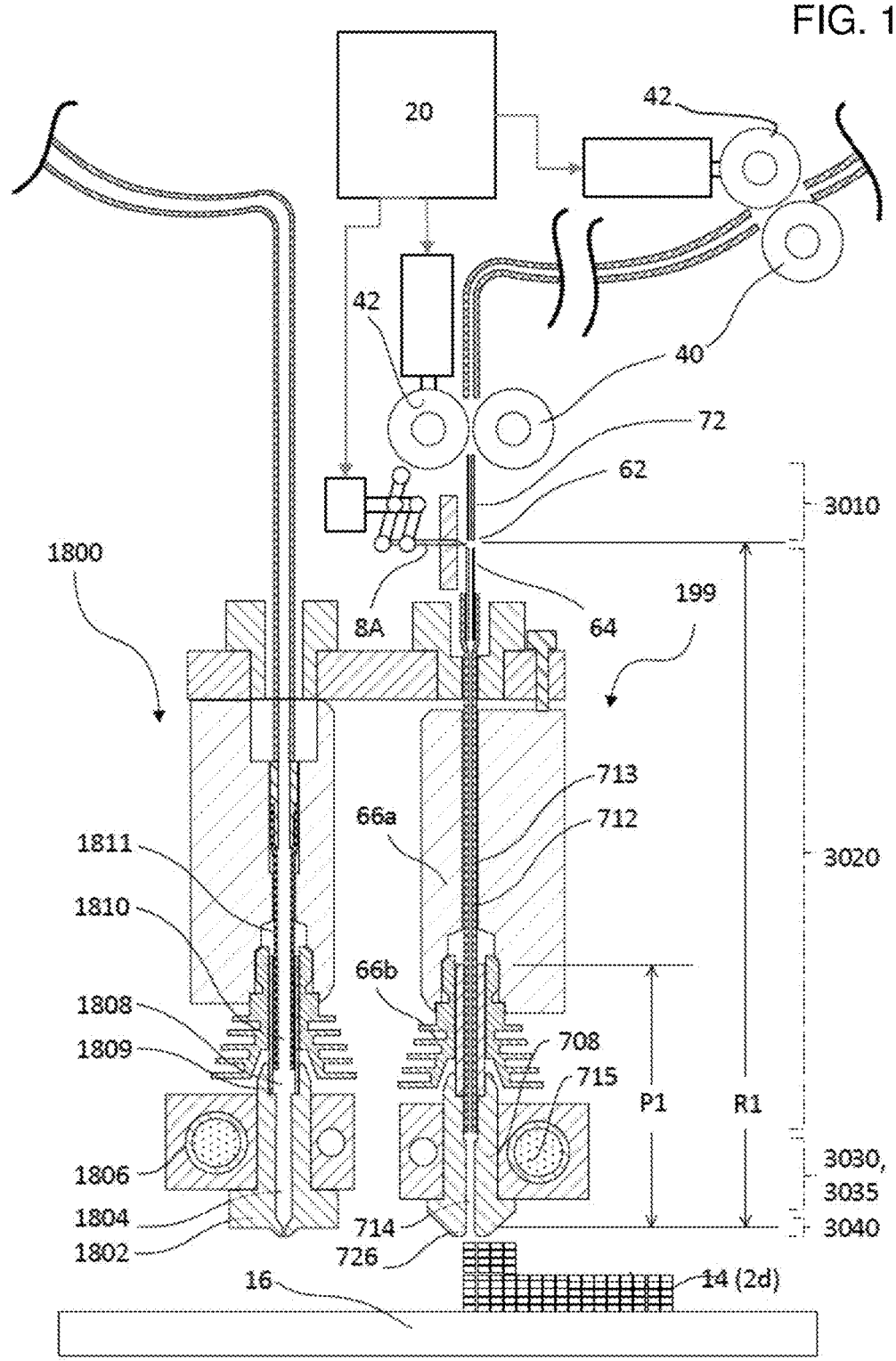
FIG. 1B is a cross-sectional and schematic view of a compound extrusion and fiber printhead assembly.

This patent application incorporates the following disclosures by reference in their entireties: U.S. Patent Application Ser. Nos. 61/804,235; 61/815,531; 61/831,600; 61/847,113; 61/878,029; 61/880,129; 61/881,946; 61/883,440; 61/902,256; 61/907,431; 62/080,890, 62/172,021; Ser. Nos. 14/222,318; 14/297,437; 14/333,881 and 14/491,439 which may be referred to herein as "Composite Filament Fabrication patent applications" or "CFF patent applications".

Definitions

In the present disclosure, "3D printer" is inclusive of both discrete printers and/or toolhead accessories to manufacturing machinery which carry out an additive manufacturing sub-process within a larger process. With reference to FIGS. 1-5, 3D printer is controlled by a motion controller 20 which interprets dedicated G-code 1102 and drives various actuators of the 3D printer in accordance with the G-code 1102.

As used herein, "extrusion" shall have its conventional meaning, e.g., a process in which a stock material is pressed through a die to take on a specific shape of a lower cross-sectional area than the stock material. Fused Filament Fabrication (FFF) is an extrusion process. Similarly, "extrusion nozzle" shall have its conventional meaning, e.g., a device designed to control the direction or characteristics of an extrusion fluid flow, especially to increase velocity and/or restrict cross-sectional area, as the fluid flow exits (or enters) an enclosed chamber. The present disclosure shall also use the coined word "conduit nozzle" or "nozzlet" to describe a terminal printing head, in which unlike a FFF nozzle, there is no significant back pressure, or additional velocity created in the printing material, and the cross sectional area of the printing material, including the matrix and the embedded fiber(s), remains substantially similar throughout the process (even as deposited in bonded ranks to the part). As used herein, "deposition head" shall include extrusion nozzles, conduit nozzles, and/or hybrid nozzles. Also as used herein, a reference to a Figure numbers with no following letter suffix shall refer also to all letter suffixes of the same Figure number, e.g., a reference to "FIG. 1" refers to all of FIGS. 1A, 1B, 1C, and 1D.

Lastly, in the three-dimensional printing art, "filament" typically refers to the entire cross-sectional area of a spooled build material, while in the composites art, "filament" refers to individual fibers of, for example, carbon fiber (in which, for example, a "1K tow" will have 1000 individual strands). For the purposes of the present disclosure, "filament" shall retain the meaning from three-dimensional printing, and "strand" shall mean individual fibers that are, for example, embedded in a matrix, together forming an entire composite "filament".

3D Printing System

The printer(s) of FIGS. 1A-1D, with at least two print heads 18, 10 and/or printing techniques, deposit with one head a fiber reinforced composite filament, and with a remaining head apply pure or neat matrix resin 18a (thermoplastic or curing). The fiber reinforced composite filament 2 (also referred to herein as continuous core reinforced filament) may be substantially void free and include a polymer or resin that coats, permeates or impregnates an internal continuous single core or multistrand core. It should be noted that although the print head 18 is shown as an extrusion print head, "fill material print head" 18 as used herein includes optical or UV curing, heat fusion or sintering, or "polyjet", liquid, colloid, suspension or powder jetting devices—not shown—for depositing fill material.

Although FIGS. 1A-1D in general show a Cartesian arrangement for relatively moving the print-heads in 3 orthogonal translation directions, other arrangements are considered within the scope of, and expressly described by, a drive system or drive or motorized drive that may relatively move a print head and a build plate supporting a 3D printed part in at least three degrees of freedom (i.e., in four or more degrees of freedom as well). For example, for three degrees of freedom, a delta, parallel robot structure may use three parallelogram arms connected to universal joints at the base, optionally to maintain an orientation of the print head (e.g., three motorized degrees of freedom among the print head and build plate) or to change the orientation of the print head (e.g., four or higher degrees of freedom among the print head and build plate). As another example, the print head may be mounted on a robotic arm having three, four, five, six, or higher degrees of freedom; and/or the build platform may rotate, translate in three dimensions, or be spun.

The fiber reinforced composite filament 2, 2a is fed, dragged, and/or pulled through a conduit nozzle 10, 199 optionally heated to a controlled temperature selected for the matrix material to maintain a predetermined viscosity, force of adhesion of bonded ranks, melting properties, and/or surface finish.

After the matrix material or polymer 4, 4a is substantially melted, the continuous core reinforced filament 2 is applied onto a build platen 16 to build successive layers 14 to form a three dimensional structure. The relative position and/or orientation of the build platen 16 and conduit nozzle 10 are controlled by a controller 20 to deposit the continuous core reinforced filament 2 in the desired location and direction.

A cutter 8 controlled by the controller 20 may cut the continuous core reinforced filament during the deposition process in order to (i) form separate features and components on the structure as well as (ii) control the directionality or anisotropy of the deposited material and/or bonded ranks in multiple sections and layers. At least one secondary print head 18 may print fill material 18a to form walls, infill, UV resistant and/or scratch resistant protective coatings, and/or removable, dissolvable, or soluble support material.

The supplied filament includes at least one axial fiber strand 6, 6a extending within a matrix material 4, 4a of the filament, for example a nylon matrix 4a that impregnates hundreds or thousands of continuous carbon, aramid, glass, basalt, or UHMWPE fiber strands 6a. The fiber strand material has an ultimate tensile strength of greater than 300 MPa.

The driven roller set 42, 40 push the unmelted filament 2 along a clearance fit zone that prevents buckling of filament 2. In a threading or stitching process, the melted matrix material 6a and the axial fiber strands 4a of the filament 2 are pressed into the part 14 and/or into the swaths below 2d, at times with axial compression. As the build platen 16 and print head(s) are translated with respect to one another, the end of the filament 2 contacts the ironing lip 726 and is subsequently continually ironed in a transverse pressure zone 3040 to form bonded ranks or composite swaths in the part 14.

FIG. 1B depicts a cross section of a compound (e.g., at least dual) print head with an extrusion printhead 1800 (as head 18) and extrusion nozzle 1802 for FFF and a fiber deposition printhead 199 (as head 10) and conduit nozzle 708 for continuous fiber reinforced thermoplastic deposition. Like numbered features are similar to those described with respect to FIG. 1A.

The feed rate (the tangential or linear speed of the drive 42, 40) and/or printing rate (e.g., the relative linear speed of the platen/part and print head) may be monitored or controlled to maintain compression, neutral tension, or positive tension within the unsupported zone as well as primarily via axial compressive or tensile force within fiber strand(s) 6a extending along the filament 2.

As shown in FIGS. 1B and 1C, a transverse pressure zone 3040 includes an ironing lip 726 that reshapes the filament 2. This ironing lip 726 compacts or presses the filament 2 into the part and may also melt, heat to cross glass transition into a non-glassy state, and/or liquefy the matrix material 4a in the transverse pressure zone 3040. Optionally, the ironing lip 726 flattens in the transverse pressure zone 3040 the melted filament 2 on the "top" side (i.e., the side opposite the part 14), applying an ironing force to the melted matrix material 4a and the axial fiber strands 6a as the filament 2 is deposited in bonded ranks or composite swaths 2c. For example, the controller 20 maintains the height of the bottom of the ironing lip 726 to the top of the layer below as less than the diameter of the filament (e.g., to compress to ½ the height of the filament, at least at ½ the filament height; to compress to ⅓ the height of the filament, at least at ⅓ the filament height, and so on). The controller 20 may maintain the height at of the bottom of the ironing lip 726 to the layer below at zero (e.g., in which case the amount of consolidation/compression and the fiber swath 2c height may be a function of system stiffness). Another reshaping force is applied as a normal reaction force from the platen 16 or part 14 itself, which flattens the bonded ranks or composite swaths 2c on at least two sides as the melted matrix material 4a and the axial fiber strands 6a are ironed to form laterally and vertically bonded ranks (i.e., the ironing also forces the bonded ranks 2c into adjacent ranks).

As shown in FIG. 1C, if the underlying layer or swaths 2d includes channels, the normal reaction force from the part 14 may create T-shapes instead. The pressure and heat applied by ironing improves diffusion and fiber penetration into neighboring ranks or swaths (laterally and vertically).

As shown in FIG. 1B, unmelted fiber reinforced filament may be severed in a gap 62 between a guide tube 72 (having a clearance fit) and the conduit nozzle 708; or within the conduit nozzle 708, e.g., upstream of the non-contact zone 3030; and/or at the clearance fit zone 3010, 3020 or at the ironing lip 726.

After the matrix material 6a is melted by the ironing lip or tip 726, the feed and/or printing rate can be controlled by the controller 20 to maintain neutral to positive tension in the composite filament 2 between the ironing lip 726 and the part 14 primarily via tensile force within the fiber strands 4a extending along the filament 2. A substantially constant cross sectional area of the fiber reinforced composite filament is maintained in the clearance fit zone, the unsupported zone, the transverse pressure zone, and also as a bonded rank is attached to the workpiece or part 14.

With reference to FIG. 1B, each of the printheads 1800 and 199 may be mounted on the same linear guide or different linear guides or actuators such that the X, Y motorized mechanism of the printer moves them in unison. As shown, the FFF printhead 1800 includes an extrusion nozzle 1802 with melt zone or melt reservoir 1804, a heater 1806, a high thermal gradient zone 1808 formed by a thermal resistor or spacer 1809 (optionally an air gap), and a Teflon or PTFE tube 1811. A 1.75-1.8 mm; 3 mm; or larger or smaller thermoplastic filament is driven through, e.g., direct drive or a Bowden tube provides extrusion back pressure in the melt reservoir 1804.

The companion continuous fiber embedded filament printhead 199, as shown, includes the conduit nozzle 708, the composite ironing tip 728, and the limited contact cavity 714, in this example each within a heating block heated by a heater 715. A cold feed zone 712 may be formed within a receiving tube 64, including a capillary-like receiving tube of rigid material and a small diameter (e.g. inner diameter of 32 thou) Teflon/PTFE tube extending into the nozzle 708. The cold feed zone is surrounded in this case by an insulating block 66a and a heat sink 66b, but these are fully optional. In operation, an unattached terminal end of the fiber-embedded filament may be held in the cold feed zone, e.g., at height P1. Distance P1, as well as cutter-to-tip distance R1, are retained in a database for permitting the controller 20 to thread and advance the fiber-embedded filament as discussed herein. If P1 and R1 are very similar (e.g., if the cutter location is near or within the cold feed zone), P1 may be set to be the same or similar to R1. Further as shown, the controller 20 is operatively connected to the cutter 8, 8A, and feed rollers 42 facing idle rollers 40.

FIG. 1C shows a schematic close-up cross section of the conduit nozzle 708. As shown in FIG. 1C, the inner diameter of the receiving tube 64 (in this case, at a position where a Teflon/PTFE inner tube forms the inner diameter) may be approximately 1½ to 2½ times (at, e.g., 32 thou) the diameter of the filament 2 (at, e.g., 12-15, or 13 thou) shown therewithin. The inner diameter or inner width of the terminal cavity 714 (at, e.g., 40 thou) is from two to six times the diameter of the filament 2 shown therein. These are preferred ranges, it is considered the diameter of the receiving tube may be from 1 1/10 to 3 times the diameter of the filament, and the inner diameter of the terminal cavity from two to 12 times the diameter of the filament. The terminal cavity is preferably of larger diameter than the receiving tube.

In addition, as shown in FIG. 1C, the heated composite filament ironing tip 726 is moved relative to the part, at a height above the part of less than the filament diameter and scaled according to a desired proportion of composite swath, to iron the fiber reinforced composite filament 2 as it is deposited to reshape a substantially oval or circular bundle of inelastic axial fiber strands 6a within the fiber reinforced composite filament to a substantially flattened block of inelastic fibers strands within a bonded rank 2c of the part. Axial compression and/or laterally pressing the melted matrix filament 2 into bonded ranks may enhance final part properties. For example, FIG. 1C shows a composite fiber reinforced filament 2 applied with a compaction force, axial compression, or lateral pressure 62. The compaction pressure from axial compression and flattening from the ironing lip, compresses or reshapes the substantially circular cross-section filament 2a into the preceding layer below and into a second, substantially rectangular cross-section compacted shape 2c. The entire filament 2a forms a bonded rank 2c (i.e., bonded to the layer below 2d and previous ranks on the same layer) as it is shaped.

The filament 2c and/or interior strands 6a of the filament 2c both spread and intrude into adjacent bonded ranks 2c or 2d on the same layer and the matrix material 4a and strands 6a are compressed into the underlying shaped filament or bonded rank of material 2d. This pressing, compaction, or diffusion of shaped filaments or bonded ranks 2c, 2d reduces the distance between reinforcing fibers, and increases the strength of the resultant part (and replaces techniques achieved in composite lay-up using post-processing with pressure plates or vacuum bagging). Accordingly, in some embodiments or aspect of the invention discussed herein, the axial compression of the filament 2 and/or especially the physical pressing by the printer head 70, conduit nozzle or ironing lip 726 in zone 3040 may be used to apply a compression/compaction/consolidation pressure directly to the deposited material or bonded ranks or composite swaths 2c to force them to spread or compact or flatten into the ranks beside and/or below. Cross-sectional area is substantially or identically maintained.

Alternatively or in addition, pressure may be applied through a trailing pressure plate behind the print head; a full width pressure plate and/or roller 2138 (see, e.g., FIG. 2E) spanning the entire part that applies compaction pressure to an entire layer at a time; and/or heat, pressure, or vacuum may be applied during printing, after each layer, or to the part as a whole to reflow the resin in the layer and achieve the desired amount of compaction (forcing of walls together and reduction and elimination of voids) within the final part.

FIGS. 2A-2H depict embodiments of a three dimensional printer in applying a fiber reinforced composite filament 2 together with DLP-SLA, SLA, SLS, "polyjet" or other techniques to build a structure. Like numbered or like appearance features may be similar to those described with respect to FIG. 1A.

Although one embodiment or aspect of the invention uses thermoplastic matrix, hybrid systems are possible. A reinforced filament may employ a matrix that is finished by a curing cycle, e.g., using heat, light, lasers, and/or radiation. For example, continuous carbon fibers are embedded in a partially cured epoxy such that the extruded component sticks together, but requires a post-cure to fully harden. Similarly, while one embodiment or aspect of the invention use preformed continuous core reinforced filaments, in some embodiments, the continuous core reinforced filament may be formed by combining a resin matrix and a solid continuous core in a heated extrusion nozzle. The resin matrix and the solid continuous core are able to be combined without the formation of voids along the interface due to the ease with which the resin wets the continuous perimeter of the solid core as compared to the multiple interfaces in a multistrand core. Therefore, such an embodiment may be of particular use where it is desirable to alter the properties of the deposited material.

Figure 2B:
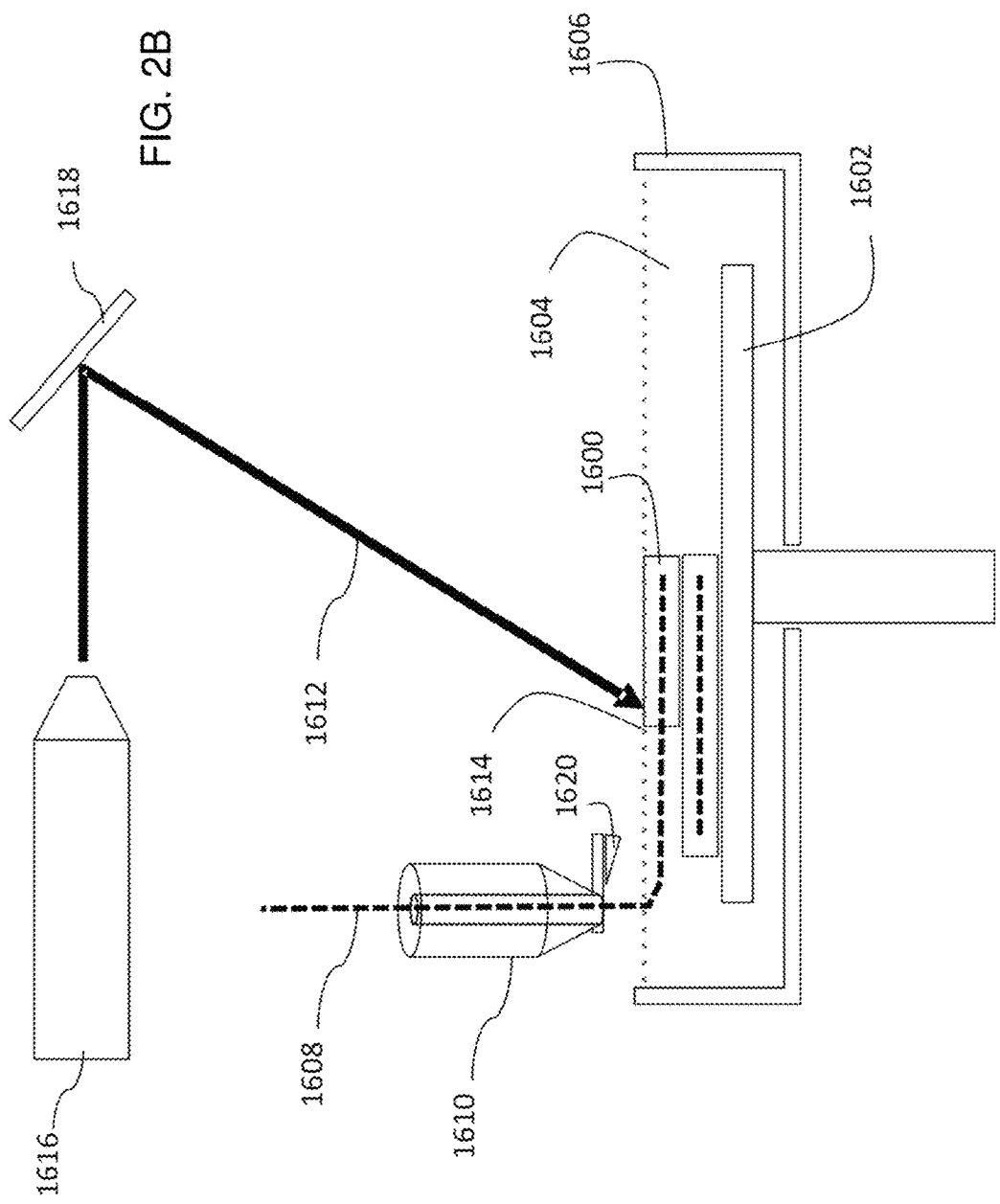

FIGS. 2A and 2B depict a hybrid system employing stereolithography (and/or selective laser sintering) to provide the matrix about the embedded fiber, i.e. processes in which a continuous resin in liquid or powder form is solidified layer by layer by sweeping a focused radiation curing or melting beam (laser, UV) in desired layer configurations. In order to provide increased strength as well as the functionalities associated with different types of continuous core filaments including both solid and multistrand materials, the stereolithography process associated with the deposition of each layer can be modified into a two-step process that enables construction of composite components including continuous core filaments in desired locations and directions. A continuous core or fiber may be deposited in a desired location and direction within a layer to be printed, either completely or partially submerged in the resin. After the continuous fiber is deposited in the desired location and direction, the adjoining resin is cured to harden around the fiber. This may either be done as the continuous fiber is deposited, or it may be done after the continuous fiber has been deposited. In one embodiment, the entire layer is printed with a single continuous fiber without the need to cut the continuous fiber. In other embodiments, reinforcing fibers may be provided in different sections of the printed layer with different orientations. In order to facilitate depositing the continuous fiber in multiple locations and directions, the continuous fiber may be terminated using a cutter as described herein, or by the laser that is used to harden the resin.

FIG. 2B depicts a part 1600 being built on a platen 1602 using stereolithography or selective layer sintering. The part 1600 is immersed in a liquid resin (photopolymer) material or powder bed 1604 contained in a tray 1606. During formation of the part 1600, the platen 1602 is moved by a layer thickness to sequentially lower after the formation of each layer to keep the part 1600 submerged. During the formation of each layer, a continuous core filament 1608 is fed through a conduit nozzle 1610 and deposited onto the part 1600. The conduit nozzle 1610 is controlled to deposit the continuous core filament 1608 in a desired location as well as a desired direction within the layer being formed. The feed rate of the continuous core filament 1608 may be equal to the speed of the conduit nozzle 1610 to avoid disturbing the already deposited continuous core filaments. As the continuous core filament 1608 is deposited, appropriate electromagnetic radiation (e.g., laser 1612) cures or sinters the resin surrounding the continuous core filament 1608 in a location 1614 behind the path of travel of the conduit nozzle 1610. The distance between the location 1614 and the conduit nozzle 1610 may be selected to allow the continuous core filament to be completely submerged within the liquid resin or powder prior to curing. The laser is generated by a source 1616 and is directed by a controllable mirror 1618. The three dimensional printer also includes a cutter 1620 to enable the termination of the continuous core filament as noted above.

Figure 2C:
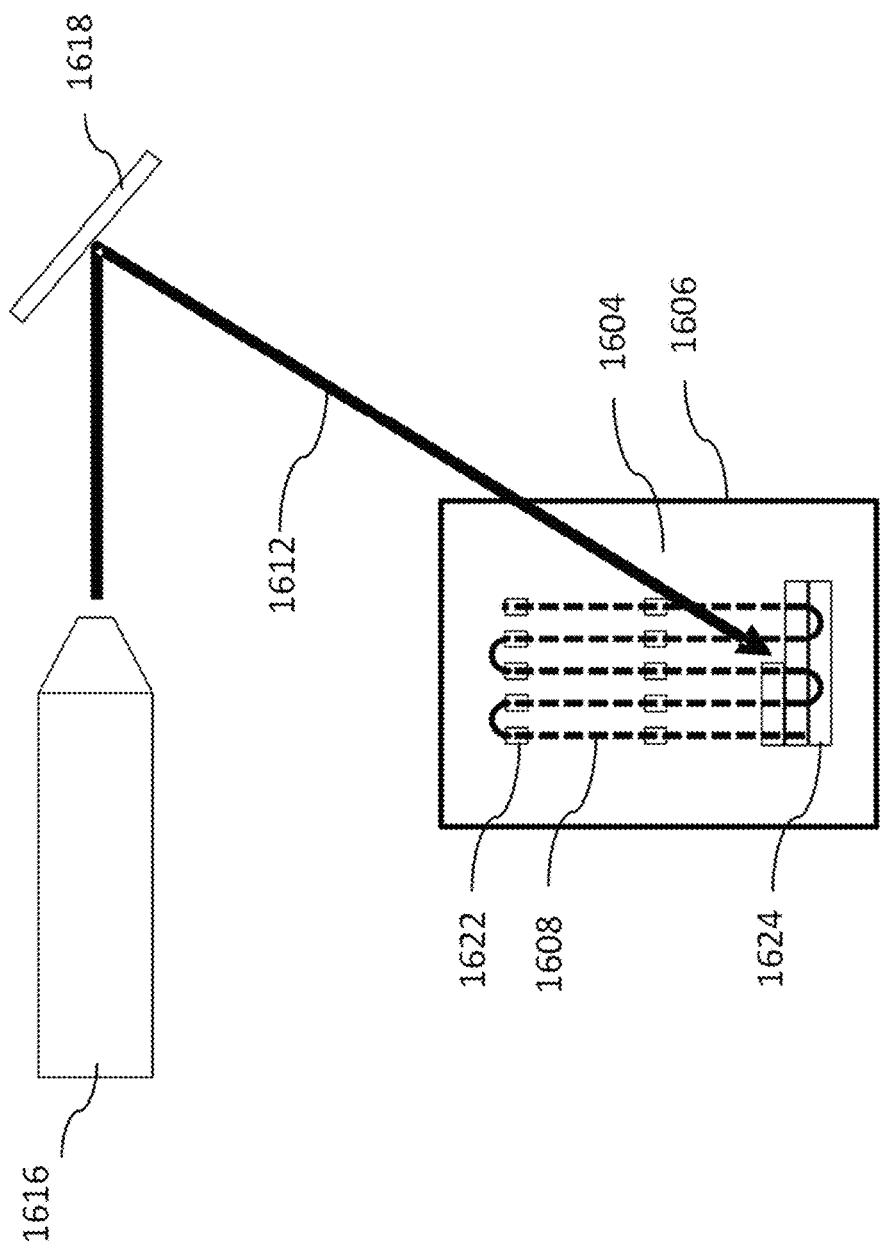

Optionally, the deposited filament is held in place by one or more "tacks", which are a sufficient amount of hardened resin material that holds the continuous core filament in position while additional core material is deposited. As depicted in FIG. 2C, the continuous core filament 1608 is tacked in place at multiple discrete points 1622 by the laser

1612 as the continuous core filament is deposited by a nozzle, not depicted. After depositing a portion, or all, of the continuous core filament 1608, the laser 1612 is directed along a predetermined pattern to cure the liquid resin material 1604 and form the current layer. Similar to the above system, appropriate electromagnetic radiation (e.g., laser 1612), is generated by a source 1616 and directed by a controllable mirror 1618. The balance of the material can be cured to maximize cross linking between adjacent strands is maximized, e.g., when a sufficient number of strands has been deposited onto a layer and tacked in place, the resin may be cured in beads that are perpendicular to the direction of the deposited strands of continuous core filament. Curing the resin in a direction perpendicular to the deposited strands may provide increased bonding between adjacent strands to improve the part strength in a direction perpendicular to the direction of the deposited strands of continuous core filament. If separate portions of the layer include strands of continuous core filament oriented in different directions, the cure pattern may include lines that are perpendicular or parallel to the direction of the strands of continuous fibers core material in each portion of the layer.

Figure 2D:
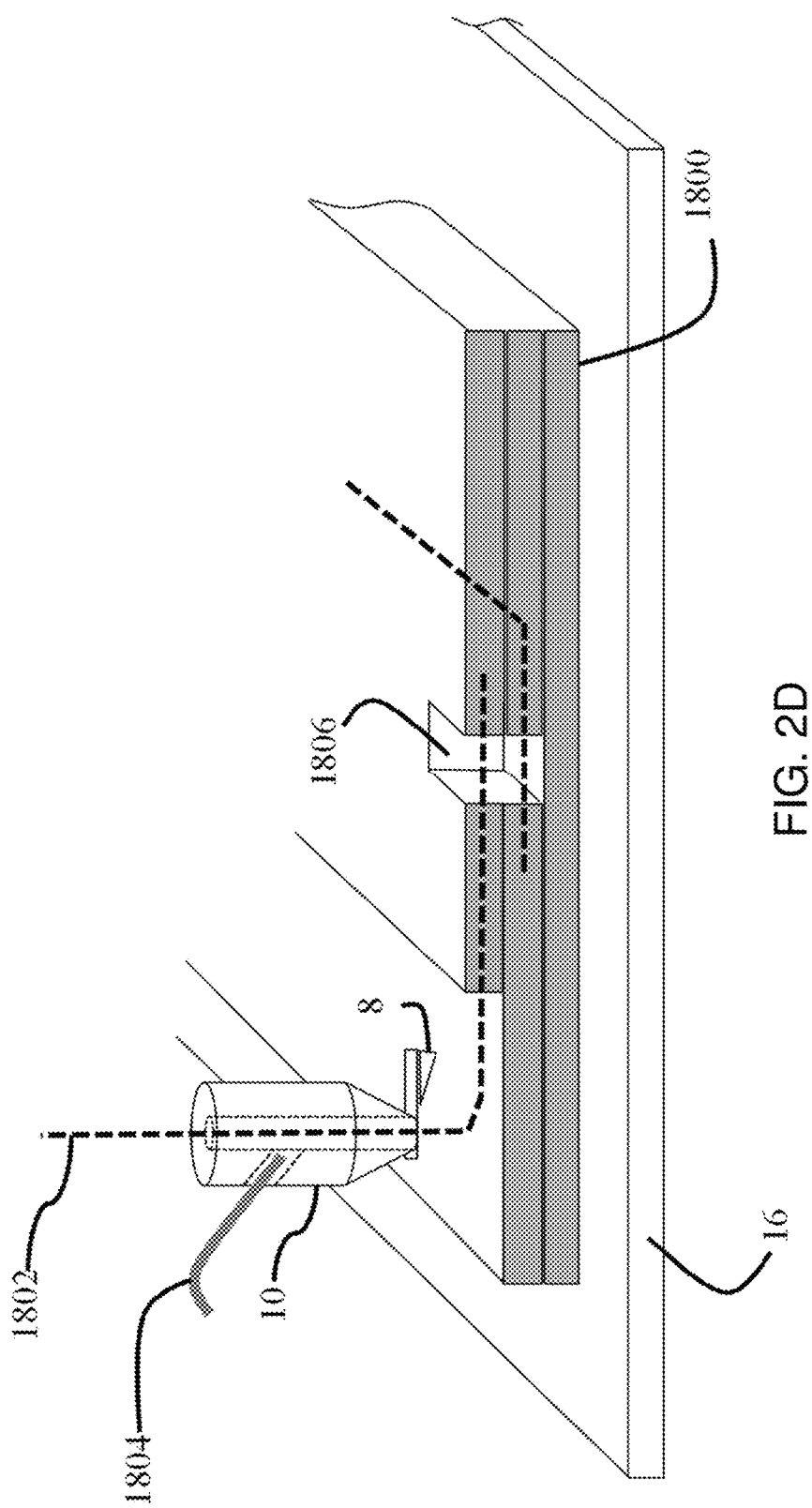
FIG. 2D is a schematic representation of a three dimensional printing system being used to form multiple layers in a printed circuit board, which may be embedded in a reinforced molding as disclosed herein.

FIG. 2D depicts printing of a multi-layer PCB 1800, on a build platen 16. The PCB 1800 is formed with a conductive core material 1802 and an insulating material 1804 which are deposited using a printer head including a heated extrusion nozzle 10 and cutting mechanism 8. Similar to the multielement printer head, the conductive core material 1802 and insulating material 1804 may be selectively deposited either individually or together. Further, in some embodiments the conductive core material 1802 is solid to minimize the formation of voids in the deposited composite material. When the conductive core material 1802 is printed without the insulating material 1804 a void 1806 can be formed to enable the subsequent formation of vias for use in connecting multiple layers within the PCB 1800. Depending on the desired application, the void 1806 may or may not be associated with one or more traces made from the conductive core material 1802.

Figure 2E:
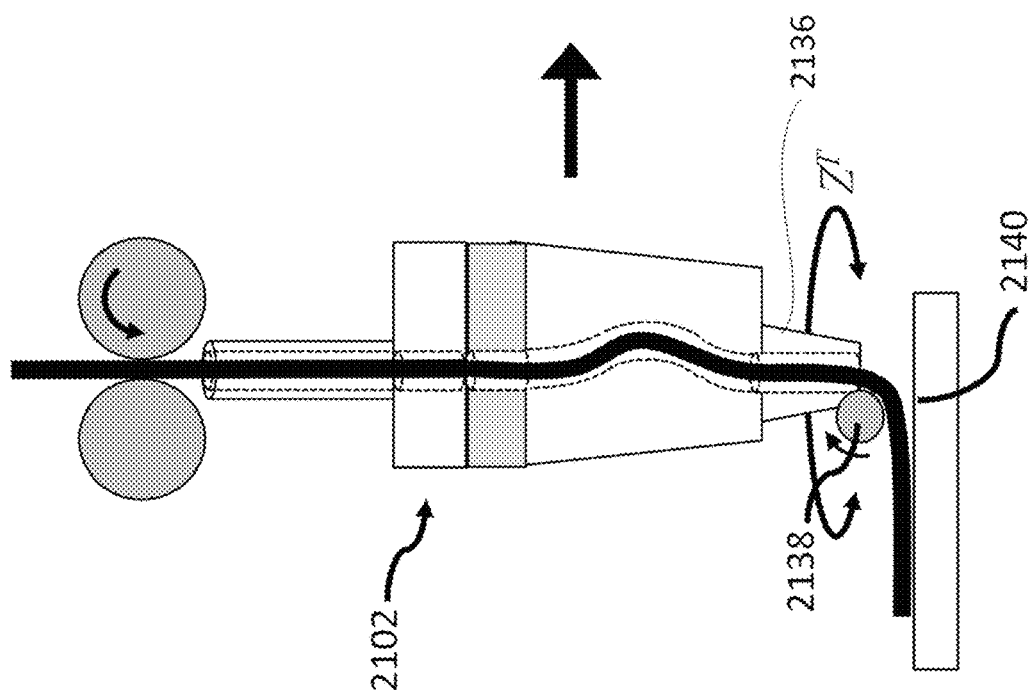
FIG. 2E is a schematic representation of a rotatable printing nozzle including a following feeding and compression roller.

When desirable, a precision roller set can be used to maintain a constant thickness along a relatively wider width of material output from a print head 2102. Such an embodiment may be of use when dealing with wider materials such as flat towpregs. FIG. 2E shows a print head 2102 translating in a first direction. A nozzle 2136 of the print head is attached to a trailing compression roller 2138. The roller 2138 imparts a compressive force to the material deposited onto print bed 2140. Depending on the embodiment, the trailing roller 2138 can articulate around the Z axis using any number of different mechanisms. For example, in one embodiment, the print head 2102 is free-rotating on a bearing (e.g., adding a fourth degree of freedom), such that the roller always trails the direction of travel of the print head. In another embodiment, the entire print head 402 is constructed to rotate (e.g., adding a fourth degree of freedom). Alternatively or in addition, the print bed 2140 may be rotated (e.g., as a fourth or fifth degree of freedom) to achieve the desired trailing and displacement.

Figure 2F:
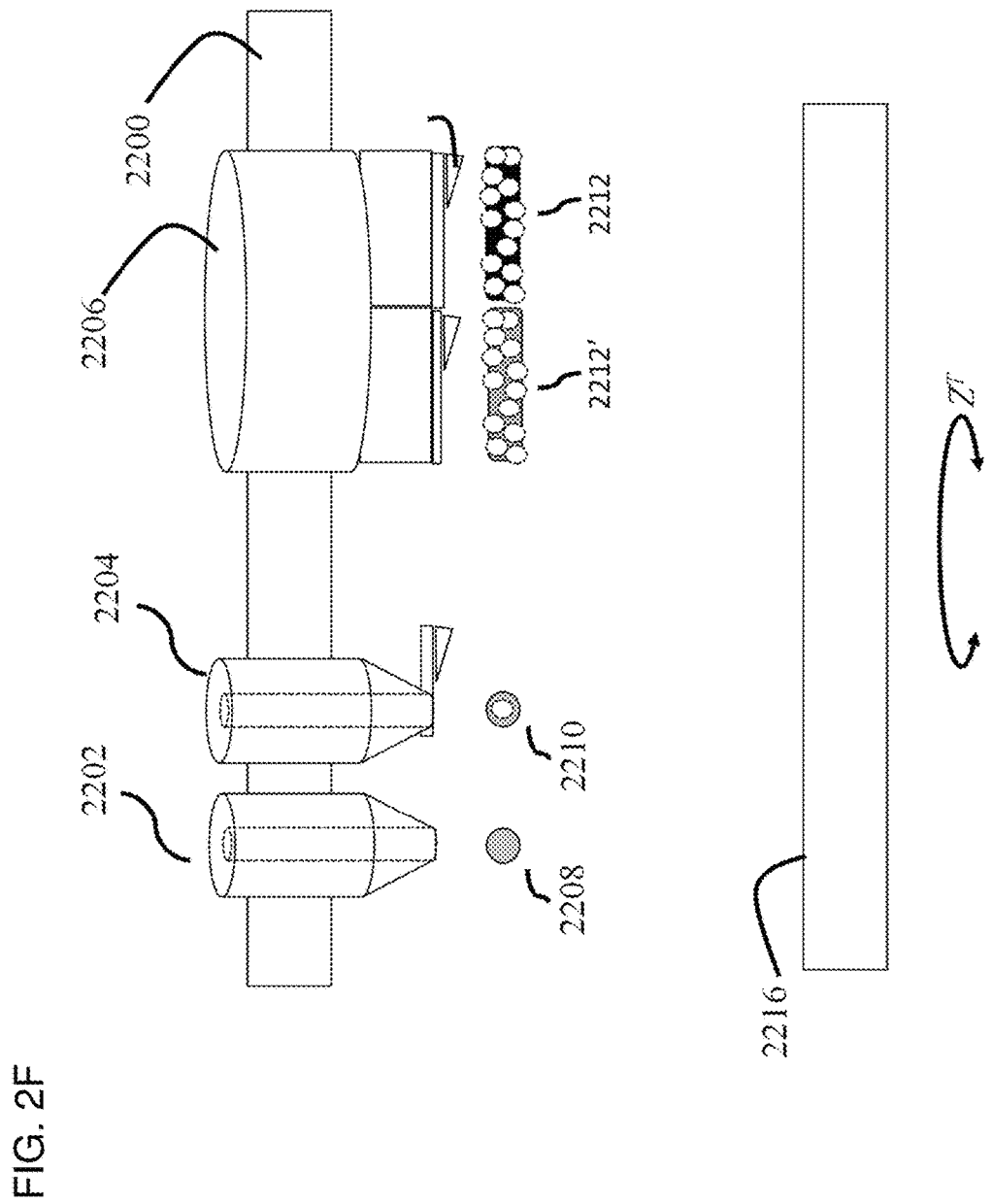
FIG. 2F is a schematic representation of a multi-nozzle three-dimensional printer.

FIG. 2F shows one embodiment of a high-speed continuous core printer capable of using the above described materials. In the depicted embodiment, the printer includes a print arm 2200 including a plurality of nozzles. The nozzles include a pure resin nozzle 2202 adapted to print pure resin (e.g., as fill material) 2208. The print arm 2200 also includes a continuous core filament nozzle 2204 adapted to print a continuous core filament 2210 for use in fine detail work. Additionally, the print arm 2200 includes a tape dispensing head 2206 capable of printing one or more printable tapes 2212. The tape dispensing head enables large infill sections to be printed quickly using the noted printable tapes. However, fine detail work and gaps that cannot be filled in by the tape can be filled by either the pure resin nozzle 2202 or continuous core filament nozzle 2204. The above noted method and system using wide tape fills greatly improves the speed of a printer, enabling higher throughput, and commensurately lower cost.

In FIG. 2G, a (e.g., robot arm) print arm 1400 is capable of attaching to printer head 1402 at a universal connection 1404. A continuous core reinforced filament 1406 may be fed into the printer head 1402 before or after attachment to the printer 1400. The print arm 1400 may return the printer head 1402 to an associated holder or turret and then pick up printer head 1408 or 1410 for printing filament and other consumables different in size, material, color, coating, and/or spray; or even a vision system 1412 (e.g., camera, rangefinder) for part inspection.

Figure 2H:
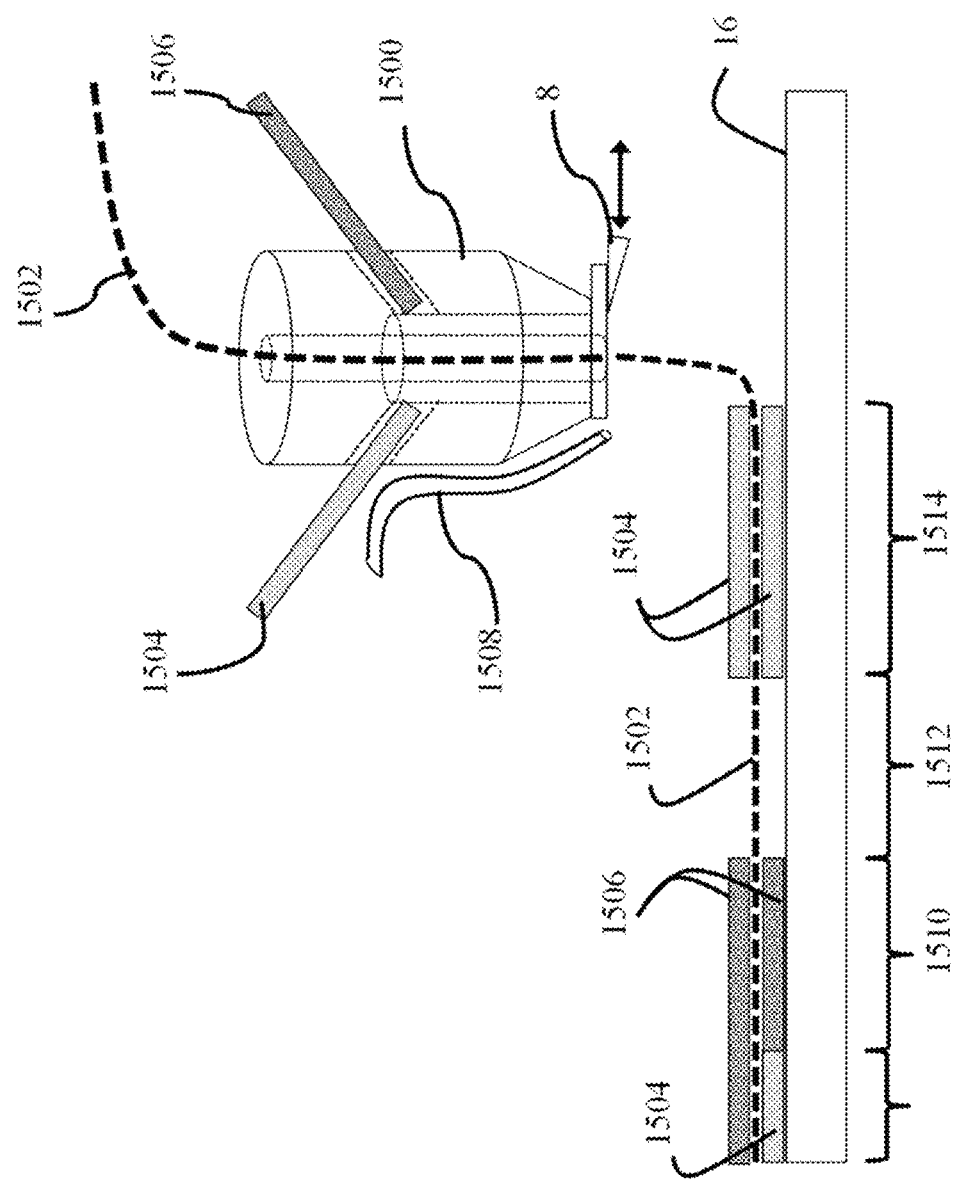
FIG. 2H is a schematic representation of a multi-element printer head for use in the printing system.

The continuous core reinforced filament may be formed by adding a resin matrix or coating to a solid continuous core or a prepreg in a heated conduit or extrusion nozzle. FIG. 2H depicts a multi-element printer head 1500 that selectively combines (in any feasible combination) and extrudes material feed options core 1502 (e.g., continuous copper wire, continuous fiber, stranded prepreg wire or fiber), matrix 1504 (e.g., binding resin such as nylon), and support 1506 (e.g., a dissolvable support material). For example, a core 1502 might be surrounded by a matrix binder 1504 on the bottom surface and a dissolvable/soluble support 1506 on the top surface (e.g., section 1508). The multi-element printer head 1500 may also deposit the core 1502 coated with either the matrix binder 1504 or soluble support 1506 separately (e.g., sections 1510 and 1514), or e.g., deposit any of the materials individually (e.g., the bare core or copper wire at section 1512).

As shown in FIG. 2H, multi-element printer head 1500 (or any other print head embodiment depicted herein) may include an air nozzle 1508 which enables pre-heating of the print area and/or rapid cooling of the extruded material to aid in forming structures such as flying leads, gap bridging, and other similar features. For example, a conductive core material may be deposited by the multi-element printer head 1500 with a co-extruded insulating plastic, to form a trace in the printed part. The end of the trace may then be terminated as a flying lead (the multi-element printer head lifts and deposits the core and jacket), optionally cooling the insulating jacket with the air nozzle 1508. The end of the wire could then be printed as a "stripped wire" where the conductive core is extruded without the insulating jacket. The cutting mechanism 8 may then terminate the conductive core. Formation of a flying, uninsulated lead in the above-noted manner may be used to eliminate a later stripping step.

Figure 1D:
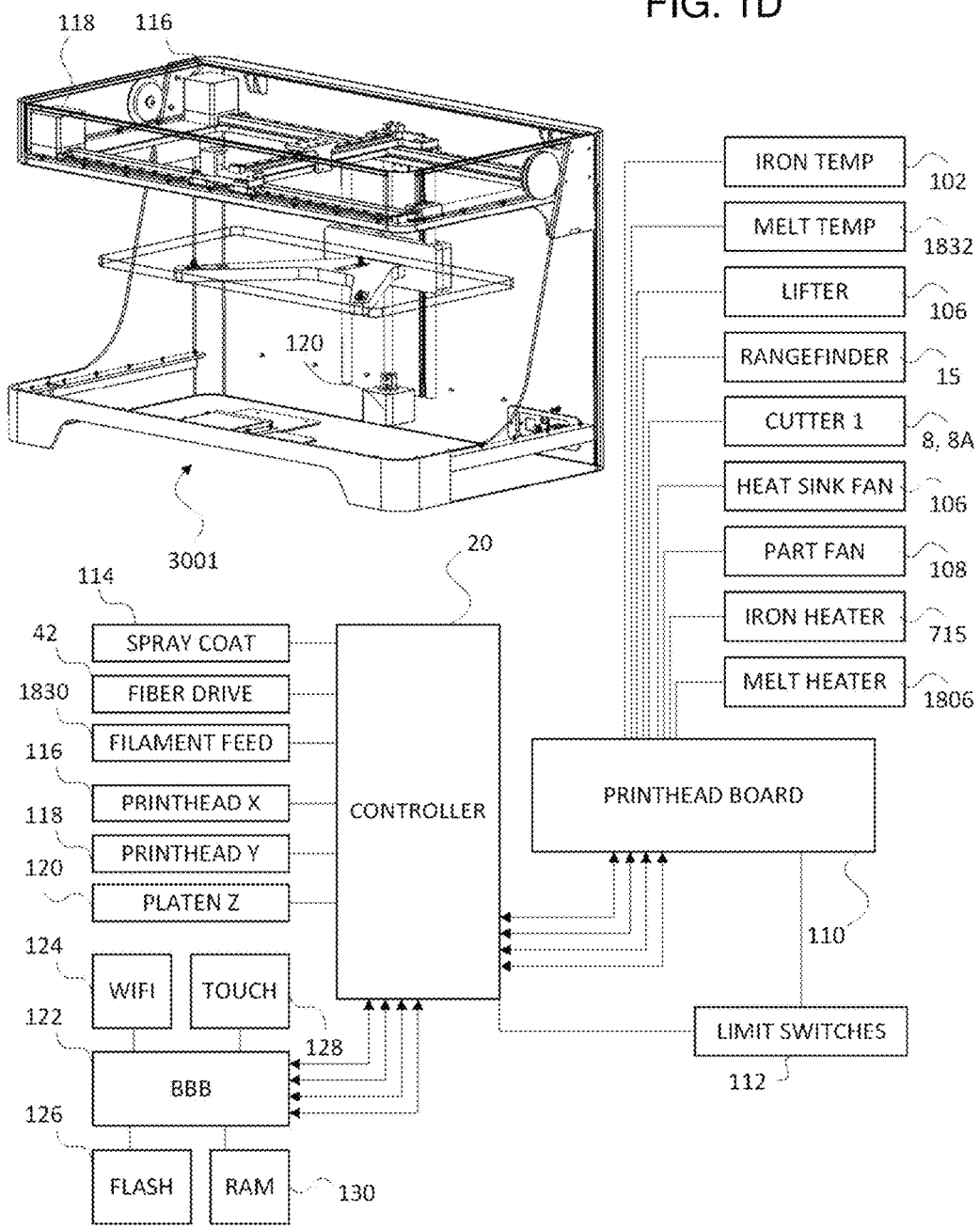
FIG. 1D is a block diagram and schematic representation of a three dimensional printer as discussed herein, applicable to all embodiments.

FIG. 1D depicts a block diagram and control system of the three dimensional printer which controls the mechanisms, sensors, and actuators therein, and executes instructions to perform the control profiles depicted in and processes described herein. A printer is depicted in schematic form to show possible configurations of e.g., three commanded motors 116, 118, and 120. It should be noted that this printer may include the compound assembly of printheads 199, 1800 depicted in FIG. 1C.

As depicted in FIG. 1D, the three-dimensional printer 3001 includes a controller 20 which is operatively connected to the fiber head heater 715, the fiber filament drive 42 and the plurality of actuators 116, 118, 120, wherein the controller 20 executes instructions which cause the filament drive to deposit and/or compress fiber into the part. The instructions are held in flash memory and executed in RAM (not shown; may be embedded in the controller 20). An actuator 114 for applying a spray coat, as discussed herein, may also be connected to the controller 20. In addition to the fiber drive 42, a filament feed 1830 be controlled by the controller to supply the extrusion printhead 1800. A printhead board 110, optionally mounted on the compound printhead 199, 1800 and moving therewith and connected to the main controller 20 via ribbon cable, breaks out certain inputs and outputs. The temperature of the ironing tip 726 may be monitored by the controller 20 by a thermistor or thermocouple 102; and the temperature of the heater block holding nozzle 1802 of any companion extrusion printhead 1800 may be measured by a thermistor or thermocouple 1832. A heater 715 for heating the ironing tip 726 and a heater 1806 for heating the extrusion nozzle 1802 are controlled by the controller 20. A heat sink fan 106 and a part fan 108, each for cooling, may be shared between the printheads 199, 1800 and controlled by the controller 20. Rangefinder 15 is also monitored by the controller 20. The cutter 8 actuator, which may be a servomotor, a solenoid, or equivalent, is also operatively connected. A lifter motor for lifting one or either printhead 199, 1800 away from the part (e.g., to control dripping) may also be controlled. Limit switches 112 for detecting when the actuators 116, 118, 120 have reached the end of their proper travel range are also monitored by the controller 20.

As depicted in FIG. 1D, an additional breakout board 122, which may include a separate microcontroller, provides user interface and connectivity to the controller 20. An 802.11 Wi-Fi transceiver connects the controller to a local wireless network and to the Internet at large and sends and receives remote inputs, commands, and control parameters. A touch screen display panel 128 provides user feedback and accepts inputs, commands, and control parameters from the user. Flash memory 126 and RAM 130 store programs and active instructions for the user interface microcontroller and the controller 20.

Figure 3:
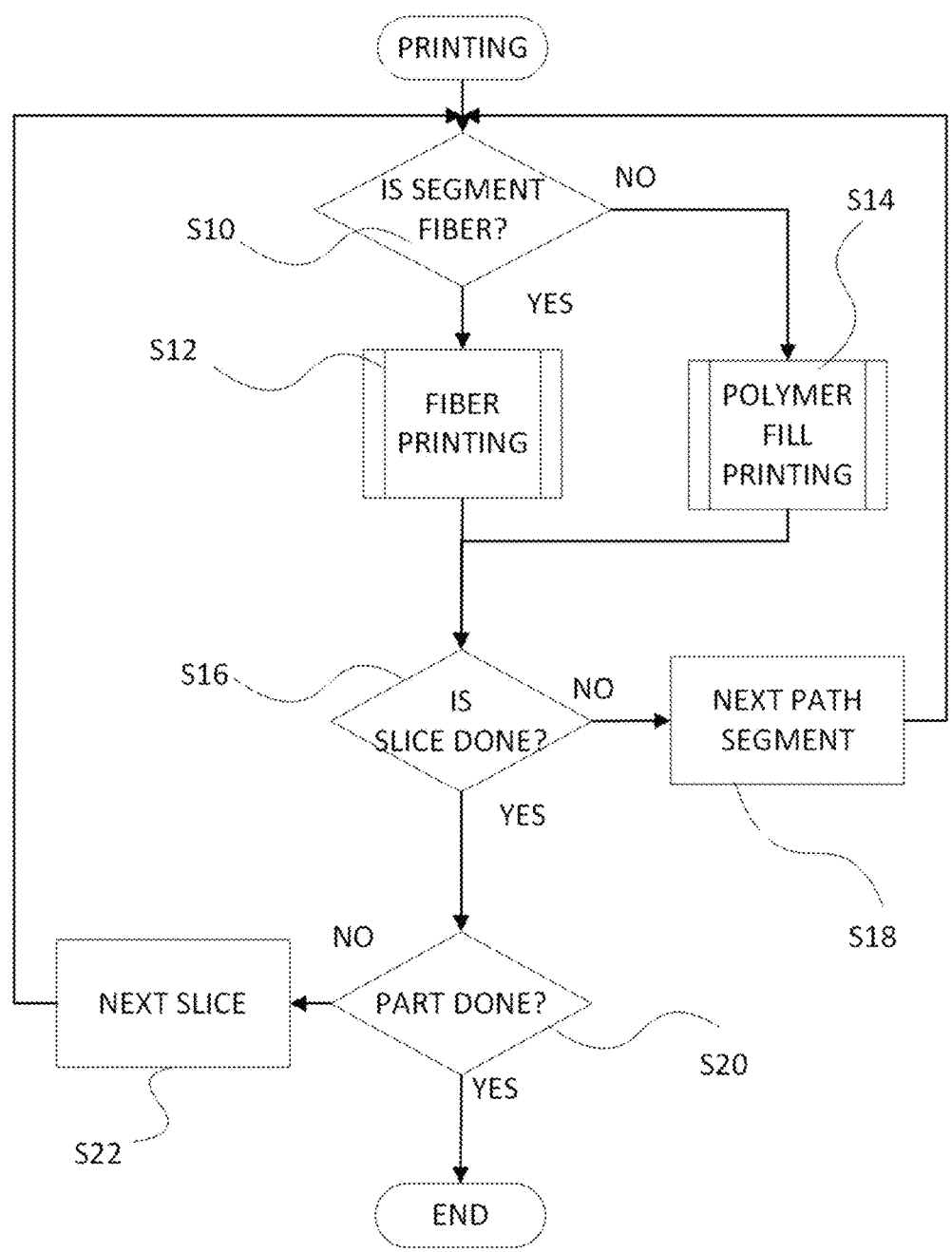
FIG. 3 is a flow chart describing the overall operation of the 3D printer of FIG. 3.

FIG. 3 depicts a flowchart showing a printing operation of the printers 1000 in FIGS. 1-2. FIG. 3 describes, as a coupled functionality, control routines that may be carried out to alternately and in combination use the co-mounted FFF extrusion head 1800 and fiber reinforced filament printing head 199 of FIG. 1A-1D.

In FIG. 3, at the initiation of printing, the controller 20 determines in step S10 whether the next segment to be printed is a fiber segment or not, and routes the process to S12 in the case of a fiber filament segment to be printed and to step S14 in the case of other segments, including e.g., base, fill, or coatings. After each or either of routines S12 and S14 have completed a segment, the routine of FIG. 3 checks for slice completion at step S16, and if segments remain within the slice, increments to the next planned segment and continues the determination and printing of fiber segments and/or non-fiber segments at step S18. Similarly, after slice completion at step S16, if slices remain at step S20, the routine increments at step S22 to the next planned slice and continues the determination and printing of fiber segments and/or non-fiber segments. "Segment" as used herein corresponds to "toolpath" and "trajectory", and means a linear row, road, or rank having a beginning and an end, which may be open or closed, a line, a loop, curved, straight, etc. A segment begins when a printhead begins a continuous deposit of material, and terminates when the printhead stops depositing. A "slice" is a single layer or lamina to be printed in the 3D printer, and a slice may include one segment, many segments, lattice fill of cells, different materials, and/or a combination of fiber-embedded filament segments and pure polymer segments. A "part" includes a plurality of slices to build up the part. FIG. 3's control routine permits dual-mode printing with two different printheads, including the compound printheads 199, 1800 of FIG. 1A-1D.

All of the printed structures previously discussed may be embedded within a molded article during a molding process, as discussed herein, expressly including reinforced fiber structures of any kind, sparse, dense, concentric, quasi-isotropic or otherwise as well as fill material or plain resin structures. In addition, in all cases discussed with respect to embedding in injection molding, structures printed by fill material head 18 using thermoplastic extrusion deposition may be in each case replaced with soluble material (e.g., soluble thermoplastic or salt) to form a soluble preform which may form a printing substrate for fiber reinforcement and then removed, leaving a continuous fiber reinforced preform. All continuous fiber structures discussed herein, e.g., sandwich panels, shells, walls, reinforcement surrounding holes or features, etc., may be part of a continuous fiber reinforced preform.

That is, the present disclosure contemplates a method of fabricating a reinforced molding, where a "molding" is used as a noun and a reinforced molding comprises a molded, finished article with a skeletal or dense internal reinforcement formed by a continuous fiber structure. Using the 3D printer herein discussed with reference to FIGS. 1-3 inclusive, which may deposit either fill material, soluble material, or continuous fiber, the reinforcing fiber is additively deposited in a reinforcement volume to form a continuous fiber reinforcement preform. A preform may be a substrate against which further layers of 3D printing are deposited (fill material, soluble material, or continuous fiber) or a shape to be embedded within a molded article, or both. For example, a continuous fiber reinforcement preform is located within a mold of a molding apparatus (such as an injection mold's internal cavity, large enough and shaped appropriately to receive the reinforcement preform). The mold is loaded (e.g., injected or otherwise filled) with molten, flowable and/or optionally substantially isotropic molding material (e.g., thermoplastic, curable plastic, thermoset, metal, or the like, optionally including chopped fibers or dispersed particulates). Injection under heat and pressure of fluidized thermoplastic is "loading". The molding material is hardened (e.g., cooled or cured) to overmold the continuous fiber reinforcement preform with the molding material, thereby forming a reinforced molding surrounding an internal continuous fiber reinforcement preform with a hardened substantially isotropic molding material. The reinforcement volume is smaller than a volume of the entire reinforced molding.

Figure 13:
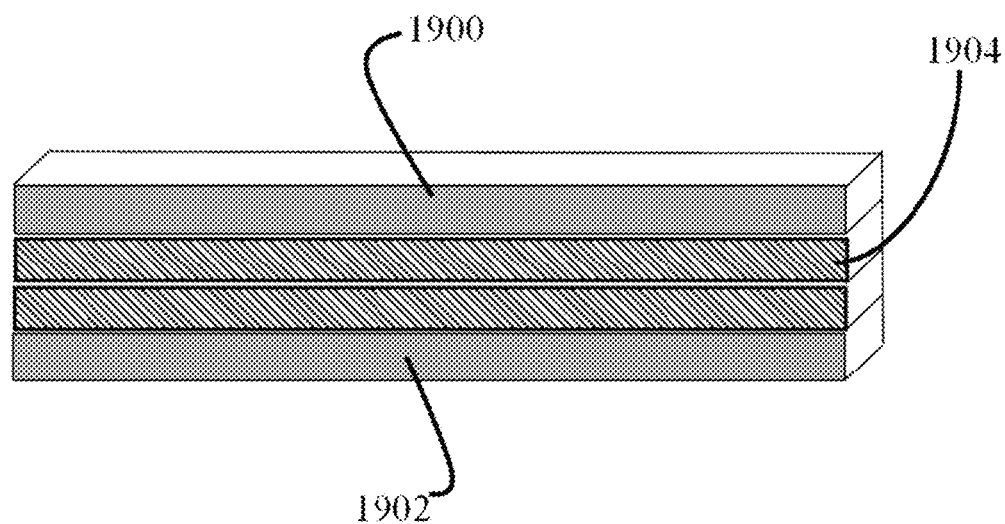
FIG. 13 is a schematic representation of a composite part formed using three-dimensional printing methods.

For example, a schematic representation of a composite structure is depicted in FIG. 13 which shows a sandwich panel composite part. This sandwich panel composite part may form part of or the entirety of a continuous fiber reinforcement preform that is later embedded in a molded article (reinforced molding). The top section 1900, and bottom section 1902, are printed using a continuous core reinforced filament to form relatively solid portions. In contrast, the middle section 1904 may be printed such that it has different properties than the top section 1900 and the bottom section 1902. The middle section 1904 may be printed either as fill material (to be retained within the reinforced molding), soluble material or a soluble preform (to be dissolved away before or during overmolding of the sandwich panel structure within the mold) or as fiber honeycomb (again, to be retained within the reinforced molding). For example, the middle section 1904 may include multiple layers printed in a honeycomb pattern using a continuous core reinforced filament, a pure resin, or even a three dimensionally printed foaming material. This enables the production of a composite part including a lower density core using a three dimensional printer, and this part may be a skeletal or reinforcement structure for a reinforced molding.

Figure 14:
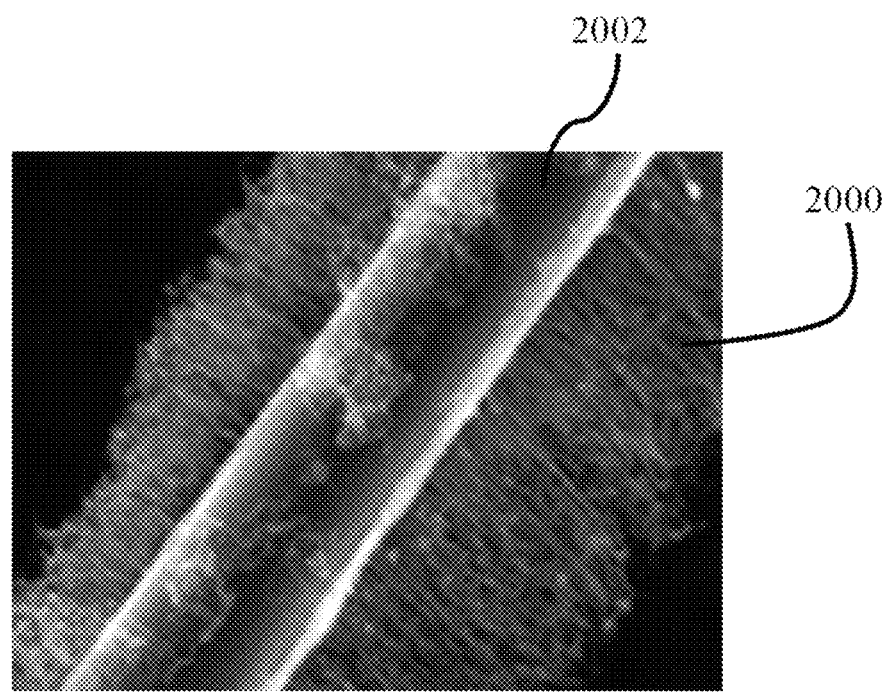
FIG. 14 is a scanning electron microscope image of a reinforcing carbon fiber and perpendicularly arranged carbon nanotubes.

In addition to using the continuous core reinforced filaments to form various composite structures with properties in desired directions using the fiber orientation, each of which may form part of the reinforcement preform and be embedded in a reinforced molding, in some embodiments it is desirable to provide additional strength in directions other than the fiber direction. For example, the continuous core reinforced filaments might include additional composite materials to enhance the overall strength of the material or a strength of the material in a direction other than the direction of the fiber core. For example, FIG. 14 shows a scanning electron microscope image of a carbon fiber core material 2000 that includes substantially perpendicularly loaded carbon nanotubes 2002. Loading substantially perpendicular small fiber members on the core increases the shear strength of the composite, and advantageously increases the strength of the resulting part in a direction substantially perpendicular to the fiber direction. Such an embodiment may help to reduce the propensity of a part to delaminate along a given layer.

Figure 4A:
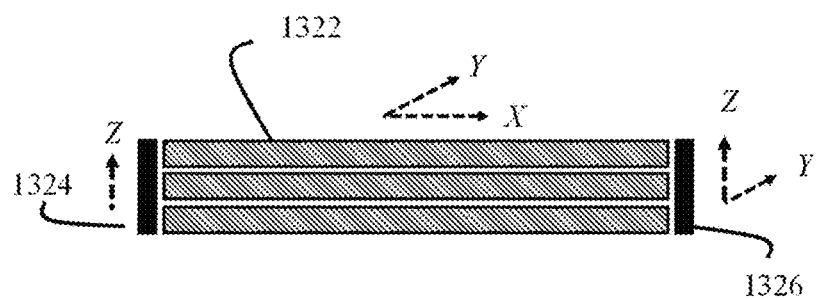
FIGS. 4A-4C show exemplary six-axis shell layup in contrasting directions.

FIGS. 4A-5L depict various parts formed using the printer head(s) depicted in FIGS. 1A-1D and/or 2A-2G. FIGS. 4A and 5B show a part including a plurality of sections 1322 deposited as two dimensional layers in the XY plane. These sections 1322 may be deposited as fill material 18 or as soluble material. If they are deposited as soluble material, they may form the soluble preform. Sections 1324 and 1326 are subsequently deposited in the ZY plane to give the part increased strength in the Z direction. As shown in FIGS. 4A and 5A, if sections 1322 are formed as the soluble preform or as soluble material and are dissolved away or removed prior to, during, or after overmolding and/or hardening the molding material to overmold OV1 the continuous fiber reinforcement preform, a fiber reinforced molding with an overmold OV1 surrounding an internal continuous fiber reinforcement preform is formed, the overmold OV1 being a hardened substantially isotropic molding material. In FIGS. 4A and 5A, a box-like or canister-like reinforced molding is formed with reinforcement concentrated along outer walls.

Figure 4B:
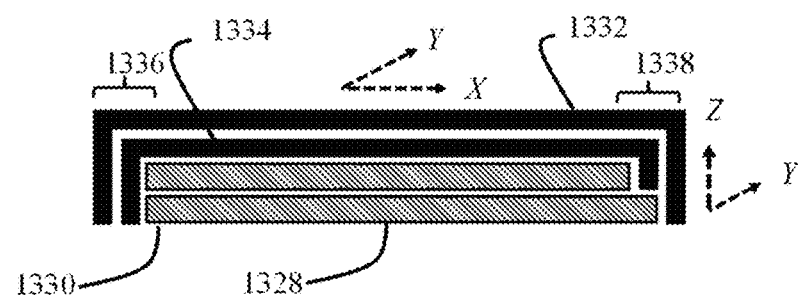

FIGS. 4B and 5B shows a related method of shell printing, where layers 1328 and 1330 are formed in the XY plane and are overlaid with shells 1332 and 1334 which extend in both the XY and ZY planes. As depicted in the figure, the shells 1332 and 1334 may either completely overlap the underlying core formed from layers 1328 and 1330, see portion 1336, or one or more of the shells may only overly a portion of the underlying core. For example, in portion 1338 shell 1332 overlies both layers 1328 and 1330. However, shell 1334 does not completely overlap the layer 1328 and creates a stepped construction as depicted in the figure. As shown in FIGS. 4B and 5B, if sections 1328 are formed as the soluble preform or as soluble material and are dissolved away or removed prior to, during, or after overmolding and/or hardening the molding material to overmold OV2 the continuous fiber reinforcement preform, a fiber reinforced molding with an overmold OV2 surrounding an internal continuous fiber reinforcement preform is formed, the overmold OV2 being a hardened substantially isotropic molding material. In FIGS. 4A and 5B, a shell-like, cup-like, or open box reinforced molding is formed, with reinforcement following the contour of the shell or walls of the cup or open box.

Figure 4C:
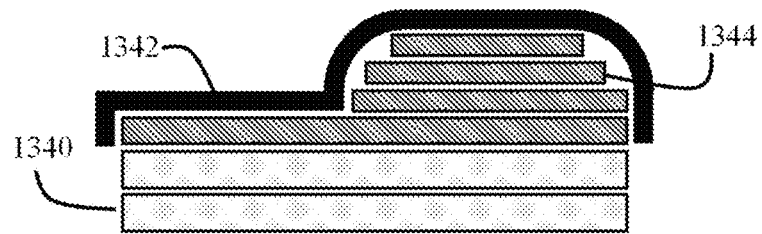
Figure 4D:
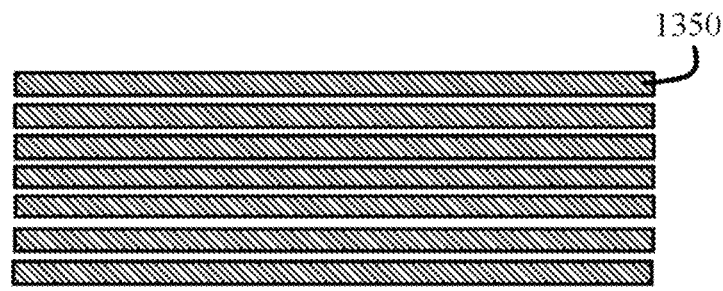
FIGS. 4D-4G show exemplary weighted distributions of 3D printed composite lay-up according to the present embodiments, e.g., to form sandwich panel structures, to increase effective moment of inertia.

FIGS. 4C and 5C show an alternative embodiment where a support material 1340 is added to raise the part relative to a build platen, or other supporting surface, such that the pivoting head of the three dimensional printer has clearance between the part and the supporting surface to enable the deposition of the shell 1342 onto the underlying layers 1344 of the part core. Again, as shown in FIGS. 4B, 4C and 5B, 5C if sections 1344 and/or 1340 are formed as the soluble preform or as soluble material and are dissolved away or removed prior to, during, or after overmolding and/or hardening the molding material to overmold OV3 the continuous fiber reinforcement preform, a fiber reinforced molding with an overmold OV3 surrounding an internal continuous fiber reinforcement preform is formed, the overmold OV3 being a hardened substantially isotropic molding material. In FIGS. 4C and 5C, a multi-level reinforced molding is formed, with both flat and curved shapes in multiple orientations, and reinforcement following the walls. It should be noted that any of the layers or shells of fiber reinforcement shown in FIG. 4A-4C or 5A-5C may be a multi-layer laminate of differing fiber orientations (e.g., a quasi-isotropic pattern or an anisotropic, directional pattern).

The above described printer head may also be used to form a part with discrete subsections including different orientations of a continuous core reinforced filament. The orientation of the continuous core reinforced filament in one subsection may be substantially in the XY direction, while the direction in another subsection may be in the XZ or YZ direction.

The path planning and printing processes may utilize a fill pattern that uses high-strength composite material in selected areas and filler material (e.g., less strong composite or pure resin such as nylon) in other locations, see FIGS. 4D-4G and 5E-5G, which depict stacks of layers in cross section. As discussed with reference to the sandwich panel global or region rule, in some cases, reinforcement is conducted by identifying an internal volume or volumes in the shape of simplified beams or panel, e.g., an interior prism or volume spanning and extending beyond bending load and/or support points. In addition, the part may be oriented during planning for deposition such that layers within the volume span the anticipated load and/or support points. Fiber may be fiber added within the interior prism volume remote from a centroid of a cross section of the volume, to increase effective moment of inertia (particularly for bending or compression loads). Fibers may be deposited in multiple adjacent bonded ranks and/or layers, to increase fiber rank interaction and reinforcement of neighbors (particularly for compression and tension loads). Through holes or mounts through which or into which load members are expected to be inserted may each be smoothly looped by fiber, optionally directly at the wall of such mount (particularly for tension and torsion loads, looping may permit fewer stress concentrations and the transmission of tension through smooth paths).

Especially for beam and panel bending, the strength to weight performance of a beam is optimized by placing fiber ranks as far as possible (i.e., at the farthest position both within the part and that does not violating any higher priority rules in effect at the boundary of the part) from the centroid of a cross-section to increase effective moment of inertia. A part formed completely from the fill material or soluble material 1350, and or a complete soluble preform, is contemplated.

Figure 4E:
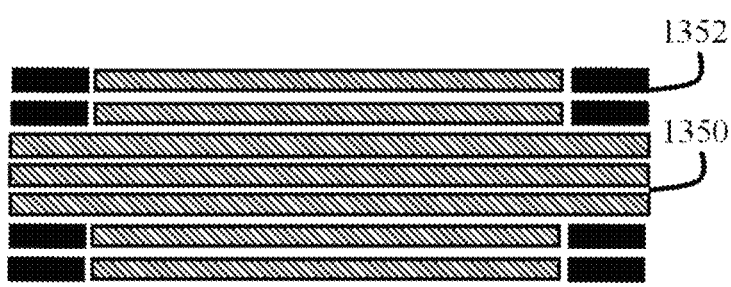
Figure 4F:
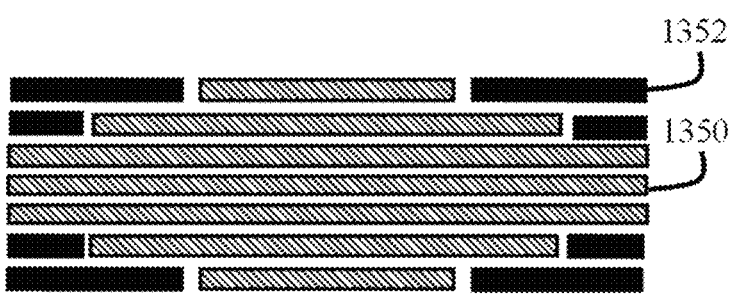
Figure 4G:
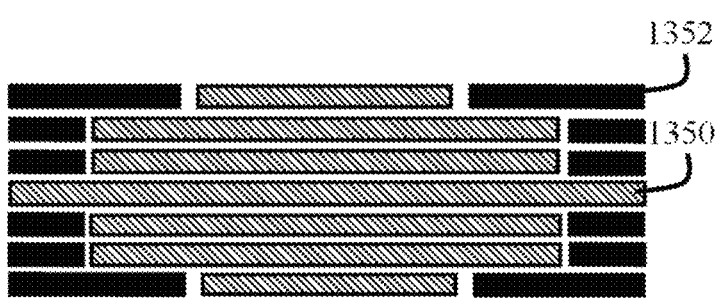
Figure 5D:
Figure 5E:
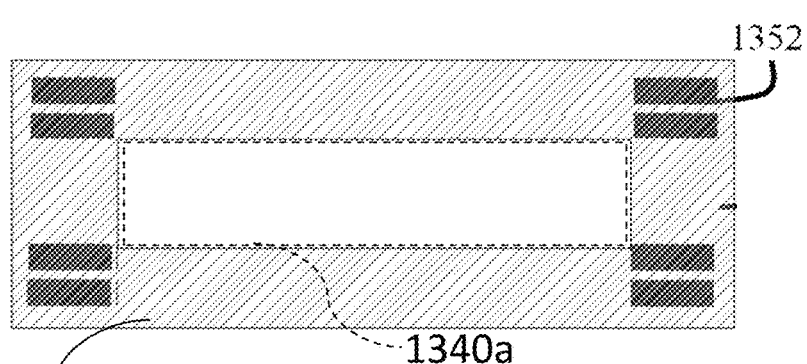
FIGS. 5E-5G show the structures of FIGS. 4E-4G in which the internal structures are additively deposited as soluble preforms instead of structural resin.
Figure 5F:
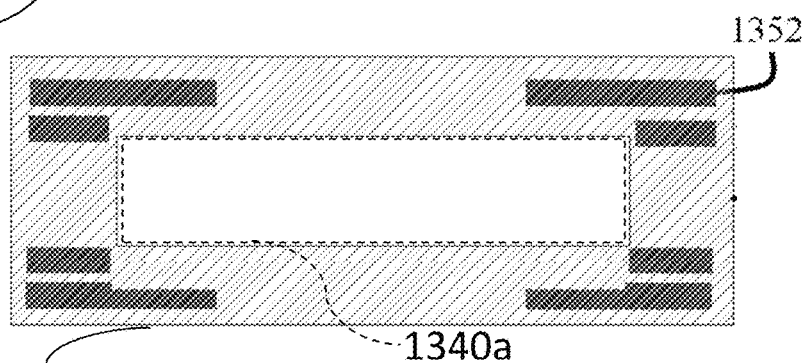
Figure 5G:
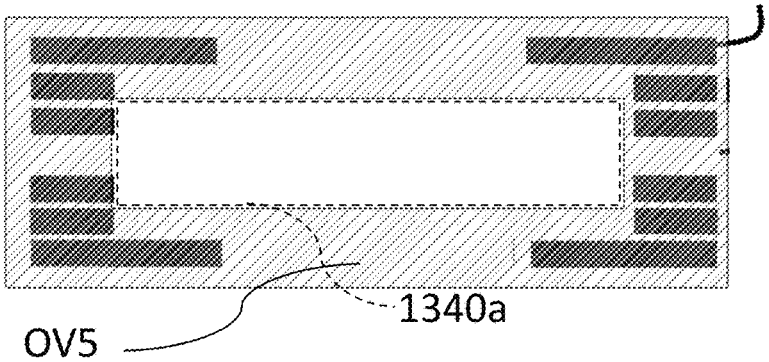

In FIGS. 4E and 5E, a composite material 1352 is deposited at the radially outward most portions of the part and extending inwards for a desired distance to provide a desired increase in stiffness and strength. The remaining portion of the part is formed with the fill material 1350. A user may extend the use of composite versus filler either more or less from the various corners of the part as illustrated by the series of figures FIGS. 4D-4G and 5E-5G. For example, a control algorithm controlled by controller 20 may use a concentric fill pattern that traces the outside corners and wall sections of the part, for a specified number of concentric infill passes, the remainder of the part may then be filled using a desired fill material. FIG. 5D shows a dissolved soluble preform 1340*a* (as a dotted line). As shown in FIGS. 4D-4F and 5D-5F, if fill material sections 1350 are instead formed as the soluble preform 1340*a* or as soluble material and are dissolved away or removed prior to, during, or after overmolding and/or hardening the molding material to overmold OV4-OV6 the continuous fiber reinforcement preform, a fiber reinforced molding with an overmold OV4-OV6 embedding an internal continuous fiber reinforcement preform is formed, the overmold OV4-OV6 being a hardened substantially isotropic molding material. In FIG. 4E-4G or 5E-5G, a box-like, canister-like, or tube-like reinforced molding is formed with reinforcement concentrated as described.

FIGS. 4H-4J and 5H-5J depict further parts formed using the printer head(s) depicted in FIGS. 1A-1D and/or 2A-2G.

Where FIGS. 4E through 4G or 5E through 5G do not expressly show outer walls of the part formed from fill material 1350 (e.g., the parts in FIGS. 4E-4G may have outer wall(s) of fill material 1350 or outer walls of composite material 1352), FIGS. 4H through 4J show cross sections of parts with the outer wall 1350-OW specifically shown.

Figure 5H:
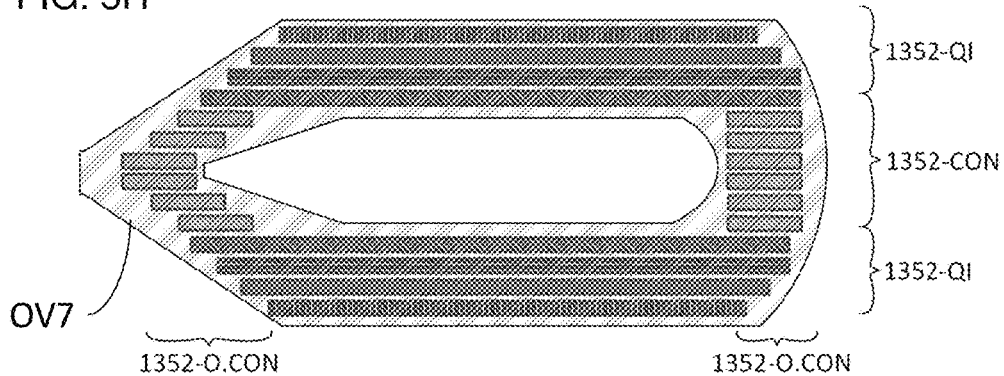
FIGS. 5H-5J show the structures of FIGS. 4H-4J in which some internal structures are additively deposited as soluble preforms instead of structural resin.
Figure 5I:
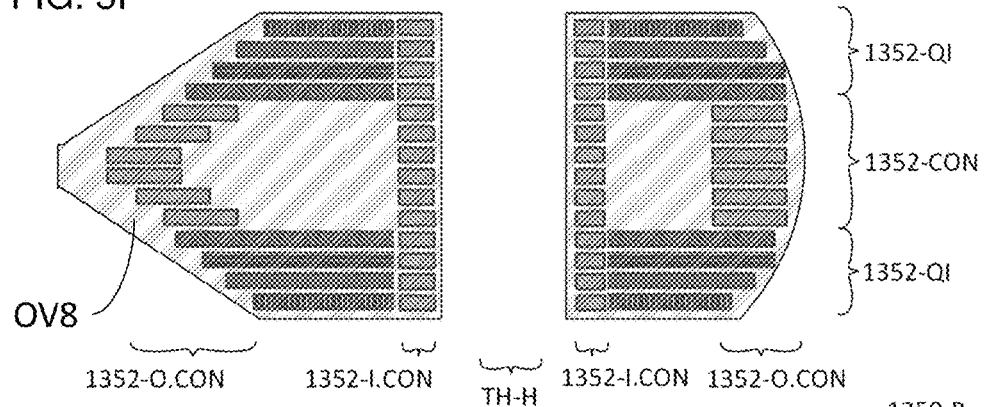
Figure 5J:
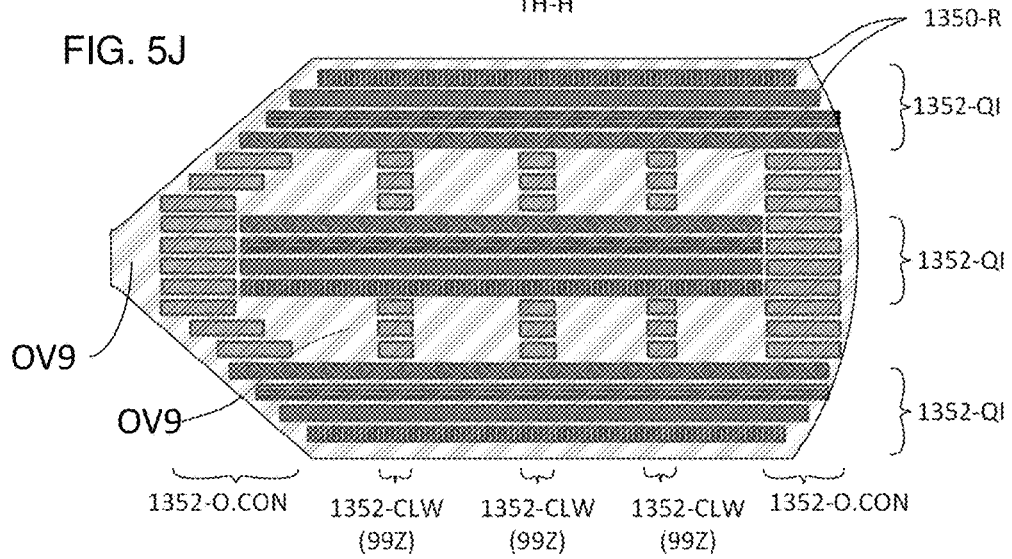

As shown by FIGS. 5H-5J, in the following description with reference to FIGS. 4H-4J, if the fill material 1350 is selectively or entirely replaced with soluble material or considered to form the soluble preform, the soluble material may be dissolved away prior to, during, or following overmolding of any of the fiber reinforcement structures shown in FIGS. 4H-4J and/or FIGS. 5H-5J. As depicted in FIG. 5H, following the removal of the material labeled 1350 as a soluble preform or as other soluble material, a hollow cored reinforcement molding is formed which an overmold OV7 of hardened isotropic material surrounds outer walls, floor, and ceiling of a continuous fiber reinforcement preform formed from the quasi-isotropic laminates 1352-QI and concentric laminates 1352-CON. As depicted in FIG. 4I or 5I, following the removal of the material labeled 1350 as a soluble preform or as other soluble material, a through-holed but otherwise solid cored reinforcement molding is formed which an overmold OV8 of hardened isotropic material surrounds inner walls of the through-hole TH-H, outer walls, floor, ceiling of a continuous fiber reinforcement preform formed from the quasi-isotropic laminates 1352-QI and concentric laminates 1352-CON. As depicted in FIG. 4J or 5J following the removal of the material labeled 1350 as a soluble preform or as other soluble material, a solid cored reinforcement molding is formed which an overmold OV9 of hardened isotropic material surrounds inner walls of the through-hole TH-H, outer walls, floor, ceiling of a continuous fiber reinforcement preform formed from multiple quasi-isotropic laminates 1352-QI and concentric laminates 1352-CON and bridging laminates 1352-CLW.

Specifically, in FIG. 4H or 5H, a part is built up from the lowest layer or down from the highest layer, depending on the printing type or approach. In FIG. 4H, an outer layer of fill material 1350 is formed by a floor layer of fill material 1350 (the outer layer may be 1-3 or more successive floor layers). As in FIGS. 4E-4G, an internal sandwich panel is built of composite material 1352, in this case as two quasi-isotropic sets 1352-QI separated by infill material 1350-IF. In this case, a quasi-isotropic set 1352-QI is formed by four parallel shells or layers of anisotropic fill or composite fiber swaths, in which the dominant direction of the fiber swaths is rotated by 45 degrees (in a known manner for quasi-isotropic laminates of four layers) between each layer (as noted herein, a quasi-isotropic set of layers or shells tends be composed of 3 or more layers, the layers together having a substantially isotropic stiffness behavior as a laminate). As discussed, the quasi-isotropic sets 1352-QI are deposited adjacent or proximate the top and bottom of the part to provide a higher moment of inertia and bending stiffness. The quasi-isotropic sets 1352-QI also provide twisting or torsion stiffness. As shown, in contrast to FIGS. 4E-4G, in FIG. 5H outer walls 1350-OW (including 1-3 or more beads of isotropic fill material) optionally surround the sets 1352-QI of quasi-isotropic layers so that the outer surface of the part is fill material 1352.

Figure 10A:
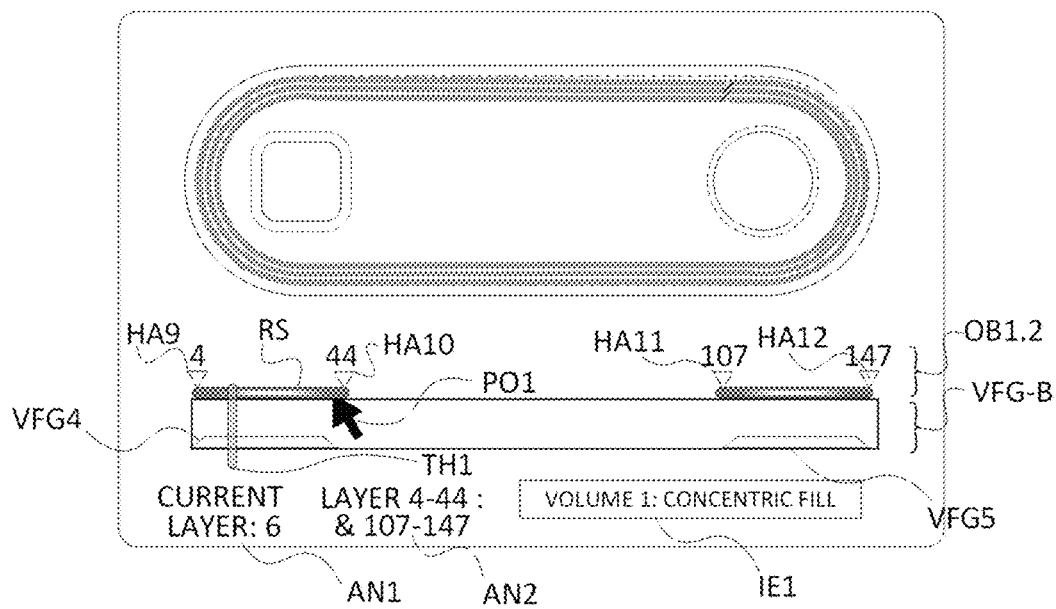
FIG. 10A-10C shows an exemplary on-screen part rendering and logic structure for the rule propagation procedure of FIG. 9.
Figure 10B:
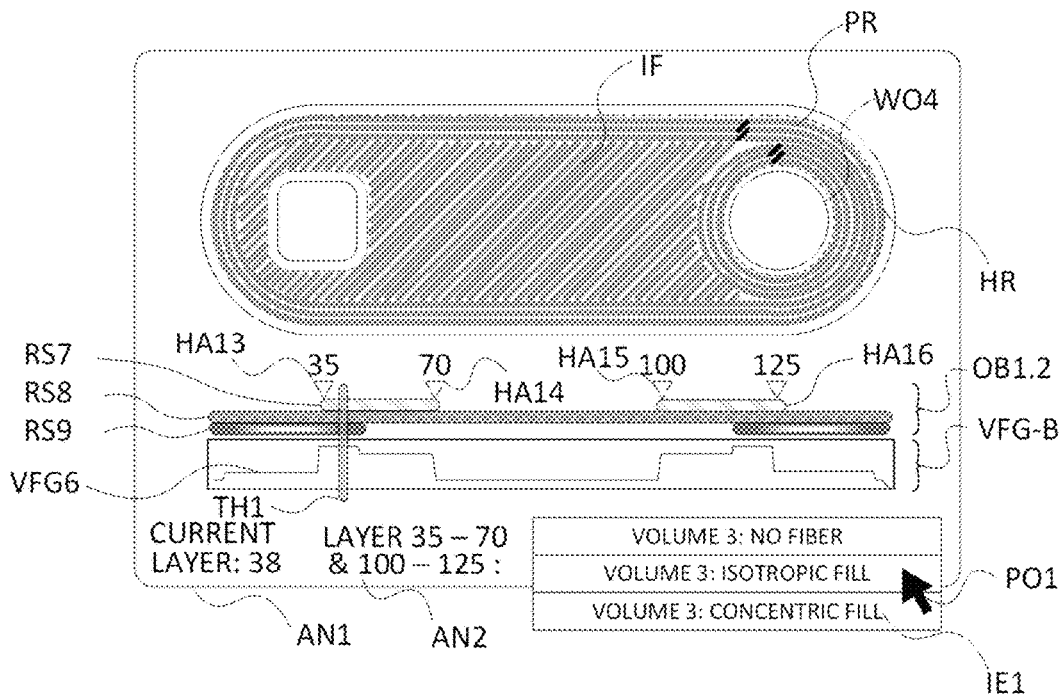
Figure 10C:
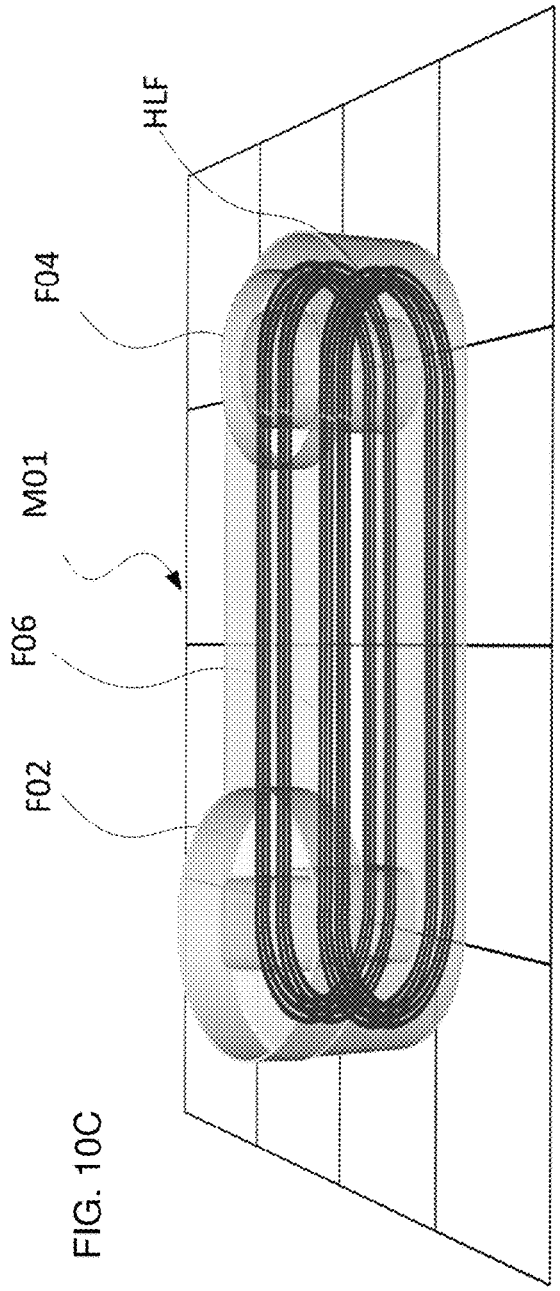
Figure 10C:
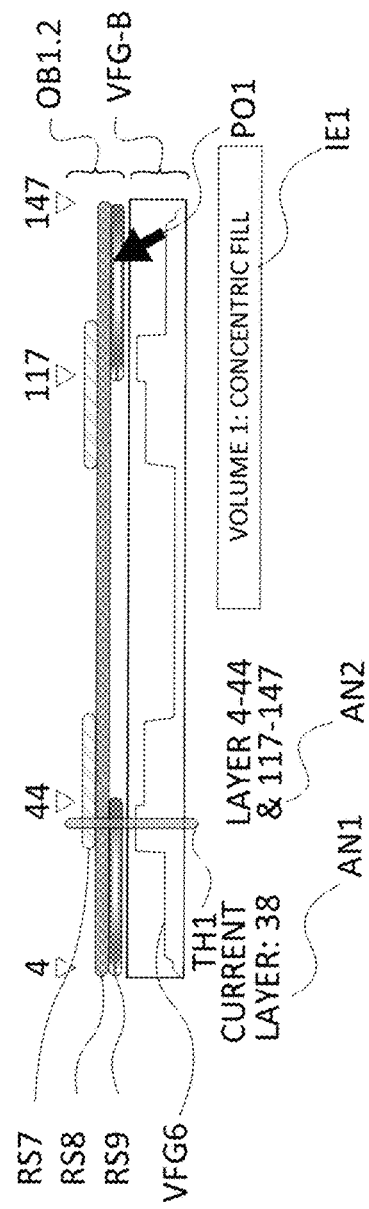

Further in contrast to FIGS. 4E-4G, the middle fill material section 1350-IF is surrounded by outer concentrically deposited anisotropic composite fiber swaths 1352-CON (e.g., as shown in single layer form in FIG. 10A, 10B, or 10C). Each concentric fiber swath fill section 1352-CON may be any number of concentric loops, e.g., 1-10 or higher. Again, optionally, outer walls 1350-OW (including 1-3 or more beads of isotropic fill material) optionally surround the sets 1352-CON of quasi-isotropic layers and fill material 1352 so that the outer surface of the part is fill material 1352. In addition, the upper quasi-isotropic layer set 1352-QI is additionally covered by a roof fill of fill material 1350-R (again, 1-3 or more layers of isotropic fill material 1350). In this manner, the entire outer surface of the part is optionally sheathed in fill material 1352, but immediately adjacent the fill material 1352 outer surfaces and displaced outwardly from a centroid of the part, composite material 1352 is deposited to increase effective moment of inertia in either anisotropically deposited quasi-isotropic sets 1352-QI, and/or concentrically deposited layers 1352-CON. Accordingly, outer contours, perimeters, roofs, and floors of the 3D geometry, whether formed from layers or shells of the 3D printing process or formed from walls, beads, or swaths within a respective layer or shell of the 3D printing process, are surrounded by an inner shell of composite material 1352. It should be further noted that one exemplary fill approach for the concentrically deposited outer layers 1352-CON is concentric loops, spirals, or offsets starting at an outer region perimeter or contour and spiraling inward 1352-O.CON (outer concentric fill).

In a variation of the part of FIG. 4H of a part having a through-hole TH-H as shown in FIG. 4I, the general approach of FIG. 4H may be followed. In contrast, in FIG. 4I, the negative contours or holes found in each layer having anisotropically deposited and/or oriented fiber fill, quasi-isotropic sets of layers 1350-R, and also found in each layer having anisotropically deposited and/or oriented fiber fill, outer concentric layers 1352-CON, are surrounded by these respective fills as well as isotropic, resin or fill material infill 1350-F. However, immediately adjacent the negative contour, a reinforcing column formed from an optional inner wall of isotropic, resin or fill material 1350-IW and an inner wall of anisotropically deposited and/or oriented fiber fill, inner fill concentric layers 1352-I.CON (e.g., a tube of concentric fiber and/or concentric fill material surrounding the through hole TH-H). A non-through, terminating hole may be similarly structured (e.g., the sides of the hole being similarly concentric inner fill of fiber 1352-I.CON and/or inner wall resin or fill material fill 1350-IW, and the bottom of the hole being terminated with, as permitting, a quasi-isotropic set 1352-QI and/or a roof layer 1350-R). As shown, the reinforcing column may extend through the infill 1350-IF, the outer concentrically reinforced layers 1352-O.CON or 1352-CON, as well as the quasi-isotropic sets of layers 1352-QI, such that two or three or more regions, fill patterns, or toolpath generation approaches are used in these layers, either in exclusive regions or in overlapping regions with a set priority among generation rules. As an example, a layer depicted in FIG. 10B includes an outer concentric fiber fill surrounding both of an anisotropically deposited and oriented infill IF that is one layer of a quasi-isotropic set, as well as an inner concentric fiber fill surrounding a negative contour. The reinforcing column formed from inner wall resin fill 1350-IW and/or inner concentric fiber fill 1352-I.CON may surround more than one hole or negative contour in each layer, e.g., two holes or three holes, etc., or may be a reinforcing structure distributed among different layers in a set or laminate. In this manner, negative contours, through-holes, and similar structures, whether formed from layers or shells of the 3D printing process or formed as walls within a layer or shell of the 3D printing process, also are surrounded by an inner shell of composite material.

In a further variation of the part of FIG. 4H of a part having an internally dense fiber infill pattern, as shown in FIG. 4J, the general approach of FIG. 4H may again be followed. In contrast, in FIG. 4J, a matrix or cellular arrangement of concentrically filled anisotropic material walls (of anisotropically deposited and oriented fiber material) 1352-CLW is arranged within the part to provide increasing fiber density and/or stiffness and/or crushing resistance. The pattern of cell walls 1352-CLW may be a honeycomb formed from reinforcement formations. Further, the pattern of cell walls of anisotropically deposited and oriented fiber material 1352-CLW may be formed by crossing or non-crossing outer concentric or inner concentric fills 1352-O.CON or 1352-I.CON. The pattern of cell walls of anisotropically deposited and oriented fiber material 1352-CLW may be a mirroring, repeating, orthogonally varying, or complementary arrangement. The cells are filled with infill material 1350-IF, in a dense or sparse arrangement. Additionally in contrast, in FIG. 4J, one or more intervening sets of quasi-isotropic fill 1352-QI (of anisotropically deposited and oriented fiber material) may be formed as an inner wafer other than at the top and bottom regions remote from the centroid. As shown in FIG. 4J, in contrast to FIG. 4H, the one or more intervening sets of quasi-isotropic fill 1352-QI (of anisotropically deposited and oriented fiber material) may be further surrounded by an outer concentric fill 1352-O.CON (in order to provide a consistent outer shell) or may instead fill a layer to an outer wall of resin material 1350-OW (as with the upper and lower sets of quasi-isotropic fill 1352-QI.

It should be further noted that the structures of FIGS. 4I and 4J may be combined by using exclusive regions or regions having a priority among them, e.g., through-holes TH-H may penetrate through or partially through a matrix or cellular arrangement of fiber fills 1352-CLW and/or 1352-QI combined with fill material 1350-IF and be nonetheless surrounded by wall-reinforcing tubes of fiber and/or fill material, e.g., as shown in FIG. 10B.

As shown in each of FIGS. 4H-4J, at least one (e.g., 1-3 or more) roof layer of resin or isotropic material or infill material 1350-R, solid, filled or densely filled in ox-row or other packed fashion, may be printed above a set of resin or fill material infill 1350-IF. The infill 1350-IF may in some cases be a sparse honeycomb pattern, and the solid, filled or densely filled roof layer(s) 1350-R provide a complete shell or layer surface upon which the anisotropic fiber swaths may be compressed and fused.

As shown in FIGS. 4A-4J, the three-dimensional geometry of the parts shown in FIGS. 4A-4J may be sliced into shells or layers as described herein. For each of a set of shells or layers defining a portion of a 3D printed part, first isotropic fill tool paths such as 1322, 1328, 1330, 1344, 1350, 1350-R, 1350-OW, and/or 1350-IW may be generated for controlling an isotropic solidifying head (e.g., head 18 or 1800 or 1616) to solidify, along the isotropic fill tool paths, a substantially isotropic fill material such (e.g., material 18*a* or 1604). For each of an anisotropic fill subset of the set of shells or layers defining the portion of the 3D printed part (e.g., the different fiber fills throughout a part), first anisotropic fill tool paths (e.g., 1352-QI or 1352-O.CON or 1352 I.CON) may be generated for controlling an anisotropic solidifying head to solidify, along the anisotropic tool paths, a substantially anisotropic fill material having an anisotropic characteristic oriented relative to a trajectory of the anisotropic fill tool path. As shown with reference to FIGS. 10A-10C, from among the set of shells or layers defining the portion of the 3D printed part, a selection of an editing subset of shells or layers may be received, the editing subset including at least part of the anisotropic fill subset. For each shell or layer of the editing subset, one of second isotropic fill toolpaths different from the first isotropic fill toolpaths and second anisotropic fill toolpaths different from the first anisotropic fill toolpaths may be regenerated.

Similarly, a printer for additive manufacturing of a part may include an anisotropic solidifying head (e.g., head 10, or 199) that solidifies, along anisotropic fill toolpaths, fiber swaths from a supply of anisotropic fiber reinforced material including a plurality of fiber strands extending continuously within a matrix material, the fiber swaths having an anisotropic characteristic oriented relative to a trajectory of the anisotropic fill tool paths. An isotropic solidifying head (e.g., head 18 or 1800 or 1616) may solidify, along isotropic fill toolpaths, a substantially isotropic material from a supply of solidifiable isotropic material. A motorized drive as shown in FIGS. 1A-1D and 2A-2H may relatively move at least the anisotropic deposition head and a build plate supporting a 3D printed part in three or more degrees of freedom. A controller 20 may be operatively connected to and configured to control the motorized drive, the anisotropic solidifying head and the isotropic solidifying head, and may control these to build the 3D printed part by solidifying the isotropic material along the isotropic fill tool paths, and/or solidifying the anisotropic fill material in fiber swaths tracking a non-concentric set (e.g., quasi-isotropic set 1352-QI, or any of the non-concentric complementary sets in FIGS. 12-14, all suffixes inclusive) of the of anisotropic fill tool paths for at least a first sequence of parallel shells. Further, the controller may control these elements to solidify the anisotropic fill material in fiber swaths tracking an outer concentric set (e.g., 1352-CON, or any of the concentric layer types shown herein) of anisotropic fill tool paths for at least a second sequence of parallel shells. Each of the non-concentric set and the outer concentric set of anisotropic tool paths may be located at least partially radially outward from the centroid of the 3D printed part, as shown in FIGS. 4H-4J.

With respect to the described structures, including all of those discussed with respect to FIGS. 4A-4J and 5A-5J, the reinforcement volume may include a combined volume of reinforcement fiber and a resin matrix within which the reinforcement fiber is additively deposited, and the reinforcement volume is less than 20 percent of the entire reinforced molding. With reference to embodiments shown herein, the continuous reinforcing fiber may be additively deposited simultaneously by a plurality of deposition heads (i.e., in parallel or substantially in parallel).

Figure 6B:
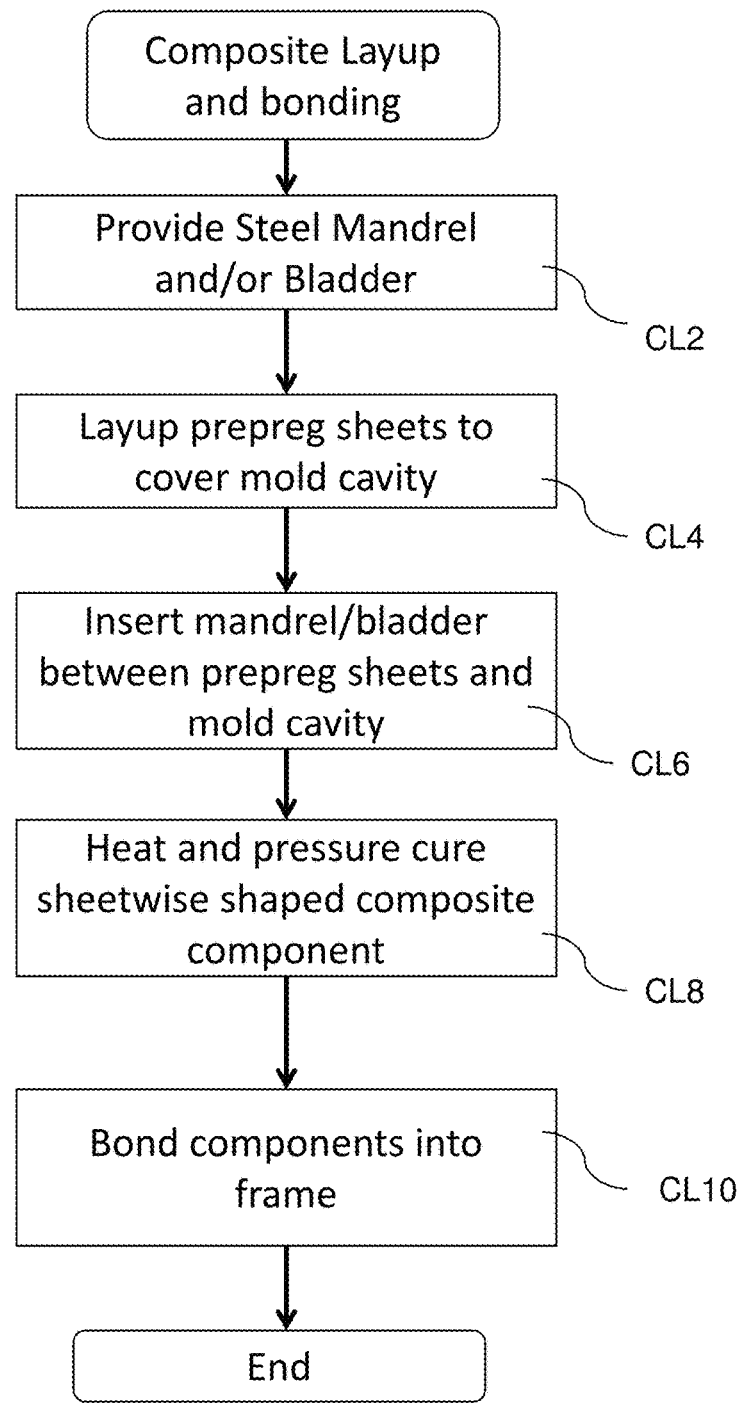

As discussed with reference to FIGS. 4A-4J and 5A-5J, the method of fabricating a continuous fiber reinforced injection molding, may include forming a first shape in a support material to form a support preform, e.g., using the structures of FIGS. 1A-1D, 2A-2H, and 3. As shown in FIG. 6B, the printer may additively deposit continuous reinforcing fiber in a second shape following a contour of the support preform to form a continuous fiber reinforcement preform. Further as shown in FIG. 6B, the continuous fiber reinforcement preform may be located within a mold of a molding apparatus. The mold may be loaded with flowable and substantially isotropic molding material, and the mold material may be hardened the molding material to overmold the continuous fiber reinforcement preform. As a result, a fiber reinforced molding or molded article is formed, in which an internal continuous fiber reinforcement preform is surrounded by a hardened substantially isotropic molding material.

The support preform may be formed from, and/or the support material may include, a soluble material (e.g., a polymer and/or salt soluble in a solvent), and further comprising dissolving the preform. The support preform may be dissolved before locating the continuous reinforcement fiber shell within the mold. The support preform may also be dissolved by the mold loading, where the support preform material is displaced, melted, or dissolved by the mold loading. The support preform may also be dissolved after the mold material is hardened (in which case at least one part of the preform shape may extend to be contiguous with a surface of the fiber reinforced molding). The support preform may be dissolved in a combination of these steps (e.g., partly or in one part before location in the mold, and partly or in a second part after the reinforced molding is hardened).

The support preform may be formed in a rotationally symmetric shape or mandrel for winding the continuous fiber reinforcement preform. Alternatively, the support preform is formed in a non-looped shape permitting winding the continuous fiber reinforcement preform upon the support preform. In this case, a robot arm supporting the fiber deposition printhead may reach concave areas of the support preform to deposit or wind the continuous fiber reinforcement preform.

The support preform may be injection molded. The support preform may be injection molded as a honeycombed structure, with a contiguous outer surface shell suitable as a winding substrate (alternatively, without the contiguous outer surface shell). The support preform and continuous fiber reinforcement preform may be formed in successive additive and injection molded stages. For example, a honeycomb structure I-HW may be additively formed from either a substantially isotropic material additive deposition or by fiber deposition, followed by insertion of the honeycomb I-HW into an injection mold for overmolding a substantially isotropic material contiguous outer surface shell of the support preform, followed by winding or surface-following raster/coverage continuous fiber deposition to cover the contiguous outer surface shell of the preform as the continuous fiber reinforcement preform, followed by one of additive or molding deposition of a final outer shell of substantially isotropic hardened material of the reinforced molding. Winding may use at least two translational and one rotational relative degrees of freedom between a continuous reinforcement fiber deposition head and the support preform, and/or or surface-following coverage additive deposition may use at least three translational and one rotational relative degrees of freedom between a continuous reinforcement fiber deposition head and the support preform.

Figure 5K:
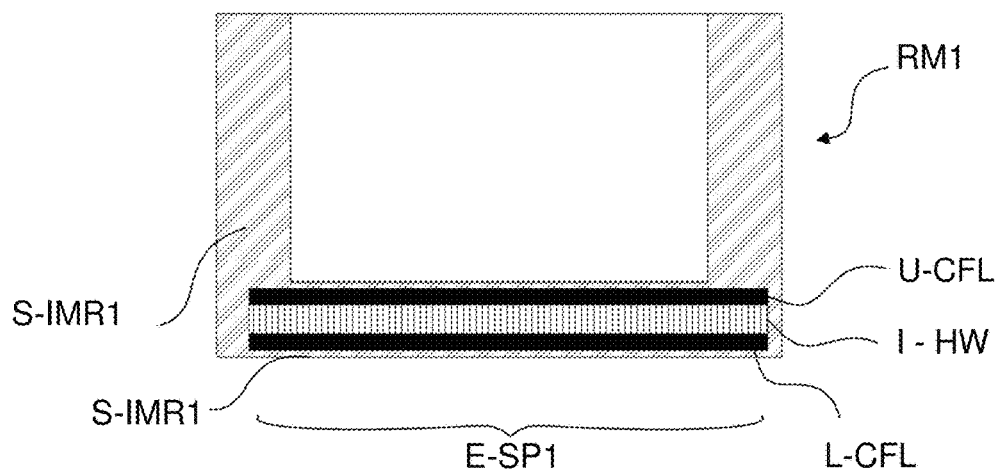
FIGS. 5K-5L show the structures similar to those in FIGS. 4A-4J and 5A-5J in which some internal structures are additively deposited as sandwich panels.
Figure 5L:
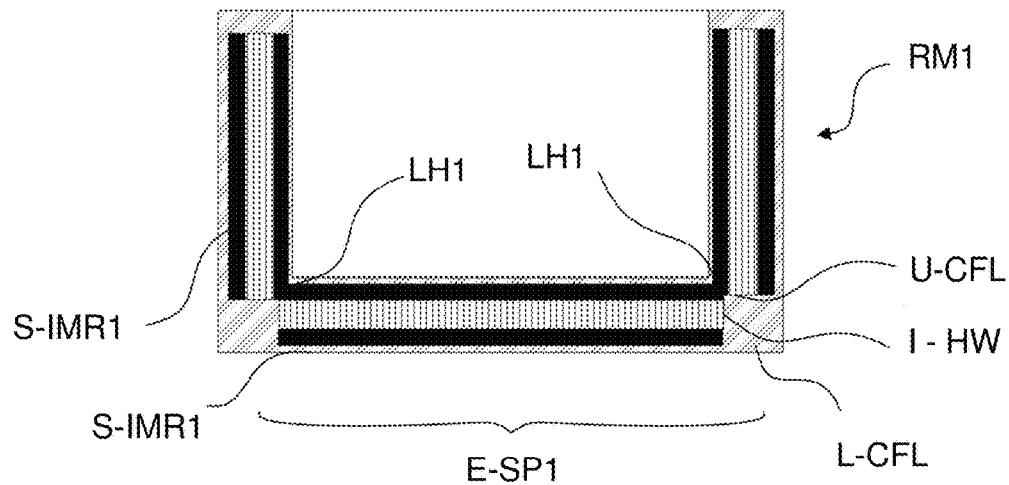

The second shape and/or the continuous fiber reinforcement preform may embed at least one sandwich panel structure E-SP1 (e.g., a first laminate of fiber reinforcement L-CFL, an intermediate honeycomb I-HW or solid material either of fill material or fiber reinforcement, and a second laminate of fiber reinforcement U-CFL substantially parallel to the first laminate but spaced therefrom). As shown in FIGS. 5K and 5L, the sandwich panel structure E-SP1 may be a foldable structure, e.g., with the second laminate U-CFL being continuous and the first laminate L-CFL and the intermediate material I-HW having linear gaps formed therein opposite fold line(s) in the second laminate to form hinges LH1 (e.g., living hinges if the fiber reinforcement is readily bent, or separation/snapping guides if the fiber reinforcement is more brittle). Optionally the preform itself embeds at least one sandwich panel structure E-SP1.

The support preform may be relatively moved in at least one rotational degree of freedom with respect to a deposition head that additively deposits the continuous reinforcing fiber in the second shape following the contour of the preform to form the continuous fiber reinforcement preform.

The overmolding and/or molding may be performed at a molding material pressure which removes air voids within the fiber reinforcement matrix material. The continuous fiber reinforcement preform may be bent or deformed from its formation shape to a deformed shape within the mold. Two or more continuous fiber reinforcement preforms may be bonded to one another before location within the mold. The support preform may be bent or deformed from its formation shape to a deformed shape for depositing the fiber reinforcement to form the continuous fiber reinforcement preform.

The mold may be an injection mold, and pack pressure of the injection molded material during molding compresses and/or consolidates the fiber reinforcement preform into a final shape and/or removes voids within the fiber reinforcement preform. At least in the case where the mold is an injection mold, heat from the injected mold material remelts a matrix material of the fiber reinforcement preform.

The fiber deposition or winding of the continuous fiber reinforcement preform may be additively deposited thermoplastic continuous fiber reinforced prepreg tape or prepreg tow having a width at least three times its height.

The described techniques may further include arranging a wide prepreg sheet against or on the soluble preform before additively depositing continuous fiber tow or tape thermoplastic prepreg.

The described techniques may further include applying a vacuum during formation of the continuous fiber reinforcement preform and/or the molding to remove voids. The vacuum may be applied at the part perimeter and if the molding material is injected or pressurized into the middle of the part. The continuous fiber reinforcement preform may include ribs or air channels to help air escape.

In a variation, in a method of fabricating a continuous fiber reinforced injection molding, continuous reinforcing fiber is additively deposited by the devices of FIGS. 1A-1D, 2A-2H and 3 in a second shape following a contour to form a first continuous fiber reinforcement preform as a flat or curved "A" panel. The first continuous fiber reinforcement preform may be located within a mold of a molding apparatus along a first mold plate, and a second mold plate formed with a honeycombed cavity may be located opposite the first continuous fiber reinforcement preform. The mold may be loaded with a flowable and substantially isotropic molding material. The molding material may be hardened to overmold a honeycomb of the substantially isotropic molding material against the continuous fiber reinforcement preform, thereby forming a fiber reinforced molding including a hardened substantially isotropic molding material honeycomb integrated with the continuous fiber reinforcement preform (optionally the continuous fiber reinforcement preform is further enclosed within the molding material). Subsequently, a complementary "B" side reinforced fiber panel may be deposited by continuous fiber deposition against the honeycomb. Alternatively, a "B" side may be formed as a mirror process (e.g., first a continuous fiber reinforced preform, then a honeycomb overmold) then joined or overmolded honeycomb-to-honeycomb (preferably with other locating or indexing or interlocking features). Further alternatively, the honeycomb mold cavity may be formed in as a soluble preform upon which the fiber reinforced preform is deposited, simplifying the second mold plate to the match contours of the honeycomb soluble preform shape. The soluble material is removed before the A and B sides are joined.

Tubular Framework Example

As shown in FIGS. 6A and 6B, in composite lay-up of a bicycle frame, in step CL2 mandrels SMAN-N may be prepared for one or more (N) junctions of tubes (e.g., head tube joining the top tube and down tube; bottom bracket joining the seat tube, down tube, and chain stay; or seat post joining the top tube, seat tube, and seat stay; or rear dropout joining the seat stay and chain stay). Often, as in step CL4, seven (N=1 . . . 7) parts are laid up and compression molded about mandrels SMAN-N or other defining shapes as in steps CL6 and CL8 into molded components COMP-C and finally as in step CL10 bonded into a unitary frame FRM (left and right dropouts, bottom bracket assembly, seat post assembly, head tube assembly, and v-shaped chain stay frame, and v-shaped seat stay frame).

Figure 6D:
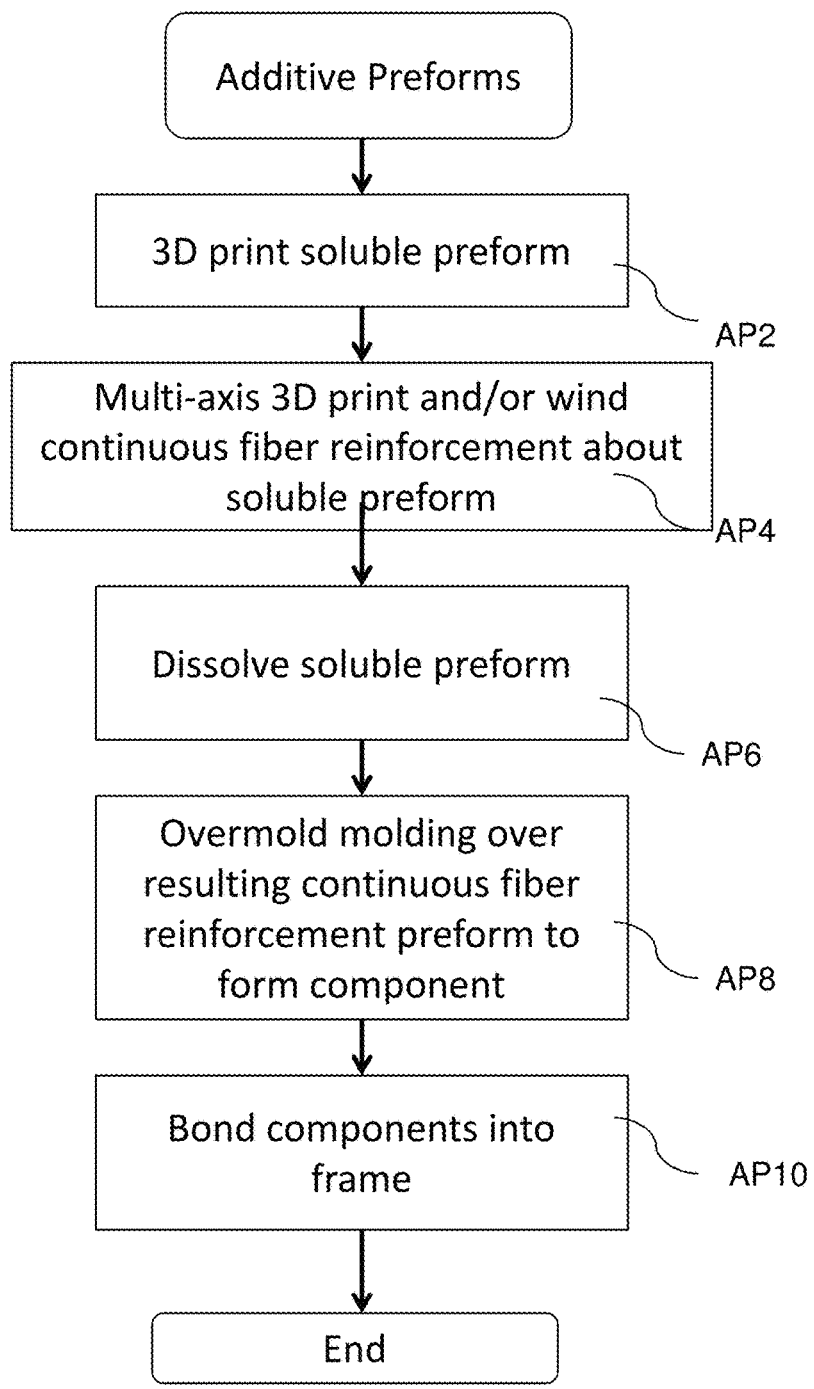

As shown in FIGS. 6C and 6D, in an example of contrasting in-mold assembly of a reinforced molding RM2 formed by resin overmolding OV3a a fiber reinforced preform 1342a, in the present embodiments, an additively deposited soluble preform 1340a may be printed as in step AP2 to take the place of a steel mandrel that defines the shape and surfaces of a frame component formed as a reinforced molding RM2, and steps may take place in a different order or different form.

For example, each component (e.g., head tube junction component) may have a soluble mandrel (soluble preform 1340a) additively deposited (3D printed) by the printer 1000 as in step AP2. Pressurizable nylon bladders or heat-activated foam inserts may be integrated at this time, or may have been printed over (or printed in an appropriate material). In a second stage as in step AP4, a printhead 1402 deposits and/or winds and/or wraps continuous fiber over the soluble preform(s) 1340a including bladders or heat-activated foam inserts as appropriate, including printing inner or outer guard layers of plastic about the continuous fiber. During overmolding, bladders or heat-activated foam may help pressurize the continuously wound fiber, optionally against a mold wall, to eliminate internal voids.

At this stage, as shown in FIGS. 6C and 6D, a component assembly includes a fiber reinforcement preform 1342a wrapped about a soluble preform, optionally with the pressure-increasing features integrated. The soluble preform 1340a, in weight-sensitive applications, may be dissolved away as in step AP6. In other cases the role of the soluble preform 1340a to allow winding of the reinforcement preform 1342a is instead taken by a honeycomb, foam, or low-density preform that will remain in the final assembly (in addition to any heat-activated mold cores). The pressure-increasing features may be left in place.

As in step AP8, a component including at least the fiber reinforcement preform 1342a may be placed inside a mold MLD-2 substantially in the shape of the final reinforced molding RM2 (absent molding features such as sprues, runners, etc.). As in step AP8, the mold MLD-2 is closed, and any bladders may be connected to pressurized air fittings. As in step Ap8, the mold MLD-2 is filled with molding material and pressurized or heated as appropriate for the molding technique (e.g., injection molding). Pressure is increased by the bladders and/or reacting heat-activated foam cores. If necessary, curing is performed on the reinforced molding RM2.

In an alternative, before or instead of overmolding the fiber reinforced preform 1342a, a heat-shrinking tape may be printed or wound about the fiber reinforcement preform 1342a. In this case, the soluble preform 1340a may be left to provide internal resistance versus pressure created by heating and/or curing the heat-shrinking tape. If the component 1342a is not to be overmolded, once cured, the tape may be removed and the hardened part may be sanded to its final diameter and shape (additional layers may be additively printed before sanding and/or additively sprayed after sanding). As in step AP10, the components may be bonded into a whole (e.g., frame FRM).

In this framework example, as with any frame or truss example, the junction components, whether they have long arms extending from them or short, are distinct from the entire frame in that they can be wound or externally traced or printed without a weaving operation, i.e., the external surface does not connect with itself in a loop or ring (although the internal surface may be a hollow tube or a junction of hollow tubes).

It should be noted with this example, as with any frame or truss example, that the overmolding may be performed on each junction component, and then the reinforced moldings RM2 or 1342a joined (e.g., by nesting tubes or shapes, smaller diameter within larger diameter, and adhesive or fastener bonding). In an alternative, the fiber reinforcement preforms RM2 or 1342a may be first joined to one another (again by nesting tubes or shapes, smaller diameter within larger diameter or otherwise interlocking, and adhesive or fastener bonding), and then the joined assembly overmolded in an entire assembly mold (not shown).

As discussed herein with reference to the continuous fiber reinforcement preform, in the case of one, two, or more holes, airflow holes, negative contours, embedded contours, or overmolded contours in any reinforced molding component, in many cases different kinds of reinforcement will be possible. For example:
(1) Reinforcement of inner walls and hole walls may closely follow the walls, with or without layers of fill material shielding the innermost wall to prevent print-through of fiber. "Holes" include negative contours and embedded (e.g., overmolded) contours.

(2) Reinforcement of outer walls may closely follow the walls, with or without layers of fill material shielding the innermost wall to prevent print-through of fiber, e.g., "outer" reinforcement formations.

(3) Reinforcement may extend along load lines or stress lines, e.g., outer reinforcement formation.

(4) Reinforcement for tension load purposes may include multiple straight composite swaths between the sites at which the tension load is supported.

(5) Reinforcement for torsion, torque, or pressure load purposes may include multiple circular composite swaths along directions of hoop stresses.

(6) Reinforcement for compression load purposes may include multiple neighboring composite swaths to provide low aspect ratio cross sections and/or squat structures, and/or anchors at ½, ⅓ fractional, e.g. harmonic lengths to guard vs. buckling; and/or e.g., more composite swaths for compression struts than for tension struts.

(7) Reinforcement for twisting may include angular cross bracing in triangle or X shapes.

(8) Reinforcement for bending or combination load purposes may include embedded high moment of inertia (cross section) structures such as sandwich panels, tubes, boxes, I-beams, and/or trusses formed from embedded composite swaths. These may be made in layers spaced from the centroid of the component cross section, or in outer toolpaths spaced from the centroid of the component cross section, depending on the load and the orientation of the reinforced molding during printing.

In general, it is preferable to apply strategies in which compression and/or layer height interference of an overlapping or crossing layer (e.g., which may correspond in part to layer height) may be set to deposit two highly compressed layers of composite swaths 2c-2, 2c-1, and to square up corresponding fill material 18a at a height of close to twice the highly compressed composite swath height. It may also be preferable to permit or create crossings of toolpaths of composite swaths 2c-1, 2c-2, and to square up corresponding fill material 18a at a height of close to twice the highly compressed composite swath height. Crossings of highly compressed composite swaths with one another, and/or crossings of highly compressed composite swaths with lightly compressed composite swaths may be used. As shown in the CFF patent applications, toolpaths for deposition of core reinforced fiber may be generated within contours and sub-contours, and in order to maintain parallel paths, and often follow offsets of the contours and sub-contours.

Figure 7A:
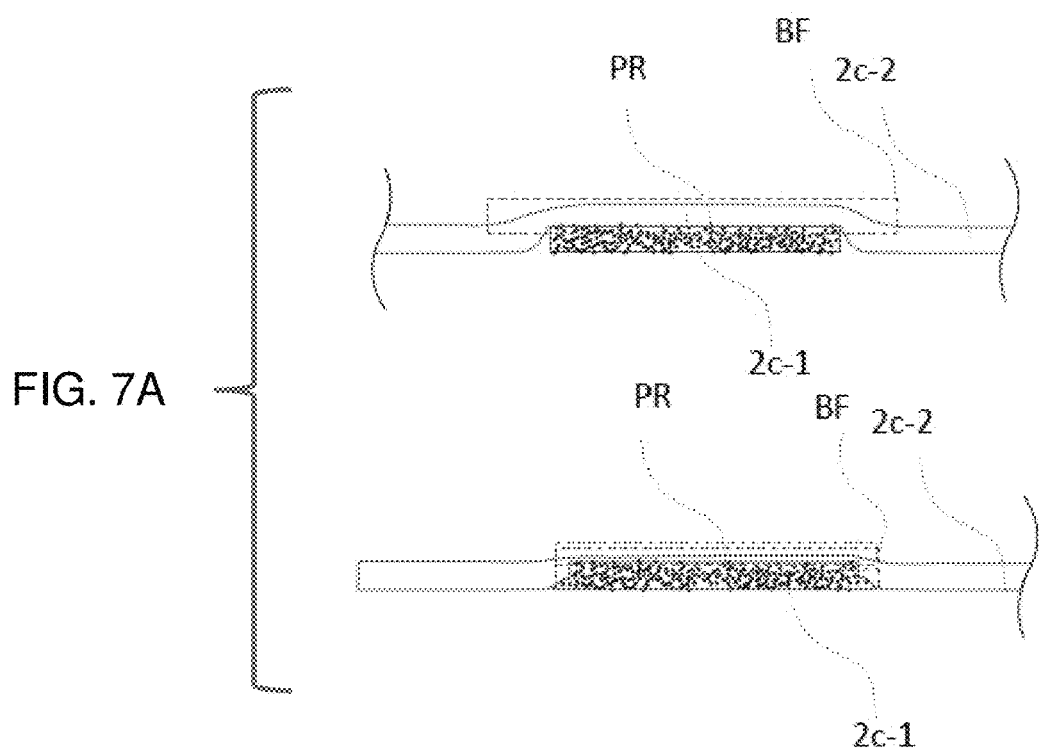
FIG. 7A shows crossing points or crossing turns of two fiber swaths in two forms.

It should be noted that only some toolpaths, composite swaths 2c, and/or multi-swath fiber tracks form "loops", closed "loops", or "crossing turns" as continuously deposited in a single layer of an additive manufacturing process. FIG. 7A shows crossing points or crossing turns of two fiber swaths in two forms. Any of these loops, crossing points, closed loops, or crossing turns may form a portion of a continuous fiber reinforcement preform as discussed herein, and may be printed together with fill material and/or onto soluble material or a soluble preform.

Figure 7B:
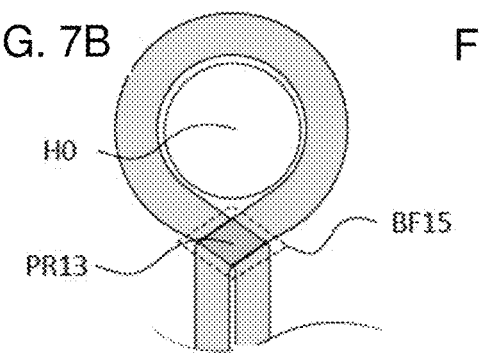
FIGS. 7B-7F shows various crossing turns made about a hole (e.g., a lace aperture or through hole), in reinforcement formations of composite swath or multi-swath track approaches near the center of the hole and departs beside and parallel to its entry; approached near a tangent to the hole and departs from the hole opposite to and parallel to its entry; and in which a bight, open loop or touching loop may be made away from the reinforced hole from which the reinforcement formation of composite swath or multi-swath track returns toward the hole.
Figure 7E:
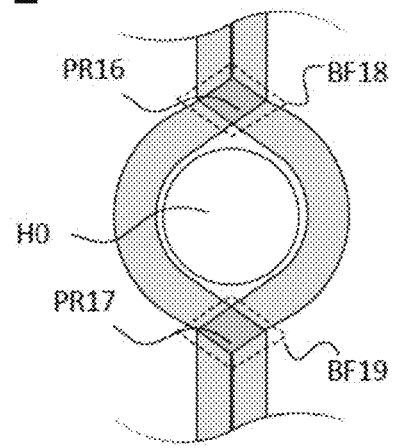
Figure 7C:
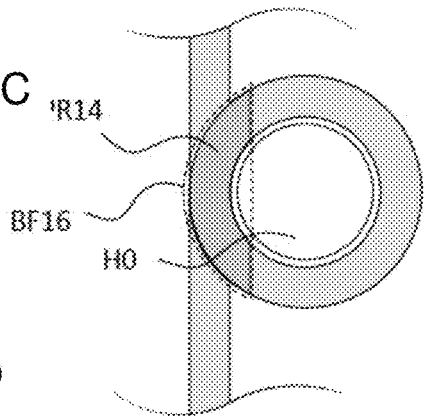

FIGS. 7A-7F show three examples of crossing turns, i.e., loops or crossed loops that are made about internal geometry, such as a hole within a layer (a hole represented as a negative contour); and FIGS. 7B-7C show two examples that may be crossing turns but could also be distributed between two layers. Each represented crossing turn may depict either a single composite swath, or a multi-swath track of parallel composite swaths. "Track" in this context means closely arranged (often touching), and often parallel swaths, which may be printed concentrically, spirally, or in parallel. A track need not have all swaths parallel throughout its entire length. The followed hole H0 is in each case circular, but may be any shape having a perimeter that can be followed by a toolpath (e.g., hexagonal or square). In FIGS. 7A-7F, single layer or double layer overlaps (i.e., locations where a swath or multi-swath track is directly over an underlying swath or multi-swath track within the same printing layer) are depicted as darker shade and single swaths or multi-swath tracks as comparatively lighter shade/transparency). In several cases, parallel or neighboring entering and exiting swaths or multi-swath tracks are depicted as cleanly separated and cleanly on either side of the center line, but may overlap and/or cross a center line.

Crossing points made in a same layer, which may be one continuous composite swath or different composite swaths, may be referred to as "intra-layer" crossing points. Crossing points made between two layers, which in most cases may be different continuous composite swaths are referred to as "inter-layer" crossing points. It should be noted that a raster pattern crossed with another raster pattern on another layer produces a dense array of inter-layer crossing points, but these crossing points do not particularly reinforce any neighboring feature or contour. As such, a single inter-layer crossing point (e.g., such as that in FIG. 7E or 7F) or a small group of inter-layer crossing points are herein discussed as "isolated crossing points". As discussed herein, intra-layer crossing points tend to create protrusions at the crossing point layers in the case of composite swaths, less so in the case of extruded fill material alone; while inter-layer crossing points do not create such protrusions unless otherwise described.

FIG. 7B shows a crossing turn made about a hole H0—such as a lace aperture, airflow aperture, mesh gap, through-hole, in upper, insole, sole, or orthotic—in which (i) the swath or multi-swath track approaches the hole H0 approximately parallel to an (imaginary) line through its center, axis or centroid, (ii) crosses the line to an opposing side of the hole, (iii) closely follows the perimeter of the hole H0, (iv) crosses itself and the line, and (v) departs from the hole H0 approximately parallel to itself and the line. A diamond-shaped overlap PR13 is formed, which may extend above the height of a single swath 2c. A buffer-zone BF15 may be created or marked about the overlap. This type of crossing turn closely follows and reinforces a hole wall for greater than 300 degrees of arc, and may be the end loop of a larger pattern. It should be noted that the entering and exiting swaths 2c or multi-swath tracks are depicted as cleanly separated and cleanly on either side of the center line, but may overlap and/or cross the center line.

Figure 7D:
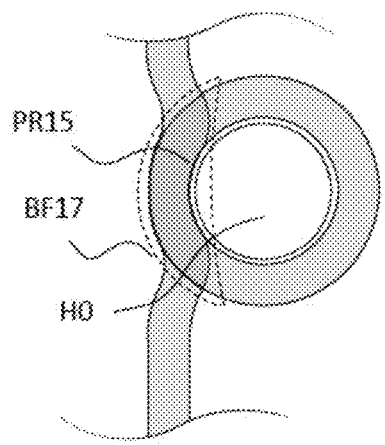

FIG. 7C shows a crossing turn made about a hole H0—such as an airflow aperture, mesh gap, or through-hole—in which (i) the swath 2c or multi-swath track approaches the hole H0 approximately parallel to an (imaginary) line parallel to a tangent to a perimeter of the hole H0, (ii) crosses the line to follow a perimeter of the hole H0, (iii) closely follows the perimeter of the hole H0, (iv) crosses itself and (v) departs from the hole H0 approximately along the same line from which it approached, continuing the entry toolpath. A C-shaped overlap BF16 is formed, which may extend above the height of a single swath 2c. A buffer-zone BF16 may be created or marked about the overlap. This type of crossing turn closely follows and reinforces a hole wall for greater than 360 degrees of arc, and may be a middle loop in a larger pattern. It should be noted that the entering and exiting swaths 2c or multi-swath tracks are depicted as along the same line, but may be offset or exit at an angle to the approaching swath 2c or track. FIG. 7D shows a crossing turn similar to FIG. 7C, except that (i) the approaching swath 2c or multi-swath track is more offset from the (imaginary) tangent to the hole, and so turns slightly in an S-shape to approach the tangent at an angle, and similarly (v) departs from the hole H0 in a manner mirroring the entry. The C-shaped overlap PR15 and buffer zone BF17 may be of different or more concave shape.

Figure 7F:
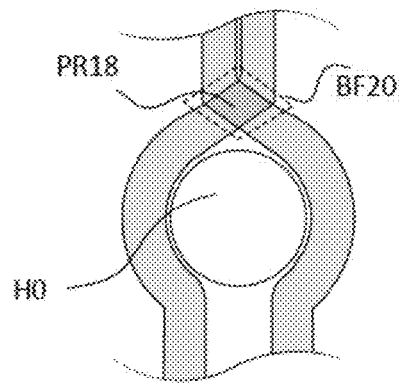

FIGS. 7E and 7F show overlaps or crossing points adjacent a hole—such as an airflow aperture, mesh gap, or through-hole—in which a bight, open loop or touching loop may be made away from the reinforced hole H0 from which the swath 2c or multi-swath track returns toward the hole H0. A different swath 2c or multi-swath track within the same layer may also form the return path. In the case of FIG. 7E, (i) the swath 2c or multi-swath track approaches the hole H0 approximately parallel to an (imaginary) line through its center, axis or centroid, separated by approximately a track width, (ii) follows the perimeter of the hole H0, then (iii) crosses the line to an opposing side of the hole H0, and (iv) departs from the hole H0 approximately parallel to itself and the line. Upon returning from the pattern away from the hole H0, the swath 2c or multi-swath track (v) crosses itself and the line to an opposing side of the hole H0, (vi) closely follows the perimeter of the hole H0, and (vii) departs from the hole H0 approximately parallel to itself and the line, again separated by a swath or track width. A diamond-shaped overlap PR16, PR17 is formed, which may extend above the height of a single swath. A buffer-zone BF18, BF19 may be created or marked about the overlap PR16, PR17. This type of crossing point closely follows and reinforces a hole wall for 240 degrees of arc, and may be the end loop of a larger pattern. A crossing point may be complemented by a vertically mirrored version of itself in a complementary layer without stacking overlaps or buffer zones. A crossing point may, in contrast, approaches the hole closer to the center line and crosses itself at both sides of the hole.

At least the following strategies are available for accommodating the protrusion PR in a reinforced molding 14 where successive layers are nominally of a consistent height—for example, 0.1 mm height. These strategies would in many cases be applied during slicing and toolpath or reinforcement formation planning for the reinforced molding 14, in part so that inter-layer accommodations may be made. Where the protrusion PR scale (e.g., height and/or width) is modeled/predicted/empirically known and stored as an absolute or relative value or a function of system variables, the overlap PR or a buffer zone BF larger than the overlap PR may be marked or planned in the current layer $LA_n$.

(1) Subsequent path planning in the same layer (layer $LA_n$) may:

(a) avoid crossing the overlap within the same layer (e.g., layer $LA_n$ by planning toolpaths which do not cross the overlap, although the new toolpaths may form a crossing point, jump, crossed loop or crossing turn forming a new overlap).

(b) plan new toolpaths within the same layer (layer $LA_n$) separated by more than the buffer zone.

Subsequent or integrated path planning for a new, adjacent layer ($LA_{n+1}$) adjacent to the layer in which protrusions are formed (layer $LA_n$) may:

(c) increase the previous layer height (of layer $LA_n$) in the overall slicing approach, and/or decrease the current layer height (of layer $LA_{n+1}$). This is most applicable when no composite swaths, or composite swaths which do not cross and create protrusions, will be formed in the current layer.

(d) path plan composite swaths to avoid overlaps and/or buffer zones in the layer below (layer $LA_n$);

(e) path plan a complementary or partner patterns in the current layer ($LA_{n+1}$) which provide complementary functionality to a pattern in an adjacent or previous layer (layer $LA_n$).

FIGS. 8A-8D show patch fills and concentric fills that may be used to fill in reinforcement regions as disclosed herein. Any of these patch fills or concentric fills may form a portion of a continuous fiber reinforcement preform as discussed herein, and may be printed together with fill material and/or onto soluble material or a soluble preform.

Figure 8A:
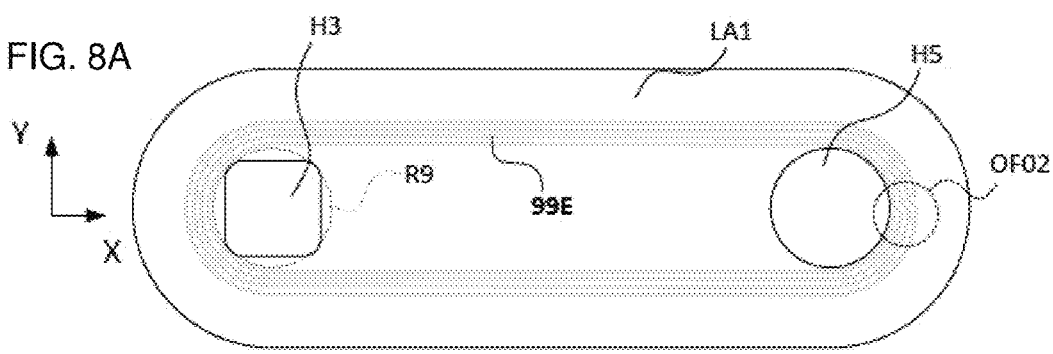
FIGS. 8A-8D show patch fills and concentric fills that may be used to fill in reinforcement regions as disclosed herein.
Figure 8B:
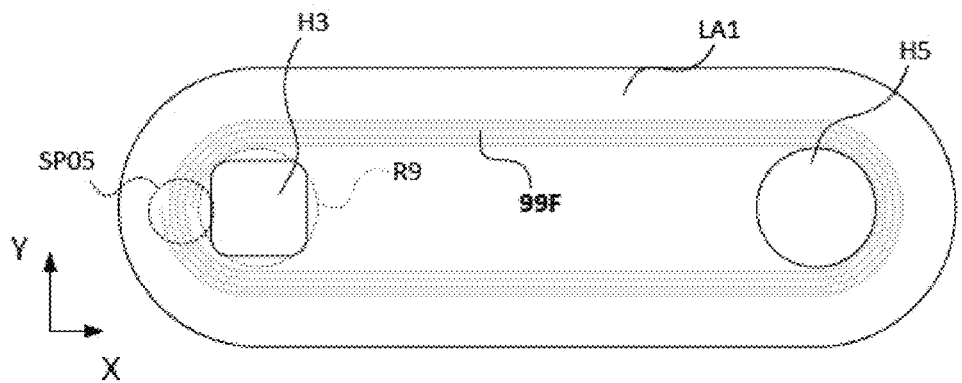

FIG. 8A shows a variation of FIG. 8B in which the toolpath, composite swath pattern, or reinforcement formation 99E is of offset approach, with crossovers OF02 at the opposite side of the reinforced molding from the spiral start and end of the spiral strategy toolpath of FIG. 8B. FIG. 8B shows a toolpath, composite swath strategy or reinforcement formation 99F, as a spiral strategy, excepting that FIG. 8B shows a paired square hole H2 and circular hole H5.

Figure 8C:
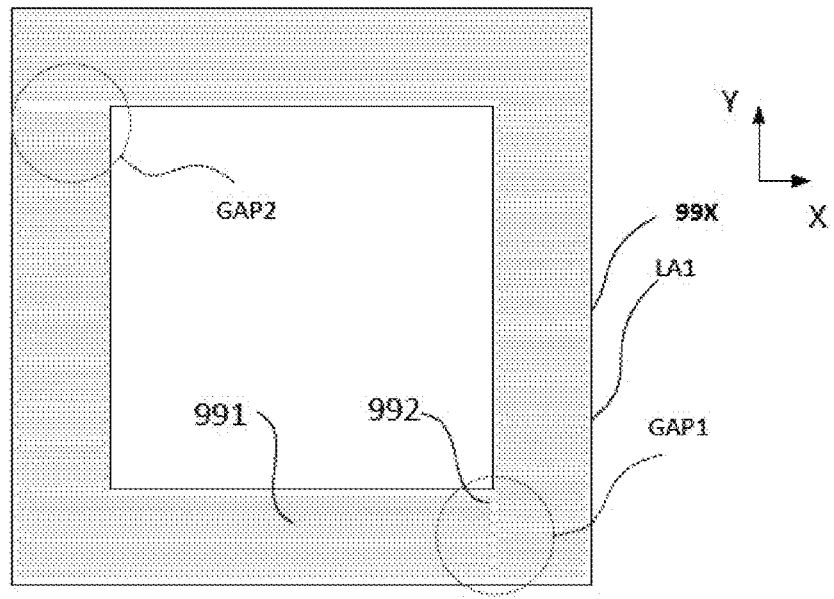
Figure 8D:
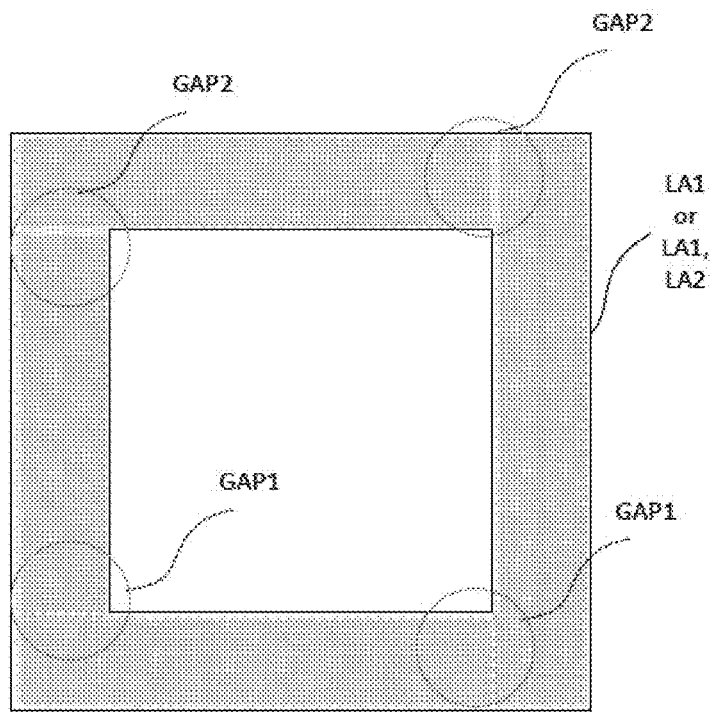

FIG. 8C shows a single layer of a densely filled square plate of four long side members, with an aperture, space for a stretchable substrate, hole or negative contour in the middle. In FIG. 8C, as shown, a lengthwise raster fill reinforcement formation 99X surrounds the contour or region in the middle. There are many turns in the raster pattern, and two gaps GAP1 and GAP2 (which may also be stress concentrations, starts, or stops are formed. GAP1 is formed where the pattern changes regional groups, and GAP 2 is formed at the end of the composite swath 2c. These gaps may also occur if the composite swath 2c length is not perfectly predicted or measured. Within the layer, the gaps may be filled with (i) fill material 18a, (ii) lengths of composite swath 2c which do not continue the raster fill (e.g., gap filling patterns, which may be concentric, wall or region following), (iii) and/or with overlapping composite swath 2c or protrusion PR. E.g. in order to fill the GAP1 or GAP2 with overlapping composite swath 2c, each raster pattern would be widened to overlap (e.g., wherein the gaps are closed with protrusions PR, which may be varied in position among layers as discussed herein). In FIG. 6D, two superimposed reinforcement formations 99X, 99X layers are shown, where the reinforcement formation 99X is rotated by 90 degrees, optionally in the subsequent layer. The reinforcement formation 99X may be rotated at 90 degrees, then again, in an additional two layers to continue to change the position of the gap, stress concentration, starts, or stops. Optionally, the pattern is rotated by 45 degrees in some intervening layers.

Figure 9:
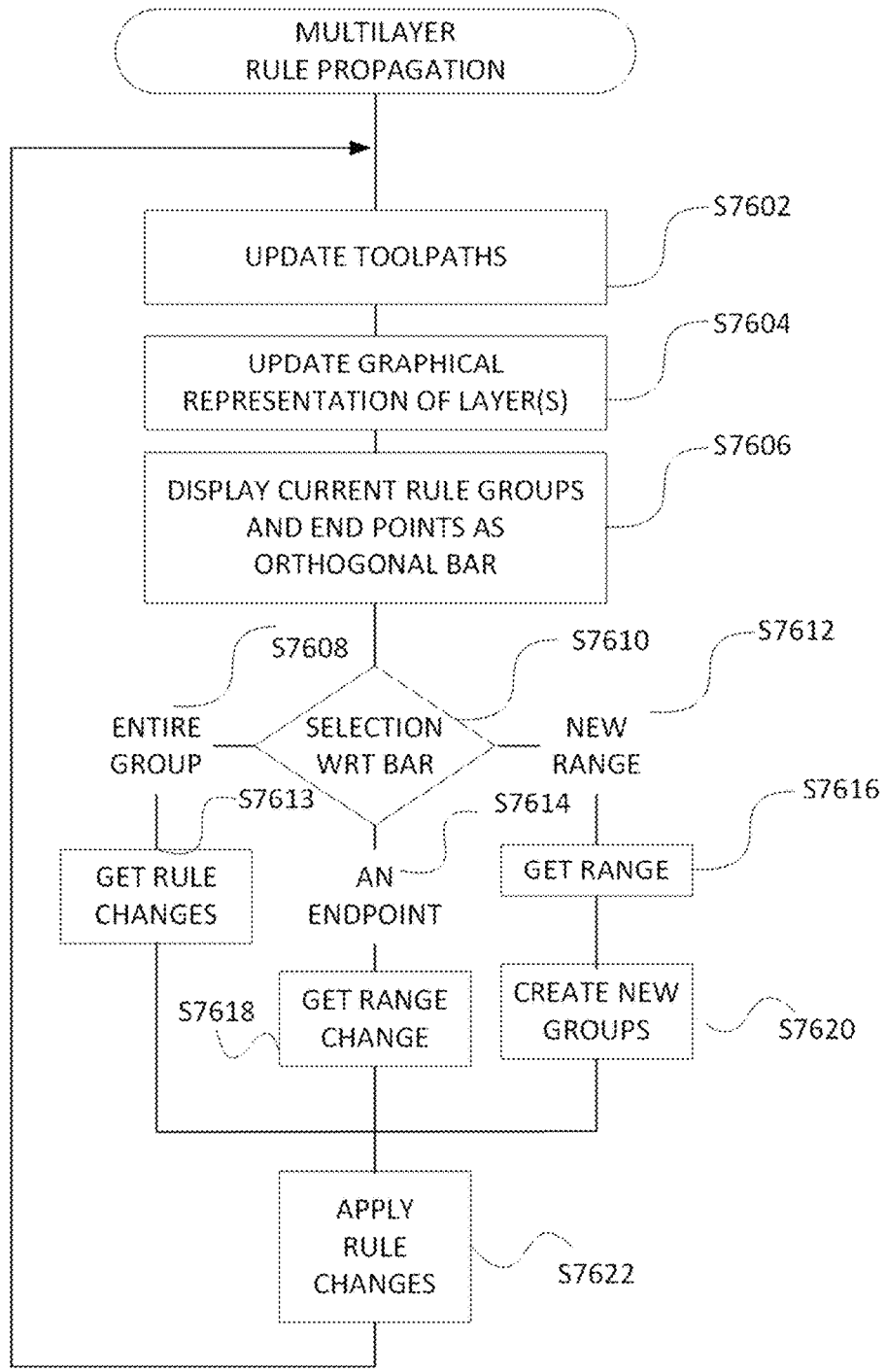
FIG. 9 depicts a flowchart for configuring 3D printer controller and/or slicer controller operations to permit multi-layer rule handling, e.g., setting rules for groups of layers or regions and changing the members of the rule groups.

FIG. 9 depicts a flowchart for configuring 3D printer controller and/or slicer controller operations to permit multi-layer rule handling, i.e., setting rules for groups of layers or regions and changing the members of the rule groups. This routine may be used in preparing a continuous fiber reinforcement preform. In step S7602, updating or re-slicing of toolpaths from any toolpath, region, or layer setting change is carried out. In step S7604, as necessary, any changes in the currently displayed graphical representation resulting from an updated toolpath (e.g., change of a layer, group of layers, or volume) are processed and displayed. In step S7606, as shown in FIGS. 10A-10C, graphical representations of rule groups and end points of the rule groups are rendered as orthogonal bar(s) parallel to an edge of a display. In step S7610, the display area of the orthogonal bar is monitored for a pointer PO1 action selecting, an entire group, an endpoint of a group, or a new range within and/or adjacent an existing group, and the input handled according to the particular case.

When an entire group is selected and retaining focus, in step S7613, one or more interface elements (e.g., a drop down menu, slider, text or number box, radio button, check box) are monitored for input reflecting a change in the rule applied to the selected entire group, and the rule change is captured from the input. When an endpoint of a group (e.g., a group will have at least two endpoints, but may have any number for non-contiguous groups) is selected per step S7614 and retains focus, in step S7618 one or more interface elements (e.g., a drop down menu, slider, text or number box, radio button, check box) are monitored for input reflecting a change in the position of the endpoint, and therefore a change in the members in the set of layers or regions of the group, and the rule change is captured from the input. When a new range is formed or is selected per step S7612 and retains focus, in step S7616 one or more interface elements (e.g., a drop down menu, slider, text or number box, radio button, check box) are monitored for input reflecting a change in the rule applied to the selected entire group, and the rule change is captured from the input and the new group created in step S7620. If the new group is within a previously existing group, three new groups may be created (e.g., the new group selected as well as one or two fractional remainder groups reflecting that part of the previously existing group which was not changed). In each case, in step S7622, the rule change is applied and the process proceeds back to step S7602 to update the toolpaths per the rule change or range change, as well as the graphical representation (7604) and representation on the orthogonal bar (S7606).

FIGS. 10A and 10B show an embodiment of the orthogonal layer topography bar OB 1.2a-OB1.2c. This interface may be used in preparing a continuous fiber reinforcement preform. As shown and described, like elements throughout the figures are often like numbered, but some numbers may be omitted in these views. The description of elements of substantially identical appearance in other drawings generally applies to FIGS. 10A and 10B, including the described associations among displays, processes, and databases. The orthogonal layer topography bar OB 1.1 is described in the context of exclusive rule sections RS1-RS4 (although it may be used with non-exclusive rule sections), FIGS. 10A and 10B are described in a context of rule sections RS7-RS9 which may overlap. As shown in FIGS. 10A and 10B, the orthogonal layer topography bar OB1.2 is formed as a set of independent orthogonal subbars OB1.2a/RS7 through OB1.2c/RS9, each subbar OB1.2a through 1.2c or rule section RS7 through RS9 being associated with adjustment handles at each end of each section.

As shown in FIG. 10A, extending across a lower part of the display 1002, the volume fill graph section VFG-B display element is a topography representation of approximately 150 layers. As shown by the position of the thumb TH1, the currently displayed layer is layer 6 within rule section RS9, within which layers 4-44 and 107-147 include approximately 25% fiber fill as shown by the volume fill graph section VFG4, VFG5. As shown, rule section RS9 is non-contiguous in two parts, i.e., the display, interface, and database may record and apply customized or default rules (toolpath, region, or layer) to non-contiguous but associated ranges of toolpaths, regions, or layers. Rule section RS9 is selected via pointer PO1, and is highlighted between rule adjustment handles HA9 and HA10, and again between handles HA11 and HA12, with annotation AN2 indicating that the common ranges of the rule of the selected rule section is layers 4-44 and 107-147, and annotation AN3 indicating that the rule selectable for an associated "Volume 1" (e.g., a volume formed by the height of the layers 4-44 and 107-147 and either an entire layer or a region within a layer) is a "CONCENTRIC FILL" rule (from among fiber fill types, with the selectable rule itself being changed, e.g., via the selection panel 1004). Reflecting the current index layer, the depicted model shows concentric fill of about 25 percent fiber content in layer 6 within the rule ranges.

FIG. 10B shows a set of changes from the state of FIG. 10A of the display state as well as corresponding processes and databases. In particular, FIG. 10B shows the addition of two additional rule sections RS8 and RS7 to the displays, processes, and databases. Rule set RS8, for example, is a rule applicable from layer 3 to 150, in this case, for example, a rule prescribing the concentric, inner negative contour following hole wall reinforcement pattern HR, surrounding the through-hole W04 which passes through the part in each layer. Rule set RS7, for example, is a rule applicable in layers 35 through 70 and 100 through 125, in which isotropic fill is prescribed for a particular defined region or volume, or for example for any area which is not otherwise subject to a higher priority rule (not that the priority of the rules could be adjusted, e.g., by restacking (rearranging) the rule layers RS7, RS8, RS9 such that the priority order is the order of the stack). As shown in FIG. 10B, the position of the thumb TH1 is shifted to layer 61. The currently displayed layer is layer 50 spanning rule sections RS7, RS8, and RS9, within which the displayed layers includes the 25% volume outer perimeter following concentric fill of rule RS9, the 10% volume circular negative contour perimeter following concentric fill of rule RS8, and the 75%+ volume isotropic fill IF, at this level a 45 degree boustrophedon fill, of rule RS7. As noted, an isotropic fill IF will have a different angle depending on the level (e.g., rotating among 0, +45, -45, and 90 degrees to form repeating quasi-isotropic wafers). As shown by the volume fill graph section VFG6, the 10%, 25%, and 75% volume fill are additive on layers where rules overlap, indicating the simultaneous operation of the rules. Interface element IE1 is selected via pointer PO1, and is shown in a configuration in which the layers indicated by annotation AN2, i.e., layers 35-70 and 100-125, may have a common rule selected for them, in this case isotropic fill. Similarly to the FIG. 10B, annotation AN2 indicates that the rule is selectable for an associated "Volume 3" (e.g., a volume formed by the height of the layers 35-70 and 100-125, and either an entire layer or a region within a layer) is an "ISOTROPIC FILL" rule (from among fiber fill types, with the selectable rule itself being changed, e.g., via the selection panel 1004).

In the case where rules may "overlap" per layer, this may occur in at least two forms. First, within a layer, different regions may have independent rules (e.g., as shown in FIG. 10B, each of three regions—outer perimeter of three fiber rings, hole reinforcement of three fiber rings, and boustrophedon fill of the remainder—may be defined by region). Second, for any path, region, layer, or volume, rules may take precedence by a predetermined priority. One possible priority for rule category precedence is toolpath rules being of highest priority, followed by region rules, then layer rules, then volume or global rules. Within each category, user customizations are of higher priority than default rules, other than safety or minimum functionality defaults.

FIG. 10C shows an alternative display approach to that of FIG. 10A-10B. This display may be used in preparing a continuous fiber reinforcement preform. The bottom portion of the display 1002 is similar to that of FIG. 10A, with the volume fill graph section VFG-B display element as a topography representation of approximately 150 layers, the same as or similar to the volume fill graphs of FIGS. 10A-10B. As shown by the position of the thumb TH1, the currently displayed layer is layer 38 within rule section RS9, within which layers 4-44 and 107-147 include approximately 25% fiber fill as shown by the volume fill graph section VFG4, VFG5. A 3D rendering of the accumulated layers of the part is shown instead of a 2D layer plan view. Optionally, the 3D rendering is more transparent with respect to fill material, walls; and comparatively less transparent for fiber material; optionally with additional luminance for highlighted sections of fiber material. As shown, section RS9 is selected via pointer PO1, and a fiber highlight FHL corresponding to the fiber tracks of rule section RS9 is arranged and/or highlighted within the 3D rendering of the part.

Accordingly, a machine implemented method for displaying 3D printable model shells on a display 1002 may include displaying a multidimensional shell of a sliced model (such as the 2D additive manufacturing layer representations of FIGS. 10A through 10C, or the 3D rendered additive manufacturing model, mesh, or accumulation of layers representation of FIG. 10C) on the display. An orthogonal bar OB1.1, OB1.2 is displayed together with the displayed shell(s) parallel to an edge of the display. A first proportional grouping bar RS1~RS9 is displayed relative to a first range, similarly/respectively RS1~RS9 of the orthogonal bar OB1.1, OB1.2, the first proportional grouping bar RS1~RS9 representative of a first toolpath rule (e.g., no fiber, concentric, isotropic) common to a first range of shells at index positions within the range. A movement of a pointer PO1 in a direction relative to the display and/or an actuation of the pointer is detected (e.g., a mouse click; a touchscreen tap; a button press associated with pointer). In response to detecting the movement and/or the actuation of the pointer PO1, one or both of the toolpath rule or the range is changed. For example, in response, the printer or its slicer processing may be configured to change the first toolpath rule common to the first range of shells to a different, second toolpath rule common to the first range of shells. In the alternative or in addition, the printer or its slicer processing may be configured to change the first range of shells to a different, second range of shells having the first toolpath rule common thereto. Subsequently or simultaneously, the printer or its slicer processing may be configured to change the displayed multidimensional shell of the sliced model so that the change of the toolpath rule and/or the change of the range of shells is one of highlighted or displayed.

Fiber reinforcement strategies, which may in some cases be used in combination and which may have sub-strategies, include Concentric Inward, Boustrophedon (ox rows, also known as raster, or as isotropic, or quasi isotropic when the direction of rows is rotated or alternated in adjacent layers), Concentric Outward, or Sandwich Panel.

Concentric fill is performed within a layer by first obtaining 80-105% (preferably 85-99%) fiber-width offsets from an outer perimeter of a region of the layer. That is, the offsets form concentric paths that are 80-105% (preferably 85-99%) of the fiber-width as laid. One advantageous globally set region is the non-wall region adjacent a shell or wall thickness region (e.g., 1-3 bonded ranks thick). Fiber is deposited by controlling the deposition head to stroke the center of the concentric fiber fill offsets. When the offset has been looped, an S-shaped, L-shaped or U-shaped crossover or bend lays fiber into the neighboring offset. Concentric fill is suitable for bending and tension loads in particular, and is efficient (fewer turns) as well as inherently strong (no fiber separation permits more force to be transmitted and distributed along the fiber length). As a global setting, concentric fiber fill may be set to be adjacent a floor and or a roof, and/or at a set number of layers from the top and/or bottom of the part. In the alternative, spiral or concentric fill may have no particular orientation, as its direction depends on the perimeter of the part. Optionally, the concentric fill algorithm may be used for other strategies (e.g., for surrounding holes or hole splines for reinforcement). As noted, other settings can be used in combination to, e.g., migrate the crossover or bend between layers, locate crossovers in a particular place, or repeat or vary concentric fill patterns.

Ox-row fill or Raster fill is performed in back and forth rows. U.S. Pat. No. 6,934,600, herein incorporated by reference in its entirety, discloses various implementations of raster fill for nanotube impregnated three dimensional printing. Ox-row fill is performed by specifying an orientation of rows (e.g., lengthwise, widthwise, or at a specified angle) and a region. One advantageous globally set region is again a non-wall region adjacent a shell or wall thickness region. Parallel straight rows, offset by 80-105% (preferably 85-99%) of the fiber width as laid, are calculated side by side traversing the region. If a cutter is available sufficiently close to the tip of the deposition head, the fibers may be cut at each turn, alternating turns, every 3 turns, according to a desired fiber length, and so on. However, a boustrophedon path is optional. Boustrophedon paths can be connected at end rows by 180 degree curved fiber paths of the same diameter as the offset, and/or by folded paths of two right angles (these may alternate). Fiber is again deposited by controlling the deposition head to stroke the center of the concentric fiber fill offsets. When the offset has been looped, an S-shaped crossover lays fiber into the neighboring offset. As a global setting, ox-row fiber fill may be set to be adjacent a floor and or a roof, and/or at a set number of layers from the top and/or bottom of the part. Ox-row fill may be set to substantially repeat a direction of fill (for increased cumulative strength in that direction, or to provide arbitrary or predetermined patterns of two, three, four or more varying directions to increase multi-directional strength (e.g., 90-90 would represent two adjacent 90 degree perpendicular layers; 60-60-60 three adjacent layers each rotated 60 degrees, 45-45-45-45 or 90-45-90-45 four layers following a repeating pattern of reinforcing crisscrossing layers).

In this regard, successive layers of composite may, like traditional lay-up, be laid down at 0°, 45°, 90°, and other desired angles to provide part strength in multiple directions and to increase the strength-to-weight ratio. The controller 20 may be controlled to deposit the reinforcing fibers with an axial alignment in one or more particular directions and locations. The axial alignment of the reinforcing fibers may be selected for one or more individual sections within a layer, and may also be selected for individual layers. For example, as depicted in FIGS. 11C and 12, a first layer 1200 may have a first reinforcing fiber orientation and a second layer 1202 may have a second reinforcing fiber orientation (as may further layers 1204 . . . 1206). Additionally, a first section 1204 within the first layer 1200, or any other desired layer, may have a fiber orientation that is different than a second section 1206, or any number of other sections, within the same layer.

Concentric fiber outward fill is distinct in from concentric fill in that (i) the fiber loops are offset from an inner perimeter formed by an envelope about features or parts to be spanned, rather than outside in. Otherwise, the description with respect to concentric fill applies as would be understood by one of ordinary skill in the art. Fill is performed within a layer by first determining an interior region to be surrounded, e.g., first obtaining an envelope about two features to be circled. Offsets are generated at 80-105% (preferably 85-99%) fiber-width from an outer perimeter of the envelope. Fiber is deposited by controlling the deposition head to stroke the center of the concentric fiber fill offsets. Any S-shaped, L-shaped or U-shaped crossovers may be concentrated on the lengthwise ends, i.e., the curves. of the loops. Alternatively, as with concentric, a "spiral" offset of linearly increasing offset distance may be used to avoid cross-overs, but a spiral offset typically does not fully wrap features such as holes. Optionally, the envelope generation and inner perimeter start may be used for other strategies. Through-hole fill, as an example, may treat each hole as an envelope, and extend the fill from top to bottom of the part, lining a hole along greater than 80 percent of its top-to-bottom length. As noted, other settings can be used in combination to, e.g., migrate the crossover between layers, locate crossovers in a particular place, or repeat or vary concentric fill patterns.

As an example, the embodiment of a part rendered and processed include, but are not limited to, the operation of the following rules:

(i) concentric fiber fill in the region R08 between the outermost wall region R06 and the neighboring region R10;

(ii) pure polymer, fill material, or fiber triangular infill in the region R10, which may be a remainder region (set after the other regions are defined) extending between the limits of the fiber fill region R08 and the negative contour W02, W04 outlining wall regions R02, R04.

(iii) a sandwich panel, outer shell, inner shell, outer/inner shell, or cellular rule as discussed below; and (iv) a rule to outline or reinforce holes as discussed below, among other rules.

In some embodiments, a core reinforced filament 1854 is used to form a hole directly in a part, soluble preform, or continuous fiber reinforcement preform, see FIGS. 11A and 11B. More specifically, the core reinforced filament 1854 comes up to the hole, runs around it, then exits from the direction it came, though embodiments in which the filament exits in another direction are also contemplated. A benefit associated with this formation method is that the hole is reinforced in the hoop direction by the core in the core reinforced filament. As illustrated in FIG. 11A, the core reinforced filament 1854 enters the circular pattern tangentially. Entering tangentially is good for screws that will be torqued in. In another version illustrated in FIG. 11B, the core reinforced filament 1854 enter the circular pattern at the center of the circle. Of course, it should be understood that other points of entering the pattern are also possible. In one embodiment, the entrance angle may be staggered in each successive layer. For example, if there are two layers, the entering angle of the first layer may be at 0 degrees while the entering angle for the second layer may be at 180 degrees. This prevents the buildup of a seam in the part. If there are 10 layers, the entering angle may be every 36 degrees (e.g., staggering the entering angle by 360 degrees/10 layers) or any other desired pattern or arrangement.

Still further alternative or additionally, with reference to FIG. 15, the controller 20 of the printer 1000 may control the actuators and heaters such that depositing the first consolidated composite swath 2c and the second consolidated composite swath 2c as a continuous composite swath 2c spanning (e.g., via inter-layer continuous traverse SP30-A, SP30-B) two shells $LA_n$, $LA_{n+1}$ of an additive manufacturing process. That is, the fiber is not cut but is continuous between two additive fill material layers. This technique may be used in preparing a continuous fiber reinforcement preform.

Still further alternative or additionally, the controller 20 of the printer 1000 may control the actuators and heaters such that the first consolidated composite swath 2c is deposited in a first reinforcement formation 99A-99Z that has a higher strength in tension between a first negative contour (or hole $H_a$) and a second negative contour (or hole $H_b$) than the second reinforcement formation 99A-99Z.

The secondary print head 18 prints fill material or soluble material to form walls, infill, protective coatings, and/or support material on each layer, and as described herein, to smooth over protrusions into neighboring layers, and/or to form a soluble preform.

Consolidation, Compression and/or Flattening of Composite Swaths

A preferred technique for depositing a core-reinforced filament to become a fused composite swath includes compressing a core reinforced filament exiting a conduit nozzle to form a flattened shape (as discussed in the CFF patent applications).

The flattened shape is of variable height-to-width proportion, e.g., in cross-section from 1:2 through about 1:12 proportion. Preferably, the height of a compressed composite swath 2c substantially corresponds to the fill material layer height in the same layer $LA_1$, so that neighboring composite swaths 2c in the vertical direction can be tightly packed, yet be built up as part of the same or adjacent layers as the surrounding, complementary and/or interstitial fill material 18a.

Inter-layer interaction among composite swaths 2c and fill material 18a may be more involved than interlayer interaction among layers of fill material 18a. In most cases, an optional requirement for adjacent layers of fill material 18a is that they are satisfactorily fused in the vertical direction to avoid delamination, and in many cases the fill material 18a is fused (melted, or cured) under ambient or room pressure.

A core-reinforced multi-strand composite filament 2 may be supplied, for example, as a circular to oval cross section, and/or of approximately ⅓ mm in diameter and/or "13 thou" diameter.

As shown in Table 1 below, a circular cross-section filament 2 compressed during deposition becomes a progressively wider composite swath 2c. The table uses an example dimensionless diameter of 3 units for "round numbers".

As shown in the table, for any size of substantially circular cross section core reinforced filament 2, flattening to about ⅓ of its diameter becomes about 2.2-2.5 times as wide as its original diameter, and if flattened to about ½ its diameter becomes about 1.4-1.7 times its original diameter.

TABLE 1

| Example Diameter (Circle): | 3 units | |
|---|---|---|
| Rectangle Compression | | |
| | H | W |
| ⅔ D height | ~2 | ~3½ |
| ½ D height | ~1½ | ~4½ |
| ⅓ D height | ~1 | ~7 |
| ¼ D height | ~¾ | ~9½ |

For example, to complement an additive manufacturing layer height of 0.1 mm, a ⅓ mm diameter core reinforced filament 2 may be flattened to a composite swath 2c of roughly rectangular shape of proportion 1:6 through 1:12 (herein "highly compressed"), e.g., about 0.7-1.1 mm wide by about 0.07-0.12 mm high. One preferred ratio is roughly 1:9. Even higher compression may be possible, e.g., 1:12 to 1:20, but may demand significant system stiffness in the printer 100.

In contrast, to complement an additive manufacturing layer height of 0.2 mm, a ⅓ mm diameter core reinforced filament 2 may be flattened to a composite swath 2c of roughly rectangular shape of proportion 1:1.5 to 1:4 (herein "lightly compressed"), e.g., about a roughly rectangular shape of about 0.4-0.6 mm wide by about 0.2 mm high.

However, a fiber-embedded rectangular cross section of 1:1.5 to 1:3 is not as compressed or consolidated as one of 1:6 to 1.12 proportion, and in many cases, an relatively higher amount of consolidation is preferable to reduce voids and improve mingling of fibers in adjacent ranks 2c-2c or 2c-2d.

It should be noted that a supplied fiber reinforced filament 2 may have a constant cross-sectional area as supplied and as deposited (unless coextruded or supplemented); while a supplied FFF filament 18a has both a very different cross-sectional area as supplied and as deposited (having a much larger diameter as supplied), as well as variable cross-sectional area as deposited (having a bead size depending on extrusion rate). Given that a highly compressed composite swath is preferable to a lightly compressed one, combining a larger FFF extrusion rate layer height (e.g., 0.3 mm) with a highly compressed composite swath (e.g., 1:9 ratio) may be challenging. Accordingly, when a fill material height is such that the amount of compression is unacceptably reduced, more than one layer of fiber may be arranged per layer of fill material (e.g., 2 or 3 1:9 sublayers of 0.1 mm composite swath 2c per one respective 0.2 or 0.3 mm layer of fill material 118a). In this case, most or all fill material 18a is deposited after the composite swaths 2c; although in an alternative mode self-collision detection may be used to avoid contacting the nozzles to the part and the order of deposition thereby varied. In addition, in a modification of this process, the fill material height and compression amount may be selected to match stacks of 1:6-1:12 "highly compressed" composite swaths 2c (e.g., for a fiber of ⅓ mm diameter, the matching fill material 18a layer height capped at approximately 0.24 mm, because the highest acceptable "highly compressed" stack of two fibers is 1:6 ratio×2, or 0.12 mm×2).

It should be noted that the cross-sectional representation of reinforcing strands 4a within filament 2a and deposited swaths 2c are schematic only. In most cases, the reinforcing strands are in the hundreds to thousands of parallel strands within the filament 2a or swaths 2c.

Extrusion Toolpaths and/or Extrudates

In general, in the "FFF" or "FDM" extrusion method of additive manufacturing, extrusion beads in adjacent layers $LA_n$, $LA_{n+1}$ may be arranged to run either parallel or transverse to one another, without crossing while within a layer. A "retract" may be performed in the filament feed path to stop nozzle flow and move from one isolated area to another to restart extrusion, but the active printing beads tend to remain uncrossed. This is reasonable, because continuing to extrude while crossing a previously printed bead may cause extrudate to jet out horizontally and unpredictably as the nozzle is partially blocked. Additionally, any time spent extruding with a blocked nozzle reduces the amount of active deposition of extrusion. Slicing software generally avoids creating extrusion toolpaths which cross one another.

However, in the FFF printer discussed herein, extrusion toolpaths may cross one another in the same manner as described with respect to core reinforced fiber toolpaths, partially enabled by a fast-response clutching in the filament supply for the extrusion head 18, e.g., a low motor current or other slippable drive. This is also the case when the fill material or fiber will form part of a continuous fiber reinforcement preform. In such a case, crossing extrusion toolpaths should cross at a high angle (e.g., from 45-90 degrees) and/or limited to short periods of time or narrow existing beads (e.g., for ¹⁄₁₀ to ¹⁄₁₀₀ of a second, e.g., for a printing extrusion speed of 300 mm/s, crossing no more than 1 mm of previously solidified extrudate, and preferably ¼ to ½ mm of solidified extrudate). This is particularly advantageous in the case of honeycomb fills of patterned lines (e.g., triangular tessellation, e.g., of 60-60-60 degree crossing straight paths, either with all paths intersecting (e.g., triangular honeycomb or two paths intersecting with one path offset (e.g., Star of David network or honeycomb).

Generally, even the fast-response buffered crossing of a newly extruded bead or road of fill material 18a across a previously printed extrusion bead or toolpath may not change the layer height of the current layer $LA_n$, either on top of the solidified bead crossed or in the currently deposited row, i.e., neat plastic does not generally vertically accumulate as beads are crossed. Rather, fluidized fill material 18a tends to find a least resistance direction to escape horizontally or downward when the extrusion nozzle 18 is blocked by a previously deposited bead.

Section headings used herein are dependent upon following content which they describe, and can only broaden the content described.

Terminology

A "composite swath" or "composite swath" may refer to a deposited fiber-reinforced composite filament, having been compressed, consolidated and widened by ironing during deposition. Extending within the composite swath are a plurality of individual fibers, from 50-5000, preferably 100-2000, within a matrix material.

A "multi-swath track" may refer to a set of parallel swaths that generally follow parallel paths, although individual swaths may deviate to avoid obstacles or achieve reinforcement goals.

A "fold" may refer to a composite swath which folds, twists, or bunches over itself along a curved segment of composite swath (such as a corner). A "fold" is not limited to sheet-like or tape-like folds, but includes path changes in which different fibers within the composite swath may cleanly switch sides of a swath, but may also cross, twist, or bunch along the curved or angled segment (such as a corner).

"Fill material" includes material that may be deposited in substantially homogenous form as extrudate, fluid, or powder material, and is solidified, e.g., by hardening, crystallizing, transition to glass, or curing, as opposed to the core reinforced filament discussed herein that is deposited as embedded and fused composite swaths, which is deposited in a highly anisotropic, continuous form. "Substantially homogenous" includes powders, fluids, blends, dispersions, colloids, suspensions and mixtures, as well as chopped fiber reinforced materials. In any case herein where "fill material" may be replaced with some soluble material or form a soluble preform, this disclosure so contemplates. In such a case, as discussed herein, once the soluble material is removed, a continuous fiber reinforcement preform remains formed from continuous fiber deposition patterns. It should be noted that a coating, wall, shell, roof, ceiling or other buffer of non-soluble fill material may remain or be deposited even when the fill material discussed is partially or largely substituted with soluble material.

"Honeycomb" includes any regular or repeatable tessellation for sparse fill of an area (and thereby of a volume as layers are stacked), including three-sided, six-sided, four-sided, complementary shape (e.g., hexagons combined with triangles) interlocking shape, or cellular.

A "Negative contour" and "hole" are used herein interchangeably. However, either word may also mean an embedded contour (e.g., an embedded material or object) or a moldover contour (e.g., a second object with surfaces intruding into the layer).

"Outwardly spiraling" or "outwardly offsetting" meaning includes that a progressive tracing, outlining, or encircling is determined with reference to an innermost, generally negative or reference contour, not necessarily that the composite swath mush begin next to that contour and be built toward an outer perimeter. Once the toolpath is determined, it may be laid in either direction. Similarly, "inwardly spiraling" or "inwardly offsetting" means that the progressive tracing is determined with reference to an outer, generally positive contour.

"3D printer" meaning includes discrete printers and/or toolhead accessories to manufacturing machinery which carry out an additive manufacturing sub-process within a larger process. A 3D printer is controlled by a motion controller 20 which interprets dedicated G-code (toolpath instructions) and drives various actuators of the 3D printer in accordance with the G-code.

"Extrusion" may mean a process in which a stock material is pressed through a die to take on a specific shape of a lower cross-sectional area than the stock material. Fused Filament Fabrication ("FFF"), sometimes called Fused Deposition Manufacturing ("FDM"), is an extrusion process. Similarly, "extrusion nozzle" shall mean a device designed to control the direction or characteristics of an extrusion fluid flow, especially to increase velocity and/or restrict cross-sectional area, as the fluid flow exits (or enters) an enclosed chamber.

A "conduit nozzle" may mean a terminal printing head, in which unlike a FFF nozzle, there is no significant back pressure, or additional velocity created in the printing material, and the cross sectional area of the printing material, including the matrix and the embedded fiber(s), remains substantially similar throughout the process (even as deposited in bonded ranks to the part).

"Deposition head" may include extrusion nozzles, conduit nozzles, and/or hybrid nozzles. "Solidifying head" may include the same, as well as laser melting and solidifying, laser curing, energy curing. A material need not be liquefied to be solidified, it may be cured, sintered, or the like.

"Filament" generally may refer to the entire cross-sectional area of an (e.g., spooled) build material, and "strand" shall mean individual fibers that are, for example, embedded in a matrix, together forming an entire composite "filament".

"Alternating", with respect to reinforcement regions, generally means in any regular, random, or semi-random strategy, unless the pattern is described, specified, or required by circumstances, for distributing different formations within or among layers. E.g., simple alternation (ABABAB), repeating alternation (AABBAABB), pattern alternation (ABCD-ABCD), randomized repeating groups (ABCD-CBDA-CDAB), true random selection (ACBADBCABDCD), etc.

"Shell" and "layer" are used in many cases interchangeably, a "layer" being one or both of a subset of a "shell" (e.g., a layer is an 2.5D limited version of a shell, a lamina extending in any direction in 3D space) or superset of a "shell" (e.g., a shell is a layer wrapped around a 3D surface). Shells or layers may be nested (within each other) and/or parallel (offset from one another) or both. Shells or layers are deposited as 2.5D successive surfaces with 3 degrees of freedom (which may be Cartesian, polar, or expressed "delta"); and as 3D successive surfaces with 4-6 or more degrees of freedom. Layer adjacency may be designated using descriptive notations "$LA_1$", "$LA_2$" or $LA_n$, $LA_{n+1}$", etc., without necessarily specifying unique or non-unique layers. "$LA_1$" may indicate the view shows a single layer, "$LA_2$" indicating a second layer, and "$LA_1$, $LA_2$" indicating two layers superimposed or with contents of each layer visible. For example, in a top down view, either of "$LA_1$, $LA_2$, $LA_3$" or "$LA_n$, $LA_{n+1}$, $LA_{n+2}$" may indicate that three layers or shells are shown superimposed. "$LA_1$, $LA_2$ . . . $LA_m$," may indicate an arbitrary number of adjacent layers (e.g., m may be 2, 10, 100, 1000, or 10000 layers).

Some representative Ultimate/Tensile Strength and Tensile/Young's Modulus values for reinforcing fibers, core reinforced fiber matrix materials, fill materials, and comparative materials are as follows:

| MATERIAL | Ultimate Strength MPa | Young/Tensile Modulus GPa |
|---|---|---|
| reinforcing strands - UHMWPE-Dyneema, Spectra | 2300-3500 | 0.7 |
| reinforcing strands - Aramid or Aramid Fiber - Kevlar, Nomex, Twaron | 2000-2500 | 70.5-112.4, 130-179 |
| reinforcing strands - Carbon Fiber | 4000-4500 | 300-400 |
| reinforcing strands - Glass Fiber (E, R, S) | 3500-4800 | 70-90 |
| reinforcing strands - Basalt fiber | 1300-1500 | 90-110 |
| Carbon Fiber reinforced plastic (70/30 fiber/matrix, unidirectional, along grain) | 1600 | 170-200 |
| Glass-reinforced plastic (70/30 by weight fiber/matrix, unidirectional, along grain) | 900 | 40-50 |
| Steel & alloys ASTM A36 | 350-450 | 200 |
| Aluminum & alloys | 250-500 | 65-80 |
| matrix, fill material, solidifiable material - Epoxy | 12-30 | 3.5 |
| matrix, fill material, solidifiable material - Nylon | 70-90 | 2-4 |

What is claimed is:

1. A method of fabricating a reinforced molding, comprising:
   additively depositing continuous reinforcing fiber in a reinforcement volume to form a continuous fiber reinforcement preform;
   locating the continuous fiber reinforcement preform within a mold of a molding apparatus;
   loading the mold with molten molding material;

hardening the molten molding material into a hardened molding material to overmold the continuous fiber reinforcement preform, thereby forming a reinforced molding having the hardened molding material surrounding the continuous fiber reinforcement preform, wherein the reinforcement volume is smaller than a volume of the entire reinforced molding; and forming a support material in a first shape as a support preform, wherein the continuous reinforcing fiber is additively deposited in the reinforcement volume in a second shape following a contour of the support preform to form the continuous fiber reinforcement preform.

2. The method according to claim 1, wherein the reinforcement volume includes a combined volume of the continuous reinforcing fiber and a fiber reinforcement matrix material that may be heated to a liquid state within which the continuous reinforcing fiber is additively deposited, and the reinforcement volume is less than 20 percent of the entire reinforced molding.

3. The method according to claim 2, wherein the molding is performed at a molding material pressure which removes air voids within the fiber reinforcement matrix material.

4. The method according to claim 1, wherein the continuous fiber reinforcement preform is bent or deformed from its formation shape to a deformed shape within the mold.

5. The method according to claim 1, wherein two or more continuous fiber reinforcement preforms are bonded to one another prior to being located within the mold.

6. The method according to claim 1, wherein the mold is an injection mold, and pack pressure applied to the molten molding material during molding consolidates the continuous fiber reinforcement preform into a final shape and removes voids within the continuous fiber reinforcement preform.

7. The method according to claim 1, wherein the mold is an injection mold, and heat from injected molding material remelts the fiber reinforcement matrix material of the continuous fiber reinforcement preform.

8. The method according to claim 1, wherein the continuous reinforcing fiber deposition is an additively deposited thermoplastic continuous fiber reinforced prepreg tape having a width at least three times its height.

9. The method according to claim 1, further comprising applying a vacuum during at least one of formation of the continuous fiber reinforcement preform and the reinforced molding to remove voids.

10. The method according to claim 1, wherein at least one part of the support preform extends to be contiguous with a surface of the reinforced molding.

11. The method according to claim 1, wherein the support preform is formed in a non-looped shape for permitting additively depositing the continuous reinforcing fiber by winding about the support preform.

12. The method according to claim 1, wherein the support preform is injection molded.

13. The method according to claim 1, wherein the support preform is injection molded as a honeycombed structure, with a contiguous outer surface suitable as a winding substrate.

14. The method according to claim 1, wherein at least one of the support preform and continuous fiber reinforcement preform are formed in alternating successive additive and injection molded stages.

15. The method according to claim 1, wherein the support preform is formed in a substantially rotationally symmetric shape or mandrel for permitting additively depositing the continuous reinforcing fiber by winding about the support preform.

16. The method according to claim 1, wherein the support preform is relatively moved in at least one rotational degree of freedom with respect to a deposition head that additively deposits the continuous reinforcing fiber in the second shape following the contour of the support preform to form the continuous fiber reinforcement preform.

17. The method according to claim 1, wherein the continuous fiber reinforcement preform embeds at least one sandwich panel structure.

18. The method according to claim 17, wherein the sandwich panel structure is a foldable structure, having a linear gap formed therein opposite a fold line to form a hinge.

19. The method according to claim 1, wherein the support preform is formed including a soluble material, and further comprising dissolving the support preform.

20. The method according to claim 19, wherein the support preform is dissolved before locating the continuous fiber reinforcement preform within the mold.

21. The method according to claim 19, wherein the support preform is one of displaced, melted, and dissolved by the molten molding material loaded into the mold.

22. The method according to claim 19, wherein the support preform is dissolved after the mold material is hardened.

23. The method according to claim 19, wherein the support preform is dissolved at least in part before the support preform is located in the mold, and at least in part after the molten molding material is hardened.

24. The method according to claim 1, wherein the support preform is bent or deformed from its formation shape to a deformed shape for depositing the continuous reinforcing fiber to form the continuous fiber reinforcement preform.

25. The method according to claim 1, further comprising arranging a wide prepreg sheet against the support preform before additively depositing continuous reinforcing fiber tape prepreg.

26. The method of fabricating a continuous fiber reinforced injection molding according to claim 1, wherein the continuous fiber reinforcement preform is located in the reinforcement volume following a contour to form the continuous fiber reinforcement preform as a first reinforced panel, and further comprising locating a honeycombed panel of molding material alongside the first reinforced panel, wherein the molding material is hardened to overmold the honeycombed panel against the first reinforced panel, thereby forming a fiber reinforced molding including a molding material honeycomb and a continuous fiber reinforcement.

27. The method according to claim 26, wherein a second reinforced panel is additively deposited upon the honeycombed panel.

28. The method according to claim 27, wherein the second reinforced panel is formed having a joining surface mirroring a surface of the first reinforced panel.

29. The method according to claim 27, wherein a honeycomb structure is formed as a second support preform upon which the second reinforced panel is deposited.

30. The method according to claim 1, wherein the molding material is substantially isotropic in tensile strength, and the continuous reinforcing fiber is substantially anisotropic in tensile strength.

* * * * *